(12) United States Patent
Konno et al.

(10) Patent No.: US 9,285,435 B2
(45) Date of Patent: Mar. 15, 2016

(54) TWO-CORE OPTICAL FIBER MAGNETIC FIELD SENSOR

(75) Inventors: Yoshihiro Konno, Tokyo (JP); Masaru Sasaki, Tokyo (JP)

(73) Assignee: ADAMANT KOGYO, LTD., Tokyo (JP)

(*) Notice: Subject to any disclaimer, the term of this patent is extended or adjusted under 35 U.S.C. 154(b) by 437 days.

(21) Appl. No.: 13/805,031

(22) PCT Filed: Jun. 23, 2011

(86) PCT No.: PCT/JP2011/003602
§ 371 (c)(1),
(2), (4) Date: Dec. 18, 2012

(87) PCT Pub. No.: WO2011/161969
PCT Pub. Date: Dec. 29, 2011

(65) Prior Publication Data
US 2013/0088223 A1 Apr. 11, 2013

(30) Foreign Application Priority Data
Jun. 24, 2010 (JP) .................................. 2010-157247

(51) Int. Cl.
*G01R 33/02* (2006.01)
*G01R 33/032* (2006.01)
(52) U.S. Cl.
CPC .................................... *G01R 33/032* (2013.01)
(58) Field of Classification Search
CPC .................................... G01R 33/032–33/0327
USPC .................... 324/244.1, 96–97; 359/280–284
See application file for complete search history.

(56) References Cited

U.S. PATENT DOCUMENTS 4,554,449 A * 11/1985 Taniuchi et al. .......... 250/227.23
4,931,634 A * 6/1990 Toyama .................... 250/225
(Continued)

FOREIGN PATENT DOCUMENTS

| JP | S57-161661 A | 10/1982 |
| JP | A-62-64969 | 3/1987 |

(Continued)

OTHER PUBLICATIONS

Sep. 13, 2011 International Search Report issued in International Patent Application No. PCT/JP2011/003602.
(Continued)

*Primary Examiner* — Patrick Assouad
*Assistant Examiner* — Demetrius Pretlow
(74) *Attorney, Agent, or Firm* — Oliff PLC

(57) ABSTRACT

A two-core optical fiber magnetic field sensor is configured from at least a light incidence/emission unit; a lens; a magnetic garnet; and a reflector, wherein the lens and the magnetic garnet are disposed between the light incidence/emission end of the light incidence/emission unit and the reflector; a light beam is emitted from one optical fiber; the light beam is reflected by the reflector after being transmitted through the lens and the magnetic garnet; the light beam is transmitted again through the magnetic garnet and the lens after the reflection; and incident on the other optical fiber, the light beam is emitted again from the other optical fiber, and reflected by the reflector after being transmitted through the lens and the magnetic garnet; and the light beam is transmitted again through the magnetic garnet and the lens after the reflection and incident again on the one optical fiber.

23 Claims, 24 Drawing Sheets

(56) References Cited

U.S. PATENT DOCUMENTS

| | | |
|---|---|---|
| 5,742,157 A | 4/1998 | Ishizuka et al. |
| 7,024,073 B2 * | 4/2006 | Sahashi et al. ............... 385/31 |
| 2008/0037098 A1 * | 2/2008 | Nakamura et al. ............ 359/283 |

FOREIGN PATENT DOCUMENTS

| | | |
|---|---|---|
| JP | A-7-140218 | 6/1995 |
| JP | A-9-145809 | 6/1997 |
| JP | 2009-236599 A | 10/2009 |
| WO | WO 2011/161969 A1 | 12/2011 |

OTHER PUBLICATIONS

Nakamatsu et al., "Measurement of Current Distribution Using Polarization Stabilized MO Probe," Journal of the Institute of Electronics, Information and Communication Engineers, 2006, vol. J89-B No. 9, pp. 1797-1805 (with partial translation).

Oct. 28, 2015 Decision to Grant issued in Japanese Patent Application No. 2012-521335.

* cited by examiner

TWO-CORE OPTICAL FIBER MAGNETIC FIELD SENSOR

TECHNICAL FIELD

The present invention relates to a reflection type two-core optical fiber magnetic field sensor using the Faraday effect of a magnetic garnet.

BACKGROUND ART

At present, many generally-used industrial apparatuses or consumer products include rotation units or rotation parts such as motors or gear wheels. According to progression of science and technology and an increase in social demands for protection of earth environment and energy saving, industrial apparatuses such as aircrafts or ships or consumer apparatuses such as cars try to be controlled at high accuracy and high precision. In order to control rotation machines and rotation apparatuses at high accuracy and high precision, the rotation speed or the number of rotations needs to be continuously measured accurately. Therefore, first, a simplified, small-sized, light-weighted measurement apparatus capable of measuring a rotation speed more accurately needs to be provided at low cost with mass production in order to respond to the social demands.

As methods of measuring the rotation speed or the number of rotations, a method using electromagnetic induction and a method using an optical type magnetic field sensor using the Faraday effect of a magneto-optical material (magnetic garnet) have been proposed.

As a method using electromagnetic induction, a rotation speed meter for measuring the rotation speed or the number of rotations of engines of aircrafts or cars has been commercialized. However, the rotation speed meter using the electromagnetic induction has serious problems in that electromagnetic noise may be easily received in a transmission line (cable) between a measurement terminal and a main body of the apparatus. In addition, since the rotation speed meter using the electromagnetic induction uses an electrical circuit, there is a serious problem in that hazardous material treatment facilities such as hazardous material production sites or hazardous material treating sites treating combustible materials such as organic solvents need to provide explosion proof methods.

On the contrary, in measurement of rotation speed using light, for example, in an optical type magnetic field sensor using the Faraday effect of a magneto-optical material (magnetic garnet) described above is almost not influenced by electromagnetic noise. In addition, in a site treating combustible materials such as organic solvents, explosion proof methods are unnecessary. The magnetic field sensor using the magnetic garnet uses the effect that the Faraday rotation angle of the magnetic garnet is changed under the influence of an external magnetic field. In other words, in the magnetic field sensor, the polarization plane of the light beam transmitting through the magnetic garnet is allowed to be changed according to a change in a magnetic field applied to the magnetic garnet, and the change in the polarization plane is allowed to be converted into a change in an intensity of the light beam to be sensed or counted, so that the rotation speed or the number of rotations are to be measured.

As the magnetic field sensor, there are transmission type and reflection type magnetic field sensors. In the transmission type magnetic field sensor, components need to be arranged so that the directions of incidence and transmission of a signal light beam are aligned in one straight line. Therefore, there is a limitation in an installation site to enlarge the whole magnetic field sensor in the propagation direction of the signal light beam. Accordingly, according to some use purposes or installation sites, the transmission type magnetic field sensor may not be installed and used.

As a configuration of solving the problems of the transmission type magnetic field sensor, a reflection type magnetic field sensor is proposed (for example, refer to Non-Patent Literature 1). In the reflection type magnetic field sensor 100 disclosed in Non-Patent Literature 1 illustrated in FIG. 11, a polarizer 102 is arranged in the vicinity of a magnetic garnet 101, and no optical fiber exists on an optical path between two lenses 103a and 103b. A bismuth substituted garnet having a large rotation angle with respect to a light beam having a wavelength of 1550 nm is used as the magnetic garnet 101. A thickness of the magnetic garnet 101 is set to 150 μm which is a maximum growing thickness as a single magnetic domain. In order to measure a magnetic field parallel to a surface of a measurement object, a light beam is allowed to be incident on the magnetic garnet 101 in the horizontal direction of FIG. 11, and a strength of a horizontal magnetic field is measured.

A continuous light beam having 1550 nm output from a light source (not illustrated) is used as the light beam used for magnetic field measurement. The light beam is adjusted to be a linearly polarized light beam by a polarization controller 104 and is incident on the magnetic field sensor 100. A strength of the magnetic field output from the magnetic field sensor 100 is applied to the light beam, and the light beam is converted into a voltage signal by a photo diode (PD) which is an optical receiver.

CITATION LIST

Non-Patent Literature

Non-Patent Literature 1: "Highly-Accurate Measurement of Antenna Current Distribution Using Polarization Stabilized MO Probe", Nakamatsu Shin et al., Journal of the Institute of Electronics, Information and Communication Engineers B Vol. J89-B No. 9, pp. 1797-1805, the Institute of Electronics, Information and Communication Engineers 2006.

SUMMARY OF THE INVENTION

Problem to be Solved by the Invention

However, in a magnetic field sensor 100 disclosed in Non-Patent Literature 1, since a magnetic field is detected by allowing a light beam to transmit through a magnetic garnet 101 which is a magnetic field detection unit one time, in order to greatly improve a sensor sensitivity (magnetic field detection sensitivity) with respect to the magnetic field, material characteristics of the magnetic garnet 101 need to be improved, so that it is difficult to greatly improve the sensor sensitivity.

The present invention is to provide a two-core optical fiber magnetic field sensor having a two-core optical fiber capable of greatly improving a magnetic field detection sensitivity.

The present invention is also to provide a two-core optical fiber magnetic field sensor capable of improving vibration resistance and measuring a high-frequency magnetic field.

Means for Solving Problem

The objects are achieved by the present invention hereinafter. According to an aspect of the present invention, there is provided a two-core optical fiber magnetic field sensor at least including: a light incidence/emission unit; a lens; a magnetic garnet; and a reflector, in which the lens and the magnetic garnet are arranged between a light incidence/emission end portion of the light incidence/emission unit and the reflector, in which the light incidence/emission unit is configured to include two single mode optical fibers, in which a light beam emitted from the one optical fiber transmits through the lens and the magnetic garnet and is reflected by the reflector, and after the reflection, the light beam transmits through the magnetic garnet and the lens again and is incident on the other optical fiber, and in which a light beam is emitted from the other optical fiber again and transmits through the lens and the magnetic garnet and is reflected by the reflector, and after the reflection, the light beam transmits through the magnetic garnet and the lens again and is incident on the one optical fiber again.

In the two-core optical fiber magnetic field sensor according to the present invention, preferably, a plurality of the magnetic garnets are installed.

In the two-core optical fiber magnetic field sensor according to the present invention, one reflector is arranged to the other-end-side light incidence/emission end portion of the light incidence/emission end portion of the other optical fiber, and in which both of the two optical fibers are low birefringence optical fibers containing lead oxide.

In addition, in the two-core optical fiber magnetic field sensor according to the present invention, an optical fiber birefringence compensation mirror is arranged to the other-end-side light incidence/emission end portion of the other optical fiber, in which the optical fiber birefringence compensation mirror includes the other optical fiber, a birefringent element, a magnetic garnet which has a rotation angle of 45 degrees during magnetic saturation, a magnet which magnetically saturates the magnetic garnet, a lens, and a reflector, in which the birefringent element has two planes which are parallel to each other, in which the other-end-side light incidence/emission end portion of the other optical fiber is arranged to face the one plane of the birefringent element, in which the magnetic garnet and the lens are arranged between the birefringent element and the reflector, in which the light beam is emitted from the other-end-side light incidence/emission end portion of the other optical fiber, in which the light beam is divided into linearly polarized light beams of a normal beam and an abnormal beam by the birefringent element, in which the two linearly polarized light beams of the normal beam and the abnormal beam emitted from the birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, wherein, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, in which the two linearly polarized light beams are combined as one light beam, and in which the recombined light beam is incident on the other optical fiber.

In addition, in the two-core optical fiber magnetic field sensor according to the present invention, an optical fiber birefringence compensation mirror is arranged to the other-end-side light incidence/emission end portion of the other optical fiber, in which the optical fiber birefringence compensation mirror includes the other optical fiber, a first birefringent element, a second birefringent element, a magnetic garnet which has a rotation angle of 45 degrees during magnetic saturation, a magnet which magnetically saturates the magnetic garnet, a lens, and a reflector, in which each of the first birefringent element and the second birefringent element has two planes which are parallel to each other, in which the other-end-side light incidence/emission end portion of the other optical fiber is arranged to face the one plane of the first birefringent element, in which the second birefringent element is arranged so that the other plane of the first birefringent element and the one plane of the second birefringent element face each other, in which a direction of a crystal axis on an optical plane of the second birefringent element is set to be different by 90 degrees from a direction of a crystal axis on an optical plane of the first birefringent element, in which the magnetic garnet and the lens are arranged between the second birefringent element and the reflector, in which the light beam is emitted from the other-end-side light incidence/emission end portion of the other optical fiber, in which the light beam is divided into linearly polarized light beams of a normal beam and an abnormal beam by the first birefringent element, wherein, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, in which a shifted amount of the abnormal beam during the transmission through the first birefringent element and a shifted amount of the abnormal beam during the transmission through the second birefringent element are set to be equal to each other, in which the two linearly polarized light beams of the normal beam and the abnormal beam emitted from the second birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which in the case where the two linearly polarized light beams transmit through the second birefringent element again, only the one linearly polarized light beam is shifted, wherein, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, in which the two linearly polarized light beams are incident on the first birefringent element again, so that the two linearly polarized light beams are recombined as one light beam, and in which the recombined light beam is incident on the other optical fiber.

In addition, in the two-core optical fiber magnetic field sensor according to the present invention, a Faraday mirror is arranged to the other-end-side light incidence/emission end portion of the other optical fiber, in which the Faraday mirror includes the other optical fiber, a magnetic garnet which has a rotation angle of 45 degrees during magnetic saturation, a magnet which magnetically saturates the magnetic garnet, a lens, and a reflector, in which the other-end-side light incidence/emission end portion of the other optical fiber is arranged to face the one plane of the magnetic garnet, in which the lens is arranged between the magnetic garnet and the reflector, in which the light beam is emitted from the other-end-side light incidence/emission end portion of the other optical fiber, in which the light beam transmits through the magnetic garnet, so that the polarization direction thereof is rotated by 45 degrees, and the light beam transmits through the lens and is reflected in point symmetry at one point on a surface of the reflector, in which the reflected light beam transmits through the magnetic garnet again, so that the polarization direction is further rotated by 45 degrees, and in which the light beam is incident on the other optical fiber.

In addition, in the two-core optical fiber magnetic field sensor according to the present invention, n (n≥2) two-core optical fiber magnetic field sensors are installed with respect to a magnetic field of a measurement object.

In addition, in the two-core optical fiber magnetic field sensor according to the present invention, one reflector is arranged to the other-end-side light incidence/emission end portion of the light incidence/emission end portions of a pair of optical fibers including the other optical fiber of the front stage two-core optical fiber magnetic field sensor and the one optical fiber of the rear stage two-core optical fiber magnetic field sensor.

In addition, in the two-core optical fiber magnetic field sensor according to the present invention, the other optical fiber of the front stage two-core optical fiber magnetic field sensor and the one optical fiber of the rear stage two-core optical fiber magnetic field sensor are a common optical fiber.

In addition, in the two-core optical fiber magnetic field sensor according to the present invention, one reflector is arranged to the other-end-side light incidence/emission end portion of the light incidence/emission end portion of the other optical fiber of the n-th two-core optical fiber magnetic field sensor, and all the optical fibers are low birefringence optical fibers containing lead oxide.

In addition, in the two-core optical fiber magnetic field sensor according to the present invention, an optical fiber birefringence compensation mirror is arranged to the other-end-side light incidence/emission end portion of the other optical fiber in the n-th two-core optical fiber magnetic field sensor, in which the optical fiber birefringence compensation mirror includes the other optical fiber, a birefringent element, a magnetic garnet which has a rotation angle of 45 degrees during magnetic saturation, a magnet which magnetically saturates the magnetic garnet, a lens, and a reflector, in which the birefringent element has two planes which are parallel to each other, in which the other-end-side light incidence/emission end portion of the other optical fiber is arranged to face the one plane of the birefringent element, in which the magnetic garnet and the lens are arranged between the birefringent element and the reflector, in which the light beam is emitted from the other-end-side light incidence/emission end portion of the other optical fiber, in which the light beam is divided into linearly polarized light beams of a normal beam and an abnormal beam by the birefringent element, in which the two linearly polarized light beams of the normal beam and the abnormal beam emitted from the birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, wherein, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, in which the two linearly polarized light beams are recombined as one light beam, and in which the recombined light beam is incident on the other optical fiber.

In addition, in the two-core optical fiber magnetic field sensor according to the present invention, an optical fiber birefringence compensation mirror is arranged to the other-end-side light incidence/emission end portion of the other optical fiber in the n-th two-core optical fiber magnetic field sensor, in which the optical fiber birefringence compensation mirror includes the other optical fiber, a first birefringent element, a second birefringent element, a magnetic garnet which has a rotation angle of 45 degrees during magnetic saturation, a magnet which magnetically saturates the magnetic garnet, a lens, and a reflector, in which each of the first birefringent element and the second birefringent element has two planes which are parallel to each other, in which the other-end-side light incidence/emission end portion of the other optical fiber is arranged to face the one plane of the first birefringent element, in which the second birefringent element is arranged so that the other plane of the first birefringent element and the one plane of the second birefringent element face each other, in which a direction of a crystal axis on an optical plane of the second birefringent element is set to be different by 90 degrees from a direction of a crystal axis on an optical plane of the first birefringent element, in which the magnetic garnet and the lens are arranged between the second birefringent element and the reflector, in which the light beam is emitted from the other-end-side light incidence/emission end portion of the other optical fiber, in which the light beam is divided into linearly polarized light beams of a normal beam and an abnormal beam by the first birefringent element, wherein, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, in which a shifted amount of the abnormal beam during the transmission through the first birefringent element and a shifted amount of the abnormal beam during the transmission through the second birefringent element are set to be equal to each other, in which the two linearly polarized light beams of the normal beam and the abnormal beam emitted from the second birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which in the case where the two linearly polarized light beams transmit through the second birefringent element again, only the one linearly polarized light beam is shifted, wherein, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, in which the two linearly polarized light beams are incident on the first birefringent element again, so that the two linearly polarized light beams are recombined as one light beam, and in which the recombined light beam is incident on the other optical fiber.

In addition, in the two-core optical fiber magnetic field sensor according to the present invention, a Faraday mirror is arranged to the other-end-side light incidence/emission end portion of the other optical fiber of the n-th two-core optical fiber magnetic field sensor, in which the Faraday mirror includes the other optical fiber, a magnetic garnet which has a rotation angle of 45 degrees during magnetic saturation, a magnet which magnetically saturates the magnetic garnet, a lens, and a reflector, in which the other-end-side light incidence/emission end portion of the other optical fiber is arranged to face the one plane of the magnetic garnet, in which the lens is arranged between the magnetic garnet and the reflector, in which the light beam is emitted from the other-end-side light incidence/emission end portion of the other optical fiber, in which the light beam transmits through the magnetic garnet, so that the polarization direction thereof is rotated by 45 degrees, in which the light beam transmits through the lens and is reflected in point symmetry at one point on a surface of the reflector, in which the reflected light beam transmits through the magnetic garnet again, so that the polarization direction is further rotated by 45 degrees, and in which the light beam is incident on the other optical fiber.

In addition, according to another aspect of the present invention, there is provided a two-core optical fiber magnetic field sensor including a light incidence/emission unit, a lens, a magnetic garnet, a reflector, and a λ/4 wavelength plate (λ: a wavelength of a light beam which is incident on the two-core optical fiber magnetic field sensor), in which the lens, the magnetic garnet, and the λ/4 wavelength plate are arranged between the light incidence/emission end portion of the light incidence/emission unit and the reflector, in which the light incidence/emission unit is configured to include two polarization plane preserving optical fibers, and the two polarization plane preserving optical fibers are arranged so that directions of slow axes of the two polarization plane preserving optical fibers are different by 90 degrees from each other, in which the λ/4 wavelength plate is arranged so that a direction of a crystal axis of the λ/4 wavelength plate is different by 45 degrees from the direction of the slow axis of any one of polarization plane preserving optical fibers, in which a light beam which is emitted from the one polarization plane preserving optical fiber transmits through the λ/4 wavelength plate, the lens, and the magnetic garnet and is reflected by the reflector, and after the reflection, the light beam transmits through the magnetic garnet, the lens, and the λ/4 wavelength plate again and is incident on the other polarization plane preserving optical fiber, and in which the light beam which is emitted from the other polarization plane preserving optical fiber transmits through the λ/4 wavelength plate, the lens, and the magnetic garnet and is reflected by the reflector again, and after the reflection, the light beam transmits through the magnetic garnet, the lens, and the λ/4 wavelength plate again and is incident on the one polarization plane preserving optical fiber again.

In addition, in the two-core optical fiber magnetic field sensor according to the present invention, a plurality of the magnetic garnets are installed.

In addition, in the two-core optical fiber magnetic field sensor according to the present invention, an optical fiber birefringence compensation mirror is arranged to the other-end-side light incidence/emission end portion of the other polarization plane preserving optical fiber, in which the optical fiber birefringence compensation mirror includes the other polarization plane preserving optical fiber, a birefringent element, a magnetic garnet which has a rotation angle of 45 degrees during magnetic saturation, a magnet which magnetically saturates the magnetic garnet, a lens, and a reflector, in which the birefringent element has two planes which are parallel to each other, in which the other-end-side light incidence/emission end portion of the other polarization plane preserving optical fiber is arranged to face the one plane of the birefringent element, in which the magnetic garnet and the lens are arranged between the birefringent element and the reflector, in which the light beam is emitted from the other-end-side light incidence/emission end portion of the other polarization plane preserving optical fiber, in which the light beam transmits through the birefringent element as two linearly polarized light beams of a normal beam and an abnormal beam, in which the two linearly polarized light beams of the normal beam and the abnormal beam emitted from the birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, and in which the two linearly polarized light beams which transmit through the birefringent element are incident on the other polarization plane preserving optical fiber.

In addition, in the two-core optical fiber magnetic field sensor according to the present invention, an optical fiber birefringence compensation mirror is arranged to the other-end-side light incidence/emission end portion of the other polarization plane preserving optical fiber, in which the optical fiber birefringence compensation mirror includes the other polarization plane preserving optical fiber, a first birefringent element, a second birefringent element, a magnetic garnet which has a rotation angle of 45 degrees during magnetic saturation, a magnet which magnetically saturates the magnetic garnet, a lens, and a reflector, in which each of the first birefringent element and the second birefringent element has two planes which are parallel to each other, in which the other-end-side light incidence/emission end portion of the other polarization plane preserving optical fiber is arranged to face the one plane of the first birefringent element, in which the second birefringent element is arranged so that the other plane of the first birefringent element and the one plane of the second birefringent element face each other, in which a direction of a crystal axis on an optical plane of the second birefringent element is set to be different by 90 degrees from a direction of a crystal axis on an optical plane of the first birefringent element, in which the magnetic garnet and the lens are arranged between the second birefringent element and the reflector, in which the light beam is emitted from the other-end-side light incidence/emission end portion of the other polarization plane preserving optical fiber, in which the light beam transmits through the first birefringent element as the two linearly polarized light beams of a normal beam and an abnormal beam, in which, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, in which a shifted amount of the abnormal beam during the transmission through the first birefringent element and a shifted amount of the abnormal beam during the transmission through the second birefringent element are set to be equal to each other, in which the two linearly polarized light beams of the normal beam and the abnormal beam emitted from the second birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which, in the case where the two linearly polarized light beams transmit through the second birefringent element again, only the one linearly polarized light beam is shifted, in which, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, and in which the two linearly polarized light beams which transmit through the first birefringent element are incident on the other polarization plane preserving optical fiber.

In addition, in the two-core optical fiber magnetic field sensor according to the present invention, a Faraday mirror is arranged to the other-end-side light incidence/emission end portion of the other polarization plane preserving optical fiber, in which the Faraday mirror includes the other polarization plane preserving optical fiber, a magnetic garnet which has a rotation angle of 45 degrees during magnetic saturation, a magnet which magnetically saturates the magnetic garnet, a lens, and a reflector, in which the other-end-side light incidence/emission end portion of the other polarization plane preserving optical fiber is arranged to face the one plane of the magnetic garnet, in which the lens is arranged between the magnetic garnet and the reflector, in which the light beam is emitted from the other-end-side light incidence/emission end portion of the other polarization plane preserving optical fiber, in which the light beam transmits through the magnetic garnet, so that the polarization direction thereof is rotated by 45 degrees, and the light beam transmits through the lens and is reflected in point symmetry at one point on a surface of the reflector, in which the reflected light beam transmits through the magnetic garnet again, so that the polarization direction is further rotated by 45 degrees, and in which the light beam is incident on the other polarization plane preserving optical fiber.

In addition, in the two-core optical fiber magnetic field sensor according to the present invention, a $\lambda/4$ wavelength plate mirror is arranged to the other-end-side light incidence/emission end portion of the other polarization plane preserving optical fiber, in which the $\lambda/4$ wavelength plate mirror includes the other polarization plane preserving optical fiber, a $\lambda/4$ wavelength plate ($\lambda$: a wavelength of a light beam incident on the $\lambda/4$ wavelength plate mirror), a lens, and a reflector, in which the other-end-side light incidence/emission end portion of the other polarization plane preserving optical fiber is arranged to face the one plane of the $\lambda/4$ wavelength plate, in which the lens is arranged between the $\lambda/4$ wavelength plate and the reflector, in which the light beam is emitted from the other-end-side light incidence/emission end portion of the other polarization plane preserving optical fiber, in which the light beam transmits through the $\lambda/4$ wavelength plate, so that the light beam is converted into circularly-polarized light beams of which rotation directions of distal ends of electric vectors are different from each other, in which the two circularly-polarized light beams transmit through the lens and are reflected on a surface of the reflector, in which the two reflected circularly-polarized light beams transmit through the $\lambda/4$ wavelength plate again, so that the two circularly-polarized light beams are converted into two linearly polarized light beams of which vibration directions of electric vectors are different by 90 degrees from each other, and in which the two linearly polarized light beams are incident on the other polarization plane preserving optical fiber.

In addition, according to still another aspect of the present invention, there is provided a two-core optical fiber magnetic field sensor where n (n≥2) two-core optical fiber magnetic field sensors are installed with respect to a magnetic field of a measurement object, in which the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, in which an optical fiber birefringence compensation mirror is arranged to the other-end-side light incidence/emission end portion of the other polarization plane preserving optical fiber of the n-th two-core optical fiber magnetic field sensor, in which the optical fiber birefringence compensation mirror includes the other polarization plane preserving optical fiber of the n-th two-core optical fiber magnetic field sensor, a birefringent element, a magnetic garnet which has a rotation angle of 45 degrees during magnetic saturation, a magnet which magnetically saturates the magnetic garnet, a lens, and a reflector, in which the birefringent element has two planes which are parallel to each other, in which the other-end-side light incidence/emission end portion of the other polarization plane preserving optical fiber of the n-th two-core optical fiber magnetic field sensor is arranged to face the one plane of the birefringent element, in which the magnetic garnet and the lens are arranged between the birefringent element and the reflector, in which a light beam is emitted from the other-end-side light incidence/emission end portion of the other polarization plane preserving optical fiber of the n-th two-core optical fiber magnetic field sensor, in which the light beam transmit through the birefringent element as two linearly polarized light beams of a normal beam and an abnormal beam, in which the two linearly polarized light beams of the normal beam and the abnormal beam emitted from the birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, and in which the two linearly polarized light beams which transmit through the birefringent element are incident on the other polarization plane preserving optical fiber of the n-th two-core optical fiber magnetic field sensor.

In addition, according to further still another aspect of the present invention, there is provided a two-core optical fiber magnetic field sensor where n (n≥2) two-core optical fiber magnetic field sensors are installed with respect to a magnetic field of a measurement object, in which the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, in which an optical fiber birefringence compensation mirror is arranged to the other-end-side light incidence/emission end portion of the other polarization plane preserving optical fiber of the n-th two-core optical fiber magnetic field sensor, in which the optical fiber birefringence compensation mirror includes the other polarization plane preserving optical fiber of the n-th two-core optical fiber magnetic field sensor, a first birefringent element, a second birefringent element, a magnetic garnet which has a rotation angle of 45 degrees during magnetic saturation, a magnet which magnetically saturates the magnetic garnet, a lens, and a reflector, in which each of the first birefringent element and the second birefringent element has two planes which are parallel to each other, in which the other-end-side light incidence/emission end portion of the other polarization plane preserving optical fiber of the n-th two-core optical fiber magnetic field sensor is arranged to face the one plane of the first birefringent element, in which the second birefringent element is arranged so that the other plane of the first birefringent element and the one plane of the second birefringent element face each other, in which a direction of a crystal axis on an optical plane of the second birefringent element is set to be different by 90 degrees from a direction of a crystal axis on an optical plane of the first birefringent element, in which the magnetic garnet and the lens are arranged between the second birefringent element and the reflector, in which a light beam is emitted from the other-end-side light incidence/ emission end portion of the other polarization plane preserving optical fiber of the n-th two-core optical fiber magnetic field sensor, in which the light beam transmits through the first birefringent element as the two linearly polarized light beams of a normal beam and an abnormal beam, in which, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, in which a shifted amount of the abnormal beam during the transmission through the first birefringent element and a shifted amount of the abnormal beam during the transmission through the second birefringent element are set to be equal to each other, in which the two linearly polarized light beams of the normal beam and the abnormal beam emitted from the second birefringent element transmit through the magnetic garnet, so that the polarization directions thereof are rotated by 45 degrees in the same direction, in which the two linearly polarized light beams transmit through the lens and are reflected in point symmetry at one point on a surface of the reflector, in which the two reflected linearly polarized light beams transmit through the magnetic garnet again, so that the polarization directions thereof are further rotated by 45 degrees in the same direction, in which, in the case where the two linearly polarized light beams transmit through the second birefringent element again, only the one linearly polarized light beam is shifted, in which, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, and in which the two linearly polarized light beams which transmit through the first birefringent element are incident on the other polarization plane preserving optical fiber of the n-th two-core optical fiber magnetic field sensor.

In addition, according to further still another aspect of the present invention, there is provided a two-core optical fiber magnetic field sensor where n (n≥2) two-core optical fiber magnetic field sensors are installed with respect to a magnetic field of a measurement object, in which the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, in which a Faraday mirror is arranged to the other-end-side light incidence/emission end portion of the other polarization plane preserving optical fiber of the n-th two-core optical fiber magnetic field sensor, in which the Faraday mirror includes the other polarization plane preserving optical fiber of the n-th two-core optical fiber magnetic field sensor, a magnetic garnet which has a rotation angle of 45 degrees during magnetic saturation, a magnet which magnetically saturates the magnetic garnet, a lens, and a reflector, in which the other-end-side light incidence/emission end portion of the other polarization plane preserving optical fiber of the n-th two-core optical fiber magnetic field sensor is arranged to face the one plane of the magnetic garnet, in which the lens is arranged between the magnetic garnet and the reflector, in which a light beam is emitted from the other-end-side light incidence/emission end portion of the other polarization plane preserving optical fiber of the n-th two-core optical fiber magnetic field sensor, in which the light beam transmits through the magnetic garnet, so that the polarization direction thereof is rotated by 45 degrees, and the light beam transmits through the lens and is reflected in point symmetry at one point on a surface of the reflector, in which the reflected light beam transmits through the magnetic garnet again, so that the polarization direction is further rotated by 45 degrees, and in which the light beam is incident on the other polarization plane preserving optical fiber of the n-th two-core optical fiber magnetic field sensor.

In addition, according to further still another aspect of the present invention, there is provided a two-core optical fiber magnetic field sensor where n (n≥2) two-core optical fiber magnetic field sensors are installed with respect to a magnetic field of a measurement object, in which the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, in which a $\lambda/4$ wavelength plate mirror is arranged to the other-end-side light incidence/emission end portion of the other polarization plane preserving optical fiber of the n-th two-core optical fiber magnetic field sensor, in which the $\lambda/4$ wavelength plate mirror includes the other polarization plane preserving optical fiber of the n-th two-core optical fiber magnetic field sensor, a $\lambda/4$ wavelength plate ($\lambda$: a wavelength of a light beam incident on the $\lambda/4$ wavelength plate mirror), a lens, and a reflector, in which the other-end-side light incidence/emission end portion of the other polarization plane preserving optical fiber of the n-th two-core optical fiber magnetic field sensor is arranged to face the one plane of the $\lambda/4$ wavelength plate, in which the lens is arranged between the $\lambda/4$ wavelength plate and the reflector, in which a light beam is emitted from the other-end-side light incidence/emission end portion of the other polarization plane preserving optical fiber of the n-th two-core optical fiber magnetic field sensor, in which the light beam transmits through the $\lambda/4$ wavelength plate, so that the light beam is converted into circularly-polarized light beams of which rotation directions of distal ends of electric vectors are different from each other, in which the two circularly-polarized light beams transmit through the lens and are reflected on a surface of the reflector, in which the two reflected circularly-polarized light beams transmit through the $\lambda/4$ wavelength plate again, so that the two circularly-polarized light beams are converted into two linearly polarized light beams of which vibration directions of electric vectors are different by 90 degrees from each other, and in which the two linearly polarized light beams are incident on the other polarization plane preserving optical fiber of the n-th two-core optical fiber magnetic field sensor.

Effect of the Invention

According to the two-core optical fiber magnetic field sensor of the present invention, a light beam is configured to reciprocate a two-core optical fiber magnetic field sensor which is a magnetic field detection unit n times (n≥2), so that a sensitivity (magnetic field detection sensitivity) of the sensor with respect to a magnetic field of a measurement object can be increased to be about n times. Therefore, the magnetic field detection sensitivity of the two-core optical fiber magnetic field sensor can be greatly improved.

Therefore, a measurable distance of the magnetic field generated by the current value can be extended to be about twice in comparison with a magnetic field sensor in the related art, and a sensitivity of current value detection at the measurement position can be increased to be about five times.

In addition, the two-core optical fiber magnetic field sensor is optically connected to the optical fiber birefringence compensation mirror, so that a change of the sensed light beam can be suppressed, and a change in a received light amount of a light receiving element due to the birefringence of the optical fiber can be suppressed, and a change in the detected value of the magnetic field with respect to the magnetic field can be suppressed, and the vibration resistance can be improved.

In addition, a span fiber or a low birefringence optical fiber containing lead oxide is used for each optical fiber used as a propagation line, so that birefringence of the propagation line can be reduced.

In addition, the two-core optical fiber magnetic field sensor is implemented to have a circuit configuration adapted to measurement of a high-frequency magnetic field, so that it is possible to measure the high-frequency magnetic field.

In addition, a plurality of the magnetic garnets having the same composition and the same rotation angle in the same direction may be arranged in the light propagation direction, so that the two-core optical fiber magnetic field sensor can be easily assembled, a change in a detected value of the magnetic field with respect to the magnetic field can be suppressed, and the vibration resistance of the two-core optical fiber magnetic field sensor can be further improved.

In addition, the two optical fibers which are the light incidence/emission units of the two-core optical fiber magnetic field sensor are configured with polarization plane preserving optical fibers, even when the vibration is received from the outside, so that a change of the sensed light beam can be suppressed, and a change in a detected value of the magnetic field with respect to a value of the magnetic field can be suppressed. Therefore, the vibration resistance of the two-core optical fiber magnetic field sensor can be further improved.

MODES FOR CARRYING OUT THE INVENTION

<First Embodiment>

Figure 1:
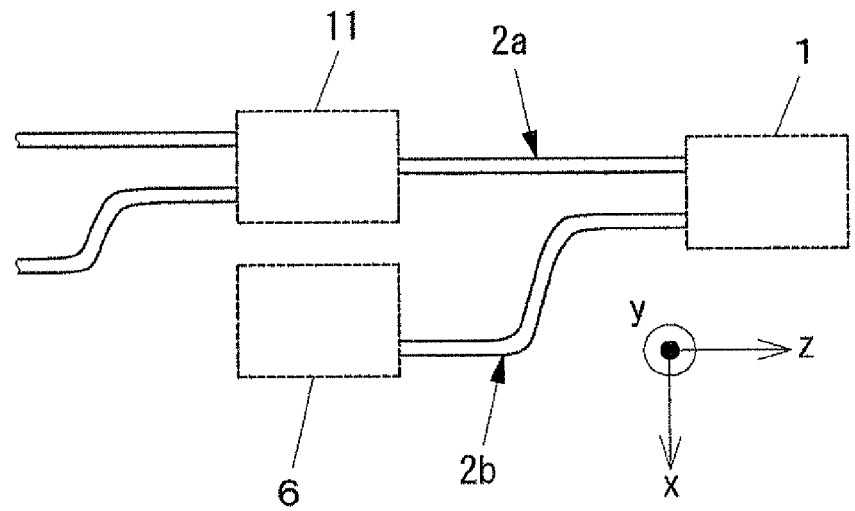
FIG. 1 is a diagram illustrating a configuration of a two-core optical fiber magnetic field sensor according to a first embodiment of the present invention.
Figure 2:
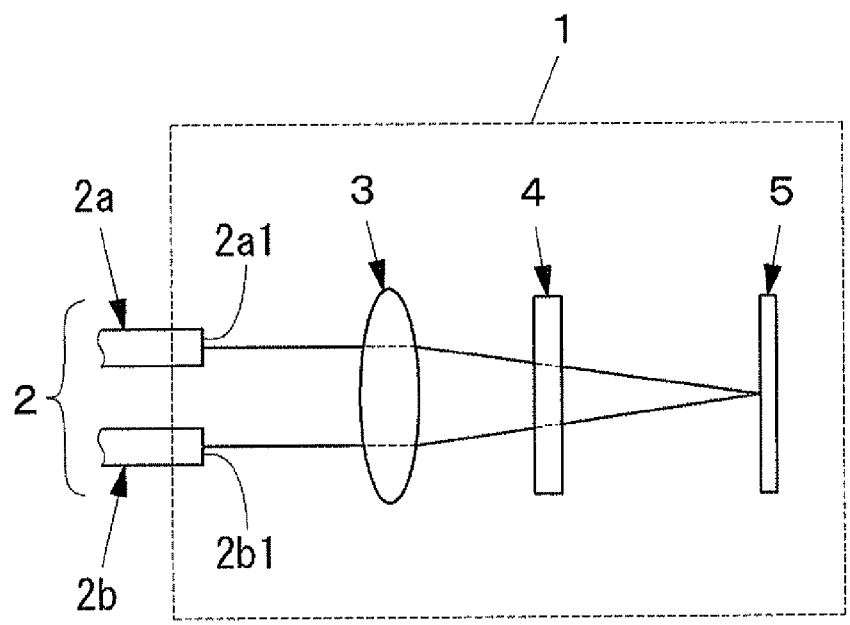
FIG. 2 is a diagram illustrating a configuration of a two-core optical fiber magnetic field sensor according to the present invention.

Hereinafter, a two-core optical fiber magnetic field sensor according to a first embodiment of the present invention will be described in detail with reference to FIGS. 1 to 4. In addition, in the figures, x axes, y axes, and z axes are in one-to-one correspondence. FIG. 1 is a diagram illustrating a configuration of the two-core optical fiber magnetic field sensor according to the first embodiment of the present invention. FIG. 2 illustrates a configuration and arrangement of optical parts from a light incidence/emission unit 2 to a reflector 5 of the two-core optical fiber magnetic field sensor 1 when the propagation direction of a light beam is denoted by the z axis and the horizontal and vertical axes in a plane perpendicular to the Z axis are denoted by the x and y axes, respectively. In addition, optical paths of the propagating light beam which transmits through the inner portion of each optical part are indicated by broken lines, and other optical paths are indicated by solid lines.

As illustrated in FIG. 2, the two-core optical fiber magnetic field sensor 1 according to the present invention is configured to include optical parts of a lens 3 and a magnetic garnet 4 functioning as a Faraday rotator for measuring a magnetic field applied from a measurement object. In addition, a light incidence/emission unit 2 is arranged at the one-end sides of these optical parts, and a mirror 5 which is a reflector is arranged at the opposite side of the light incidence/emission unit 2 to interpose the optical parts. In other words, the lens 3 and the magnetic garnet 4 are arranged between light incidence/emission end portions 2a1 and 2b1 of the light incidence/emission unit 2 and the reflector 5.

With respect to the optical parts, the lens 3 and the magnetic garnet 4 are arranged sequentially in the z axis direction from the light incidence/emission end portions 2a1 and 2b1 of the light incidence/emission unit 2. Preferably, an anti-reflection film configured with a dielectric material is formed on each optical plane of each optical part.

The light incidence/emission unit 2 is configured to include two optical fibers 2a and 2b which are used as waveguides. The optical fibers 2a and 2b are single-mode span fibers which are twisted in the manufacturing step. Each of the optical fibers 2a and 2b is configured to include a core portion which the light beam propagates and a clad layer and a coat layer which are sequentially installed around the core portion. The optical fiber 2a is optically connected to a light source (not illustrated) which oscillates a light beam. The optical fiber 2a allows the light beam emitted from the light source to propagate, emits the light beam to the optical parts described above, receives a reflected light beam reflected by the mirror 5, and allows the reflected light beam to propagate an optical fiber birefringence compensation mirror 6 (refer to FIG. 1) to be described below.

The lens 3 condenses the incident light beam. An aspherical lens, a ball lens, a plano-convex lens, a gradient index lens, or the like may be used as the lens 3.

The magnetic garnet 4 is a non-reciprocal polarization plane rotation element which the light beam transmitting through the lens 3 is incident on and which rotates the polarization plane of the light beam. The magnetic garnet 4 is disposed in the vicinity of a measurement object (for example, a power line) and is applied with a magnetic field from the measurement object to rotate the polarization plane in proportion to the strength of the magnetic field. A magnetic garnet having a rotation angle of 45 degrees at the time of magnetic saturation in the use wavelength band is used as the magnetic garnet 4, and a ferromagnetic bismuth substituted garnet single crystal may be used. In addition, the rotation direction of the polarization plane is changed according to the direction of the magnetic field which is the measurement object. In addition, the magnetic garnet 4 is formed to have an outer shape of a flat plate. As a modified example, the above configuration may be modified into a configuration where a plurality (three) of the magnetic garnets having the same composition and the same rotation angle in the same direction are arranged in the light propagation direction. The reason is as follows. In the case where the number of the magnetic garnets is one or three, a sum of the rotation angles becomes 45 degrees or 135 degrees, so that assembling can be easily performed and a change in a detected value of magnetic field with respect to the magnetic field is suppressed. Therefore, vibration resistance of the two-core optical fiber magnetic field sensor 1 is improved. In addition, in a configuration, two magnetic garnets may be arranged.

In addition, a mirror 5 is disposed at the other side of the magnetic garnet 4. The mirror 5 is a reflecting mirror which reflects the light beam transmitting through the magnetic garnet 4. In the embodiment, as an example, a total reflection film formed by coating a multi-layered dielectric film or a metal film on a surface of a substrate is used.

Figure 3:
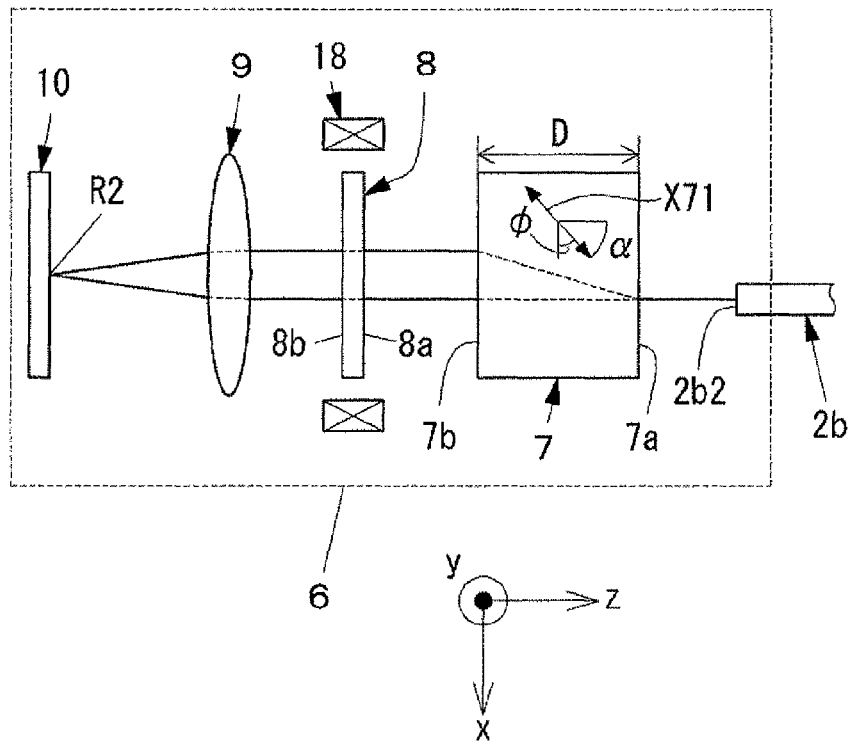
FIG. 3 is a diagram illustrating a configuration of an example of an optical fiber birefringence compensation mirror which is optically coupled with the two-core optical fiber magnetic field sensor illustrated in FIG. 2.

In addition, the optical fiber birefringence compensation mirror 6 is arranged to the other-end-side light incidence/emission end portion 2$b$2 (refer to FIG. 3) of the other optical fiber 2$b$, and the optical fiber birefringence compensation mirror 6 is optically connected to the one end side 2$b$2 of the other optical fiber 2$b$. The optical fiber birefringence compensation mirror 6 is described in detail with reference to FIG. 3. The x axis, the y axis, and the z axis in FIG. 3 are in one-to-one correspondence with those in FIGS. 1 and 2. In FIG. 3, the optical fiber birefringence compensation mirror 6 is configured to include the other optical fiber 2$b$, a birefringent element 7 having two parallel planes 7$a$ and 7$b$, a magnetic garnet 8, a magnet 18 which magnetically saturates the magnetic garnet 8, one lens 9, and a mirror 10 which is a reflector.

The other-end-side light incidence/emission end portion 2$b$2 of the optical fiber 2$b$ is arranged to face the one plane 7$a$ of the birefringent element 7. The birefringent element 7 is a uniaxial birefringent element body. A crystal axis X71 thereof is adjusted so as to be inclined by an angle $\phi$ with respect to the plane 7$a$, and a crystal axis of the optical plane (plane 7$a$) is set to be parallel to the x axis. In addition, the birefringent element 7 has two planes 7$a$ and 7$b$ which are parallel to each other. As the birefringent element 7, for example, rutile ($TiO_2$), calcite ($CaCO_3$), yttrium vanadate ($YVO_4$), lithium niobate ($LiNbO_3$), and the like may be used. Among these crystals, rutile which is particularly too hard to be injured and has no deliquescency is preferably used. In the case where rutile is used as the birefringent element 7, the angle $\alpha$ between the normal line of the plane and the crystal axis X71 is set to be 47.8 degrees. In addition, in order to allow a normal beam and an abnormal beam after the birefringence to be emitted parallel to each other, the two planes 7$a$ and 7$b$ are set to be parallel to each other. In addition, preferably, an anti-reflection film of a dielectric material is formed on a surface of the birefringent element 7. Next, the light beam propagates between the optical fiber 2$b$ and the birefringent element 7.

The magnetic garnet 8 is a non-reciprocal polarization plane rotation element which rotates the polarization directions of the polarization planes of the linearly polarized light beams (the normal beam and the abnormal beam), which are the incident light beams transmitting through the birefringent element 7, by 45 degrees in the same direction. The magnetic garnet 8 is magnetically saturated by a magnetic field applied from the magnet 18. A magnetic garnet having a rotation angle of 45 degrees at the time of magnetic saturation in the use wavelength band is used as the magnetic garnet 8, and a ferromagnetic bismuth substituted garnet single crystal may be used. In addition, the rotation directions of the polarization planes are set to be clockwise/counterclockwise directions according to the direction of magnetization of the magnet 18. In addition, the magnetic garnet 8 is formed to have an outer shape of a flat plate. At the time of arrangement, the birefringent element 7 and the magnetic garnet 8 are arranged so that the other plane 7$b$ of the birefringent element 7 and the one plane 8$a$ of the magnetic garnet 8 face each other.

On the other hand, the lens 9 and the mirror 10 are arranged sequentially on the other plane 8$b$ of the magnetic garnet 8. The lens 9 is arranged between the magnetic garnet 8 and the mirror 10 to collimate or condense the incident light beam. Preferably, an aspherical lens, a ball lens, a plano-convex lens, a gradient index lens, or the like is used as the lens 9

Figure 4:
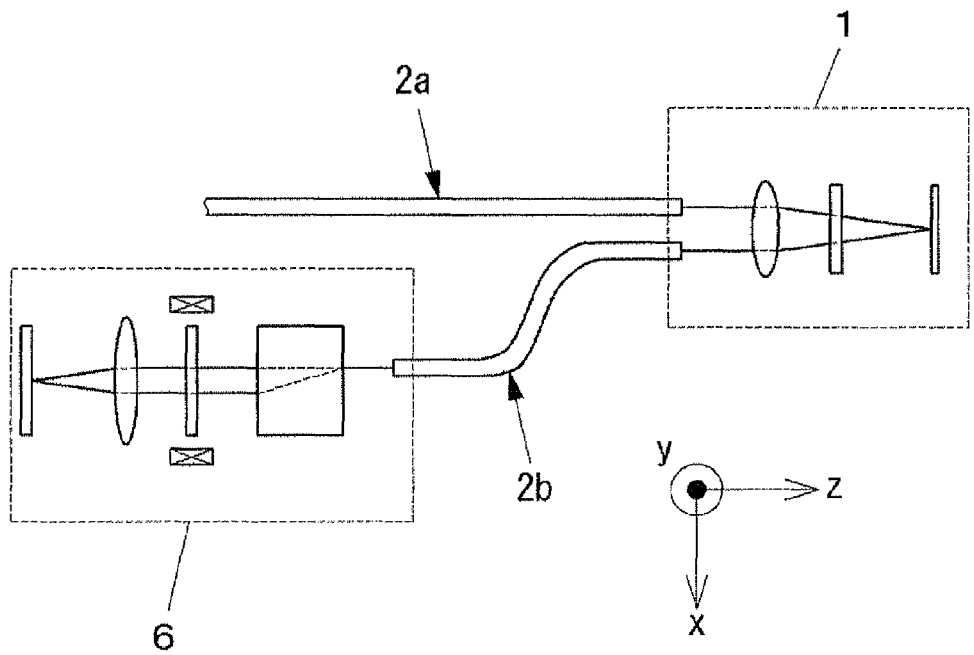
FIG. 4 is a schematic diagram illustrating a configuration according to the first embodiment of the present invention.

The mirror 10 is a reflecting mirror which reflects the light beam transmitting through the magnetic garnet 8. In the embodiment, as an example, a total reflection film formed by coating a multi-layered dielectric film or a metal film on a surface of a substrate is used. In this manner, the magnetic garnet 8 and the lens 9 are arranged between the birefringent element 7 and the mirror 10. FIG. 4 schematically illustrates the configuration of the embodiment where the two-core optical fiber magnetic field sensor 1 and the optical fiber birefringence compensation mirror 6 are optically connected to each other.

Next, operations of the two-core optical fiber magnetic field sensor 1 will be described with reference to FIGS. 1 and 2.

If the light beam propagating from the light source to a current sensor main body 11 (refer to FIG. 1) is incident on the optical fiber 2$a$, the light beam propagates the optical fiber 2$a$ and is emitted from the light incidence/emission end portion 2$a$1 to the lens 3. While the diameter of the light beam is spread with a certain spreading angle at the time of emission, the light beam is incident on the lens 3.

The light beam incident on the lens 3 is condensed, and the light beam is incident on the magnetic garnet 4. Since the magnetic garnet 4 is applied with the magnetic field from the measurement object, when the light beam is incident on the magnetic garnet 4 and transmits through the magnetic garnet 4, the polarization plane of the light beam is rotated by an angle $\theta$ in proportion to the strength of the magnetic field applied from the measurement object.

The light beam emitted from the magnetic garnet 4 is reflected on the reflection plane of the mirror 5 and is incident on the magnetic garnet 4 again, so that the polarization plane is further rotated. Therefore, the polarization plane is rotated by a total angle of $2\theta$ by the magnetic garnet 4.

Next, the light beam transmitting through the magnetic garnet 4 is incident on the lens 3, and the light beam transmitting through the lens 3 is incident on the light incidence/emission end portion 2$b$1 of the other optical fiber 2. The optical fiber 2$b$ has a small amount of birefringence.

Next, operations of the optical fiber birefringence compensation mirror 6 will be described with reference to FIG. 3. As described above, the light beam propagating the optical fiber 2$b$ is emitted from the other-end-side light incidence/emission end portion 2$b$2 with a certain spreading angle and is incident on the birefringent element 7.

The light beam which is incident on the birefringent element 7 is divided into linearly polarized light beams of which the polarization directions are perpendicular to each other, that is, a normal beam and an abnormal beam according to the direction of the crystal axis arranged along the x axis direction. Herein, the thickness (crystal length) D of the birefringent element 7 in the propagation direction of the normal beam is expressed as follows, $$D = \frac{(no^2 \cdot \tan^2\phi + ne^2) \cdot dc}{(no^2 - ne^2) \cdot \tan\phi} \quad [\text{Equation 1}]$$

Herein, no denotes a refractive index of the normal beam in the birefringent element 7; ne denotes a refractive index of the abnormal beam in the birefringent element 7; φ denotes an angle between the crystal axis X71 of the birefringent element 7 and the plane perpendicular to the propagation direction of the normal beam; and dc denotes a division width of the normal beam and the abnormal beam.

As described above, in the case where the thickness D is set, although no and ne of each crystal are changed, the optimal thickness can be set according to the change, and the divided light beam can be emitted from the plane 7b. In addition, if the direction of the crystal axis X71 is adjusted, the thickness D can be reduced. In addition, in the case where no, ne, and dc are constant and the birefringent element 7 is rutile, theoretically, when α is 47.8 degrees, the thickness D can suppressed down to the minimum and the division width of the normal beam and the abnormal beam can be maintained to the maximum. Therefore, most preferably, α is 47.8 degrees.

The divided normal beam and the divided abnormal beam are emitted from the other plane 7b of the birefringent element 7 and are incident on the magnetic garnet 8 to transmit through the magnetic garnet 8. As described above, the magnetic garnet 8 is magnetically saturated to have a rotation angle of 45 degrees. Therefore, the two linearly polarized light beams of the normal beam and the abnormal beam emitted from the birefringent element 7 transmit through the magnetic garnet 8, so that the polarization directions are rotated by 45 degrees in the same direction.

The two linearly polarized light beams emitted from the magnetic garnet 8 transmit through the lens 9 and are reflected by the mirror 10 in point symmetry at one point R2 on the surface of the mirror 10 at the side opposite to the incidence angle, so that the linearly polarized light beams are exchanged in the up and down positions of FIG. 3. The reflected light beams transmit through the lens 9 again.

The two linearly polarized light beams transmit through the magnetic garnet 8 again, so that the polarization directions are further rotated by 45 degrees in the same direction. Among them, the one linearly polarized light beam becomes an abnormal beam within the birefringent element 7, and the other linearly polarized light beam becomes a normal beam within the birefringent element 7.

The two linearly polarized light beams emitted from the magnetic garnet 8 are incident on the plane 7b of the birefringent element 7 again. As described above, the two linearly polarized light beams become the normal beam and the abnormal beam within the birefringent element 7, and only the abnormal beam is shifted, so that the two linearly polarized light beams are combined as one light beam. When the linearly polarized light beams are incident on the birefringent element 7 again and re-transmit through the birefringent element 7, the linearly polarized light beam which transmits as the normal beam when the light beam first transmits through the birefringent element 7 transmits through the birefringent element 7 as the abnormal beam when the light beam re-transmits. On the other hand, the linearly polarized light beam which transmits as the abnormal beam when the light beam first transmits through the birefringent element 7 transmits through the birefringent element 7 as the normal beam when the light beam re-transmits. Next, the two linearly polarized light beams are recombined as one light beam.

The recombined light beam is emitted from the one plane 7a of the birefringent element 7 and is incident on the other optical fiber 2b.

Next, as illustrated in FIG. 2, the light beam which is emitted from the other optical fiber 2b and is incident on the two-core optical fiber magnetic field sensor 1 again transmits through the lens 3 and the magnetic garnet 4 and is reflected by the mirror 5, and after the reflection, the light beam re-transmits through the magnetic garnet 4 and the lens 3 and is incident on the one optical fiber 2a again. When the light beam re-transmits through the magnetic garnet 4, as described above, the polarization plane of the light beam is rotated by twice the angle θ in proportion to the strength of the magnetic field applied from the measurement object. Therefore, the polarization plane is rotated by a total of 4θ by the magnetic garnet 4.

The light beam which propagates from the optical fiber 2a through the current sensor main body 11 to an optical receiver (not illustrated) and is received by the optical receiver is converted into an electric signal, and a magnitude of the magnetic field is obtained. The electric signal is in proportion to a total rotation angle of 4θ of the polarization plane at the magnetic garnet 4, and the rotation angle 4θ is in proportion to the strength of the magnetic field applied from the measurement object. Therefore, the strength of the magnetic field applied from the measurement object can be measured by detecting the electric signal.

In this manner, according to the two-core optical fiber magnetic field sensor 1 of the present invention, since the light beam reciprocates the two-core optical fiber magnetic field sensor 1 which is a magnetic field detection unit twice, the sensor sensitivity (magnetic field detection sensitivity) with respect to the magnetic field of the measurement object can be doubled, so that the magnetic field detection sensitivity of the two-core optical fiber magnetic field sensor 1 can be greatly improved.

In addition, the two-core optical fiber magnetic field sensor 1 is optically connected to the optical fiber birefringence compensation mirror 6, so that a change of the sensed light beam can be suppressed, and a change in a received light amount of the light receiving element due to the birefringence of the optical fiber can be suppressed, a change in the detected value of the magnetic field with respect to the value of the magnetic field can be suppressed, and the vibration resistance can be improved.

In addition, a span fiber or a low birefringence optical fiber containing lead oxide is used for each of the optical fibers 2a and 2b used as a propagation line, so that the birefringence of the propagation line can be reduced.

In addition, the two-core optical fiber magnetic field sensor is configured with a circuit corresponding to measurement of a high-frequency magnetic field, so that the high-frequency magnetic field can be measured.

Figure 14:
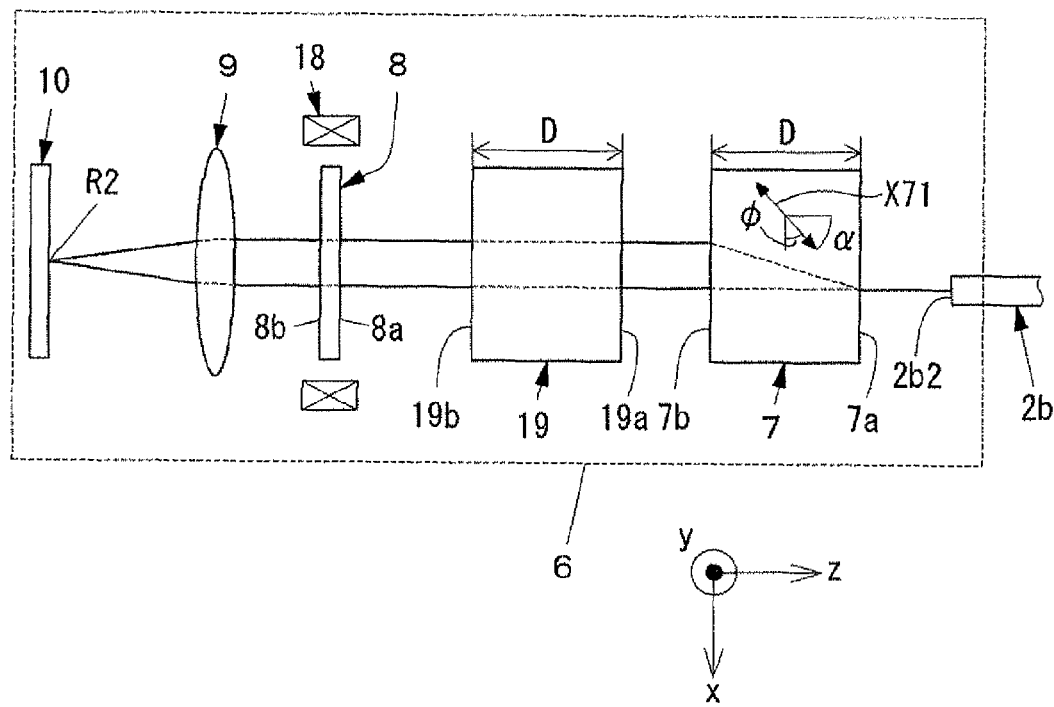
FIG. 14 is a diagram illustrating a configuration of a modified example of the optical fiber birefringence compensation mirror illustrated in FIG. 3.

In addition, the optical fiber birefringence compensation mirror 6 may be modified into a configuration illustrated in FIG. 14. The optical fiber birefringence compensation mirror 6 illustrated in FIG. 14 is different from the optical fiber birefringence compensation mirror 6 illustrated in FIG. 3 in that a second birefringent element 19 is installed between the birefringent element 7 and the optical path of the magnetic garnet 8. The second birefringent element 19 also has two planes 19a and 19b which are parallel to each other. Hereinafter, for the convenience of description, the birefringent element 7 is referred to as a "first birefringent element 7."

Figure 15:
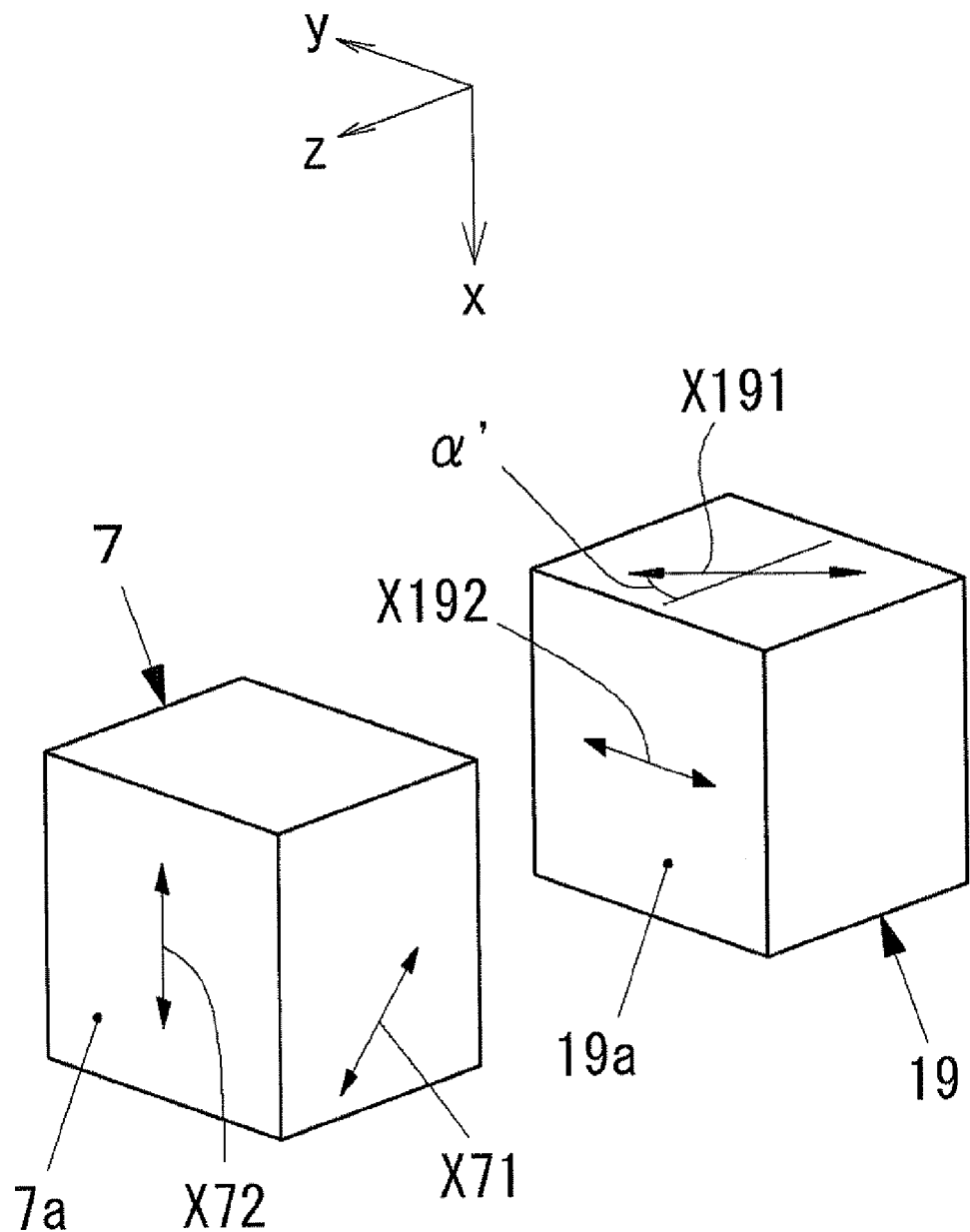
FIG. 15 is a perspective diagram illustrating an arrangement of a first birefringent element and a second birefringent element of the optical fiber birefringence compensation mirror illustrated in FIG. 14.

Similarly to the first birefringent element 7, the second birefringent element 19 is also a uniaxial birefringent element body, and as illustrated in FIG. 15, a crystal axis X191 is adjusted so as to be tilted by an angle α' with respect to the z-axis direction and a crystal axis X192 on an optical plane (plane 19a) is arranged to be parallel to the y-axis. On the other hand, a crystal axis X72 on the optical plane (plane 7a) of the first birefringent element 7 is arranged to be parallel to the x-axis. Therefore, as seen from the optical fiber 2b, the direction of the crystal axis X192 of the second birefringent element 19 is set to be different by 90 degrees from the direction of the crystal axis X72 of the first birefringent element 7. When the second birefringent element 19 is arranged with respect to the first birefringent element 7, the other plane 7b of the first birefringent element 7 is allowed to face the one plane 19a of the second birefringent element 19. Therefore, the magnetic garnet 8 and the lens 9 are arranged between the second birefringent element 19 and the mirror 10.

As the second birefringent element 19, rutile ($TiO_2$), calcite ($CaCO_3$), yttrium vanadate ($YVO_4$), lithium niobate ($LiNbO_3$), and the like may be used. Among these crystals, rutile which is particularly too hard to be injured and has no deliquescency is preferably used. In the case where rutile is used as the second birefringent element 19, the angle α' (corresponding to the direction of the crystal axis X191 in FIG. 15) between the normal line of the plane and the crystal axis is set to be 47.8 degrees. In addition, in order to allow the normal beam and the abnormal beam after the birefringence to be emitted parallel to each other, the two planes 19a and 19b are set to be parallel to each other. In addition, preferably, an anti-reflection film of a dielectric material is formed on a surface of the second birefringent element 19.

Next, operations of the optical fiber birefringence compensation mirror 6 will be described with reference to FIG. 14. The light beam propagating from the optical fiber 2b is emitted from the other-end-side light incidence/emission end portion 2b2 with a certain spreading angle and is incident on the first birefringent element 7.

The light beam which is incident on the first birefringent element 7 is divided into linearly polarized light beams of which the polarization directions are perpendicular to each other, that is, a normal beam and an abnormal beam.

The divided normal beam and the divided abnormal beam are emitted from the other plane 7b of the first birefringent element 7 and are incident on the second birefringent element 19. As described above, the direction of the crystal axis X192 is set to be different by 90 degrees from the direction of the crystal axis X72. Therefore, the polarization plane of the linearly polarized light beam which is the normal beam within the first birefringent element 7 is parallel to the direction of the crystal axis X192. Therefore, since the linearly polarized light beam which transmits through the first birefringent element 7 as the normal beam becomes the abnormal beam within the second birefringent element 19, the linearly polarized light beam is shifted to the -y-axis direction to transmit. On the other hand, since the polarization plane of the linearly polarized light beam which transmits through the first birefringent element 7 as the abnormal beam is perpendicular to the direction of the crystal axis X192, the linearly polarized light beam is not shifted but goes straight to transmit through the second birefringent element 19 as the normal beam.

Preferably, a sum of the shift amount of the abnormal beam in the first birefringent element 7 and the shift amount of the abnormal beam in the second birefringent element 19 is set to be equal to or larger than twice the mode field diameter of the optical fiber 2b. The reason is as follows. Since the magnetic garnet 8 has the temperature characteristics and the wavelength characteristics, although the rotation angles of the two linearly polarized light beams are shifted from 90 degrees due to the reciprocation of the magnetic garnet 8, the linearly polarized light beams having the component shifted from 90 degrees divided by the second birefringent element 19 and the first birefringent element 7 can be prevented from being incident on the optical fiber 2b.

In this manner, in the case where the two divided linearly polarized light beams transmit through the first birefringent element 7 and the second birefringent element 19, the direction of the crystal axis X72, the direction of the crystal axis X192, the thickness D of the first birefringent element 7, and the thickness D of the second birefringent element 19 are set so that the two divided linearly polarized light beams necessarily have the polarization states of both of the normal beam and the abnormal beam.

Herein, in the propagation direction of the normal beam, the thickness (crystal length) D of the second birefringent element 19 is set by the following Equation 2, similarly to the thickness D of the first birefringent element 7.

$$D = \frac{(no^2 \cdot \tan^2\phi + ne^2) \cdot dc}{(no^2 - ne^2) \cdot \tan\phi} \qquad \text{[Equation 2]}$$

The optical system of the optical fiber birefringence compensation mirror 6 illustrated in FIG. 14 is configured so that the shift amount of the abnormal beam at the time of transmitting the first birefringent element 7 and the shift amount of the abnormal beam at the time of transmitting the second birefringent element 19 are equal to each other. Therefore, as described above, it is preferable that the thickness values of the two birefringent elements 7 and 19 are set to the same value D and the two birefringent elements 7 and 19 are configured by using the same material.

In addition, it is more preferably that the optical length difference between the two linearly polarized light beams generated through the division of the normal beam and the abnormal beam at the time of transmitting through the second birefringent element 19 is set to be equal to the optical length difference between the two linearly polarized light beams generated through the division of the normal beam and the abnormal beam at the time of transmitting through the first birefringent element 7. In order to equalize the optical length differences, the thickness of the second birefringent element 19 and the direction of the crystal axis X191 are set according to the thickness of the first birefringent element 7 and the direction of the crystal axis X71. In the simplest configuration, as described above, the thicknesses of the two birefringent elements 7 and 19 are set to the same value D; the same material where the directions of the crystal axes X71 and X191 are aligned is used; and the direction of the crystal axis X192 is set to be different by 90 degrees from the direction of the crystal axis X72. According to this configuration, the optical length difference between the two linearly polarized light beams generated through the division of the first birefringent element 7 can be more securely compensated for by the second birefringent element 19.

Next, since the two linearly polarized light beams of the normal beam and the abnormal beam emitted from the second birefringent element 19 transmit through the magnetic garnet 8, the polarization directions thereof are rotated by 45 degrees in the same direction, and the two linearly polarized light beams further transmit through the lens 9 and are reflected in point symmetry at one point R2 on the surface of the mirror 10 which is a reflector. Due to the reflection with point symmetry, the propagation positions of the two linearly polarized light beams are exchanged before and after the reflection. In the optical fiber birefringence compensation mirror 6 illustrated in FIG. 14, before two linearly polarized light beams are incident on the lens 9, the two linearly polarized light beams are shifted by the same distance by the two birefringent elements 7 and 19. Therefore, the optical length difference between the two linearly polarized light beams generated through the division of the first birefringent element 7 is removed before the two linearly polarized light beams are incident on the lens 9.

The two reflected linearly polarized light beams transmit through the magnetic garnet 8 again, so that the polarization directions thereof are further rotated by 45 degrees in the same direction. Therefore, the polarization planes of the two linearly polarized light beams transmitting through the magnetic garnet 8 after the reflection by the mirror 10 is rotated by 90 degree with respect to the polarization planes before the incidence on the magnetic garnet 8.

The two linearly polarized light beams emitted from the magnetic garnet 8 are incident on the plane 19b of the second birefringent element 19. Within the second birefringent element 19, the one linearly polarized light beam becomes the abnormal beam, so that the linearly polarized light beam is shifted in the y-axis direction. The other linearly polarized light beam is not shifted but goes straight as the normal beam.

Next, the two linearly polarized light beams are incident on the plane 7b of the first birefringent element 7 again. The polarization plane of the linearly polarized light beam which is the normal beam in the second birefringent element 19 is parallel to the direction of the crystal axis X72. Therefore, the linearly polarized light beam transmitting through the second birefringent element 19 as the normal beam becomes the abnormal beam within the first birefringent element 7, so that the linearly polarized light beam is shifted in the x-axis direction. On the other hand, the polarization plane of the linearly polarized light beam transmitting through the second birefringent element 19 as the abnormal beam is perpendicular to the crystal axis X72, and thus, the linearly polarized light beam is not shifted but goes straight to transmit through the first birefringent element 7 as the normal beam. In this manner, the two linearly polarized light beams are recombined as one light beam. The recombined light beam is emitted from the one plane 7a of the first birefringent element 7 and is incident on the other optical fiber 2b.

In this manner, according to the optical fiber birefringence compensation mirror 6 illustrated in FIG. 14, the two linearly polarized light beams are shifted by the same distance by the two birefringent elements 7 and 19. Therefore, the optical length difference between the two linearly polarized light beams generated through the division of the first birefringent element 7 is compensated for by the second birefringent element 19, so that the optical length difference can be removed before the two linearly polarized light beams are incident on the lens 9. In addition, since the optical path is configured so that, after the compensation of the optical length difference, the normal beam and the abnormal beam are exchanged through the reflection by the mirror 10 and the 90-degree rotation of the polarization planes by the magnetic garnet 8, the principal axis of polarization is rotated by 90 degrees with respect to the light beam emitted from the optical fiber 2b, and the light beam having polarization located at just the rear side of the Pointcare sphere is allowed to be incident on the optical fiber 2b. Therefore, the two-core optical fiber magnetic field sensor 1 is optically connected to the optical fiber birefringence compensation mirror 6 illustrated in FIG. 14, so that a change of the sensed light beam can be suppressed; and the birefringence occurring due to the optical fiber is compensated for, so that a change in a received light amount of the light receiving element due to the birefringence of the optical fiber can be suppressed. Therefore, in the two-core optical fiber magnetic field sensor 1, a change in the detected value of the magnetic field with respect to the magnetic field can be suppressed, and the vibration resistance can be improved.

In addition, although the optical fiber birefringence compensation mirror 6 illustrated in FIG. 14 uses the magnetic garnet 8, even when the magnetic garnet 8 has the temperature characteristics and the wavelength characteristics, since the perpendicularity of the polarization planes of the two linearly polarized light beams is preserved, the birefringence occurring due to the optical fiber is compensated for.

<Second Embodiment>

Next, a two-core optical fiber magnetic field sensor according to a second embodiment of the present invention will be described with reference to FIG. 5. In addition, the same elements as those of the first embodiment are denoted by the same reference numerals, and redundant description thereof is not presented.

The two-core optical fiber magnetic field sensor according to the embodiment is different from that of the first embodiment in that, as a substitute for the optical fiber birefringence compensation mirror 6 illustrated in FIG. 3 or 4, a mirror module 12 configured with only the lens 9 and the mirror 10 is optically connected through the other optical fiber 2b to the two-core optical fiber magnetic field sensor 1.

The mirror module 12 is configured by arranging the mirror 10 which is one reflector at the other-end-side light incidence/emission end portion 2b2 of the light incidence/emission end portion of the other optical fiber 2b. The lens 9 is arranged between the mirror 10 and the other-end-side light incidence/emission end portion 2b2 to collimate or condense the incident light beam.

Figure 5:
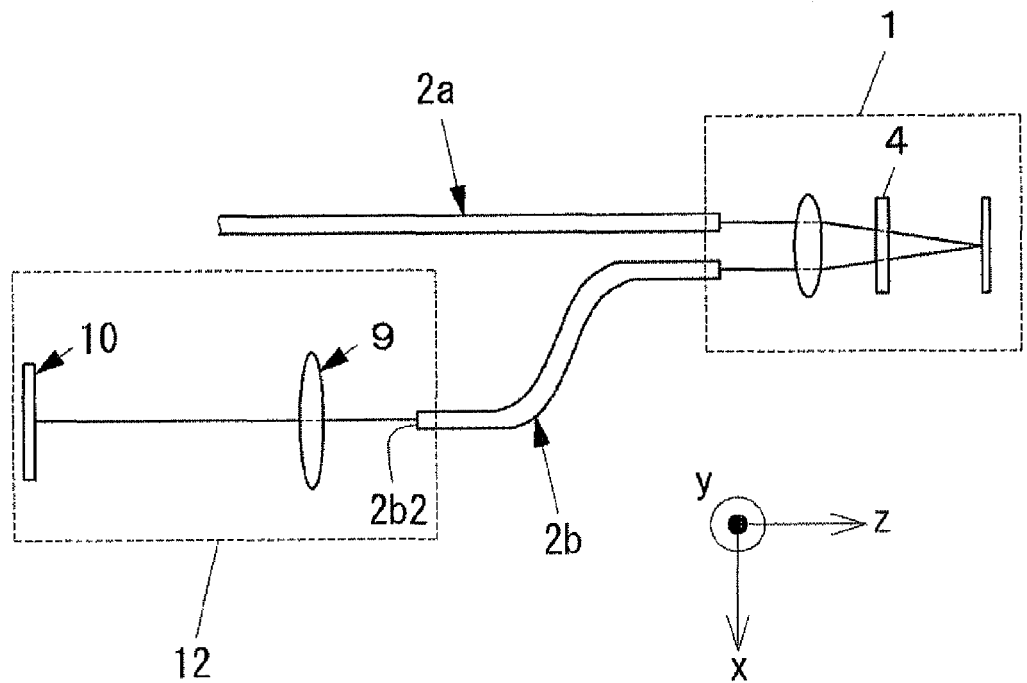
FIG. 5 is a schematic diagram illustrating a configuration according to a second embodiment of the present invention.

In addition, both of the two optical fibers 2a and 2b illustrated in FIG. 5 are low birefringence optical fibers (LBFs) containing lead oxide. As described above, the light beam which is rotated by only a total angle of 2θ propagates the other optical fiber 2b to transmit from the other-end-side light incidence/emission end portion 2b2 through the lens 9 and is reflected by the mirror 10. The light beam reflected by the mirror 10 transmits through the lens 9 again and is incident on the other optical fiber 2b. The light beam is incident on the two-core optical fiber magnetic field sensor 1 again. Finally, the polarization plane of the light beam is rotated by only a total angle of 4θ by the magnetic garnet 4 and propagates from the optical fiber 2a through the current sensor main body 11 (refer to FIG. 1) to the optical receiver (not illustrated). In addition, a configuration of the mirror module 12 where the other-end-side light incidence/emission end portion 2b2 is polished to be flat and the lens 9 is not presented may be considered.

<Third Embodiment>

Next, a two-core optical fiber magnetic field sensor according to a third embodiment of the present invention will be described with reference to FIG. 6. In addition, the same elements as those of the embodiments described above are denoted by the same reference numerals, and redundant description thereof is not presented.

Figure 6:
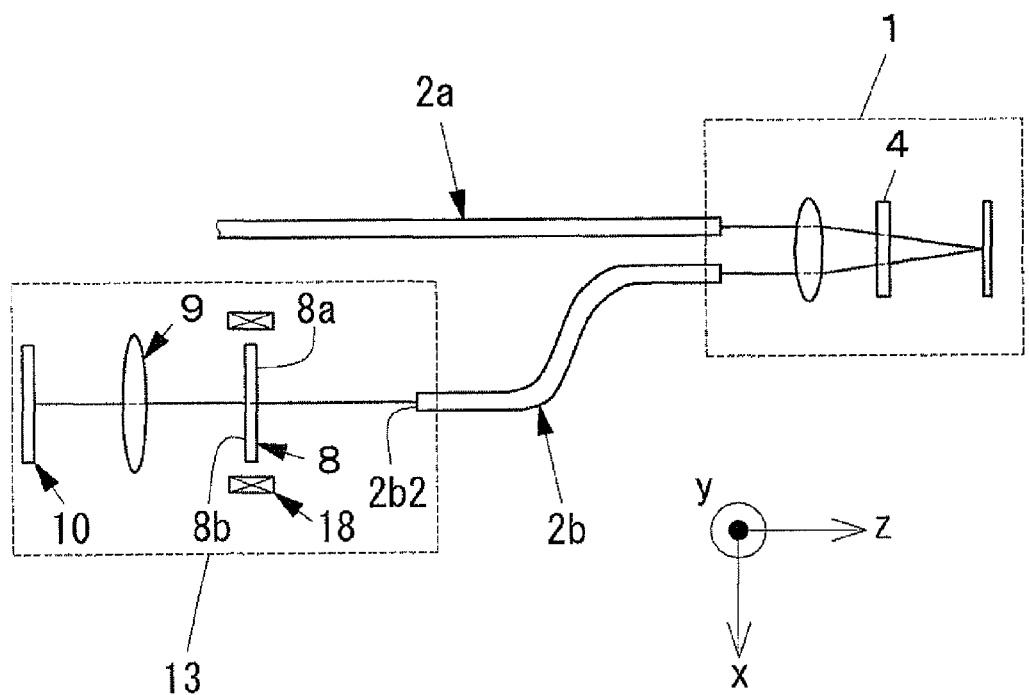
FIG. 6 is a schematic diagram illustrating a configuration according to a third embodiment of the present invention.

The two-core optical fiber magnetic field sensor according to the embodiment is different from the above-described embodiments in that, as a substitute for the optical fiber birefringence compensation mirror 6 according to the first embodiment or the mirror module 12 according to the second embodiment, a Faraday mirror 13 having a configuration where the birefringent element 7 of the optical fiber birefringence compensation mirror 6 is not presented as illustrated in FIG. 6 is optically connected through the other optical fiber 2b to the two-core optical fiber magnetic field sensor 1.

As illustrated in FIG. 6, the Faraday mirror 13 is configured to include the other optical fiber 2b, a magnetic garnet 8, a magnet 18 which magnetically saturates the magnetic garnet 8, one lens 9, and a mirror 10 which is a reflector. The lens 9 and the mirror 10 are sequentially arranged on the other plane 8b of the magnetic garnet 8, and the other-end-side light incidence/emission end portion 2b2 of the optical fiber 2b is arranged to face the one plane 8a of the magnetic garnet 8.

As described above, the light beam which is rotated by only a total angle of 2θ propagates the other optical fiber 2b and is incident from the other-end-side light incidence/emission end portion 2b2 to the magnetic garnet 8, so that the polarization direction is rotated by 45 degrees. The light beam transmits through the lens 9 and is reflected by the mirror 10. The light beam reflected by the mirror 10 transmits through the lens 9 again and transmits through the magnetic garnet 8, so that the polarization direction is further rotated by 45 degrees. The light beam emitted from the magnetic garnet 8 is incident on the other optical fiber 2b and is incident on the two-core optical fiber magnetic field sensor 1 again, so that the polarization plane of the light beam is finally rotated by a total angle of 4θ by the magnetic garnet 4. The light beam propagates from the optical fiber 2a through the current sensor main body 11 (refer to FIG. 1) to an optical receiver (not illustrated).

<Fourth Embodiment>

Next, a two-core optical fiber magnetic field sensor according to a fourth embodiment of the present invention will be described with reference to FIG. 7. In addition, the same elements as those of the embodiments described above are denoted by the same reference numerals, and redundant description thereof is not presented.

Figure 7:
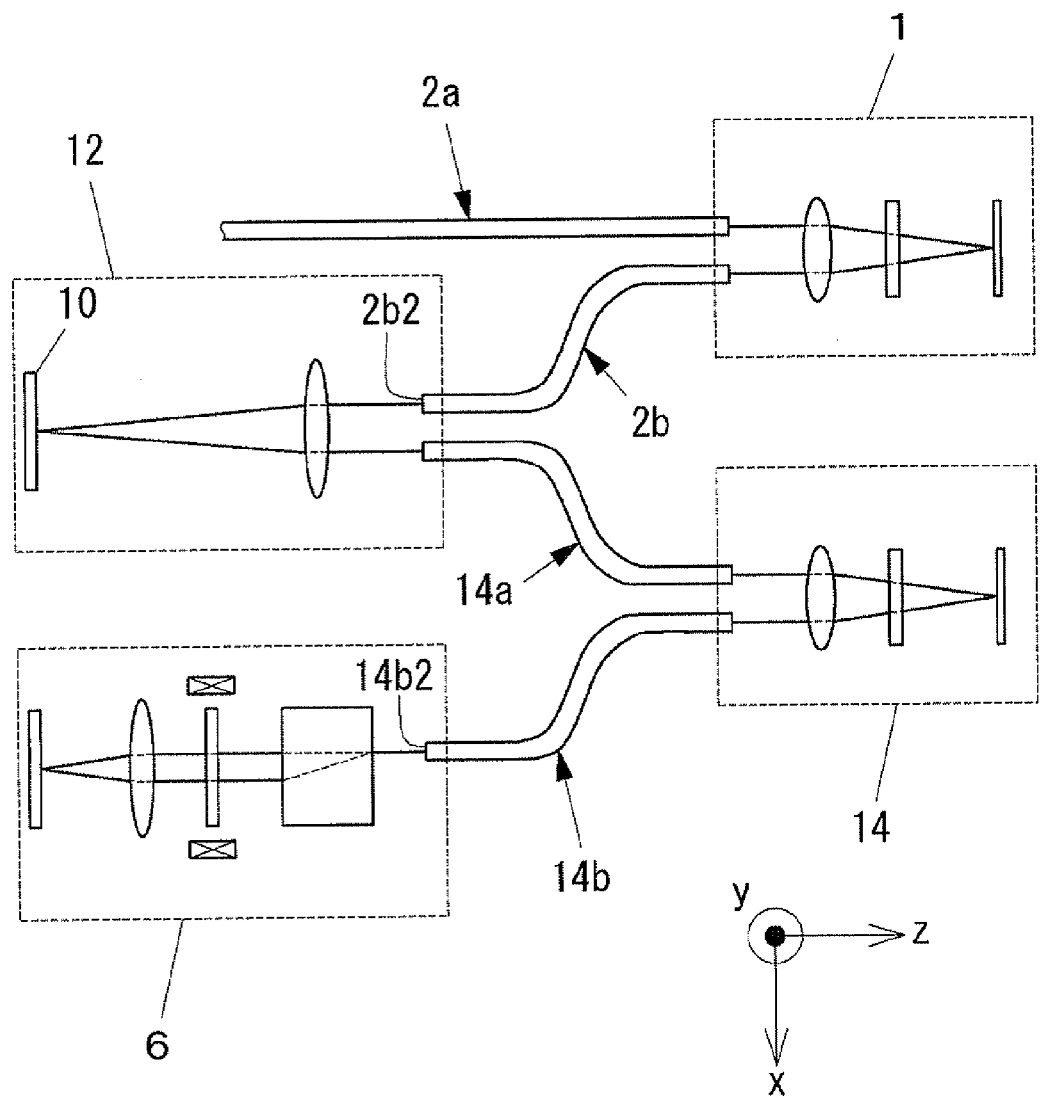
FIG. 7 is a schematic diagram illustrating a configuration according to a fourth embodiment of the present invention.

The two-core optical fiber magnetic field sensor according to the embodiment is different from the above-described embodiments in that, as illustrated in FIG. 7, two two-core optical fiber magnetic field sensors are installed with respect to a magnetic field of a measurement object, a mirror module 12 where one reflector is arranged is optically connected to the other-end-side light incidence/emission end portion of the light incidence/emission end portions of a pair of the optical fibers configured to include the other optical fiber 2b of the first stage (front stage) two-core optical fiber magnetic field sensor 1 and the one optical fiber 14a of the second stage (rear stage) two-core optical fiber magnetic field sensor 14, and the optical fiber birefringence compensation mirror 6 is arranged to the other-end-side light incidence/emission end portion of the other optical fiber 14b of the two-core optical fiber magnetic field sensor 14. The two-core optical fiber magnetic field sensors 1 and 14 have the same configuration.

As described above, the light beam which is rotated by only a total angle of 2θ propagates the other optical fiber 2b and is incident from the other-end-side light incidence/emission end portion 2b2 on the mirror module 12, so that the light beam is reflected by the mirror 10. The light beam propagates the optical fiber 14a and is incident on the rear stage two-core optical fiber magnetic field sensor 14.

In addition, the light beam which is rotated by only a total angle of 2θ by the rear stage two-core optical fiber magnetic field sensor 14 propagates the other optical fiber 14b and propagates the optical fiber birefringence compensation mirror 6 from the other-end-side light incidence/emission end portion 14b2, so that the light beam is rotated by only a total angle of 2θ by the rear stage two-core optical fiber magnetic field sensor 14 again. The light beam propagates the mirror module 12 and is rotated by only a total angle of 2θ by the front stage two-core optical fiber magnetic field sensor 1.

Therefore, with respect to the light beam which first propagates from the optical fiber 2a to the front stage two-core optical fiber magnetic field sensor 1, the polarization plane is rotated by only a total angle of 8θ. The light beam propagates from the optical fiber 2a through the current sensor main body 11 (refer to FIG. 1) to an optical receiver (not illustrated).

Figure 8:
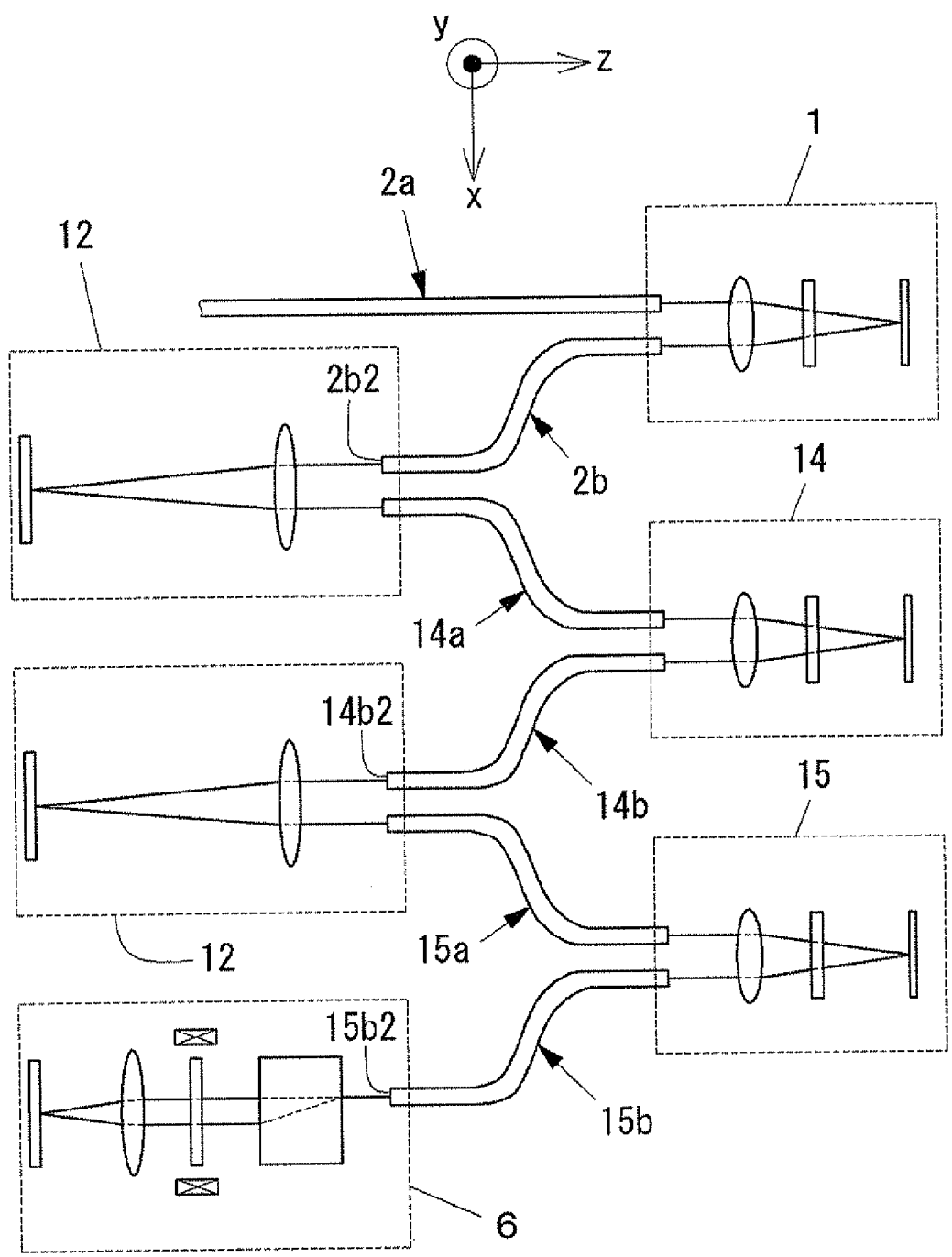
FIG. 8 is a schematic diagram illustrating a configuration according to a modified example of the fourth embodiment.

In addition, in the embodiment, as illustrated in FIG. 8, the number of the two-core optical fiber magnetic field sensors may be increased to be n equal to or larger than 2 (n≥2) (FIG. 8 illustrates the case of n=3). In this case, a total rotation angle of the polarization plane of the light beam becomes 4nθ. According to the two-core optical fiber magnetic field sensor of the embodiment, in addition to the effect of the two-core optical fiber magnetic field sensor according to the first embodiment, since the light beam is configured to reciprocate the two-core optical fiber magnetic field sensor which is a magnetic field detection unit n times, the sensitivity (magnetic field detection sensitivity) of the sensor with respect to the magnetic field of the measurement object can be increased to be about n times, so that the magnetic field detection sensitivity of the two-core optical fiber magnetic field sensor can be further improved.

In addition, as a substitute for the optical fiber birefringence compensation mirror 6, a mirror module 12 where one reflector is arranged is optically connected to the other-end-side light incidence/emission end portions 14b2 and 15b2 of the light incidence/emission end portions of the other optical fibers 14b and 15b of the last stage two-core optical fiber magnetic field sensor (the second stage two-core optical fiber magnetic field sensor 14 in FIG. 7 or the n-th stage two-core optical fiber magnetic field sensor 15 in FIG. 8), and all the optical fibers 2a, 2b, 14a, 14b, 15a, and 15b may be replaced with low birefringence optical fibers containing lead oxide.

In addition, the optical fiber birefringence compensation mirror 6 which is optically connected to the other-end-side light incidence/emission end portions 14b2 and 15b2 of the light incidence/emission end portions of the other optical fibers 14b and 15b of the last stage two-core optical fiber magnetic field sensor (the second stage two-core optical fiber magnetic field sensor 14 in FIG. 7 or the n-th stage two-core optical fiber magnetic field sensor 15 in FIG. 8) may be replaced with the Faraday mirror 13 illustrated in FIG. 6 or may be replaced with the optical fiber birefringence compensation mirror 6 illustrated in FIG. 14.

<Fifth Embodiment>

Next, a two-core optical fiber magnetic field sensor according to a fifth embodiment of the present invention will be described with reference to FIG. 9. In addition, the same elements as those of the embodiments described above are denoted by the same reference numerals, and redundant description thereof is not presented.

The two-core optical fiber magnetic field sensor according to the embodiment is different from the above-described embodiments, in that two two-core optical fiber magnetic field sensors are installed with respect to a magnetic field of a measurement object and the other optical fiber 2b of the front stage two-core optical fiber magnetic field sensor 1 and the one optical fiber 14a of the rear stage two-core optical fiber magnetic field sensor 14 are configured with a common optical fiber 16. In addition, the optical fiber birefringence compensation mirror 6 is arranged to the other-end-side light incidence/emission end portion 14b2 of the other optical fiber 14b of the second stage two-core optical fiber magnetic field sensor 14.

As described above, the light beam which is rotated by only a total angle of 2θ by the front stage two-core optical fiber magnetic field sensor 1 propagates the optical fiber 16 and is incident on the rear stage two-core optical fiber magnetic field sensor 14, so that the polarization plane of the light beam is rotated by a total angle of 2θ. The light beam propagates the other optical fiber 14b and propagates the optical fiber birefringence compensation mirror 6, so that the light beam is rotated by only a total angle of 2θ by the rear stage two-core optical fiber magnetic field sensor 14 again. The light beam propagates the optical fiber 16 and is rotated by only a total angle of 2θ by the front stage two-core optical fiber magnetic field sensor 1.

Therefore, with respect to the light beam which first propagates from the optical fiber 2a to the front stage two-core optical fiber magnetic field sensor 1, the polarization plane is rotated by only a total angle of 8θ. The light beam propagates from the optical fiber 2a through the current sensor main body 11 (refer to FIG. 1) to an optical receiver (not illustrated).

Figure 10:
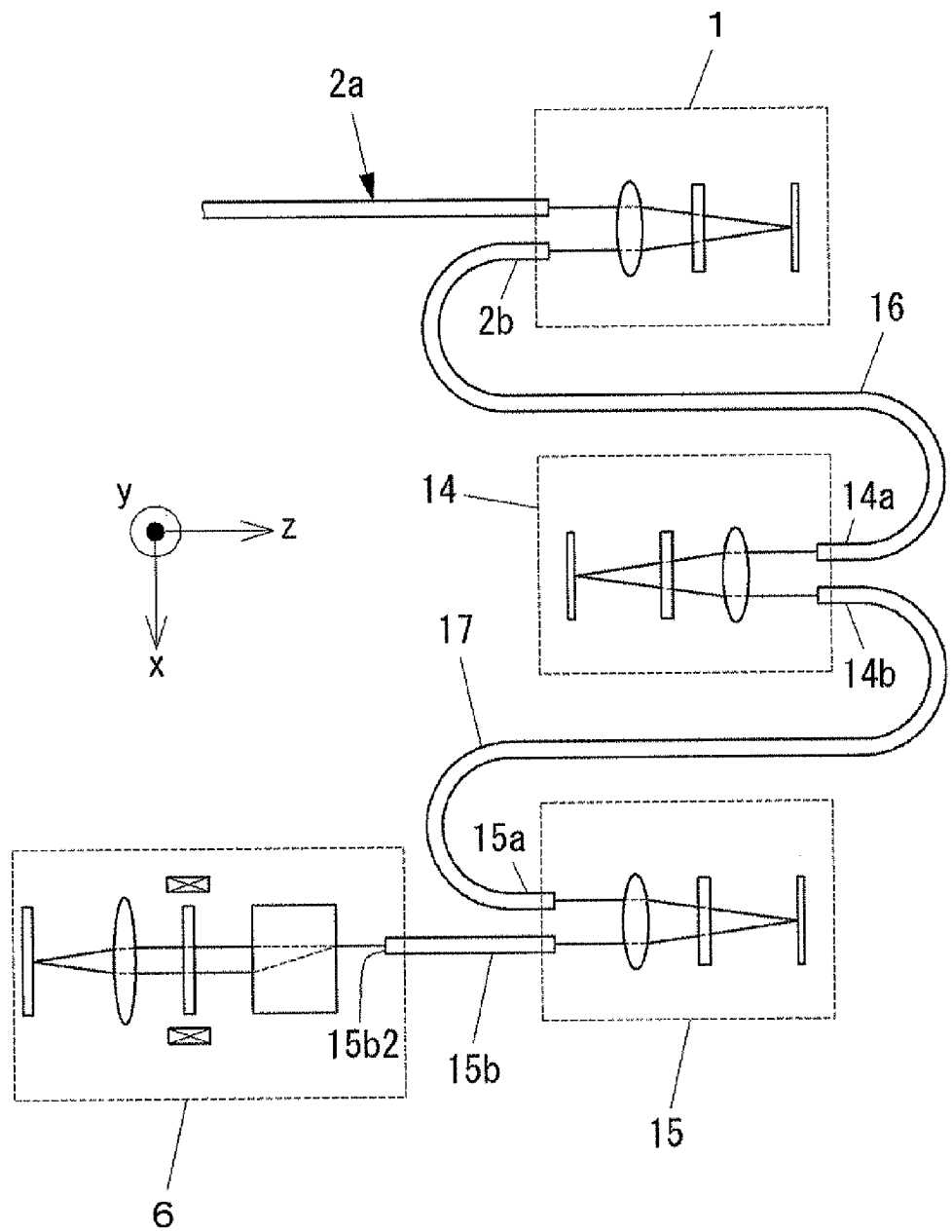
FIG. 10 is a schematic diagram illustrating a configuration according to a modified example of the fifth embodiment.
Figure 11:
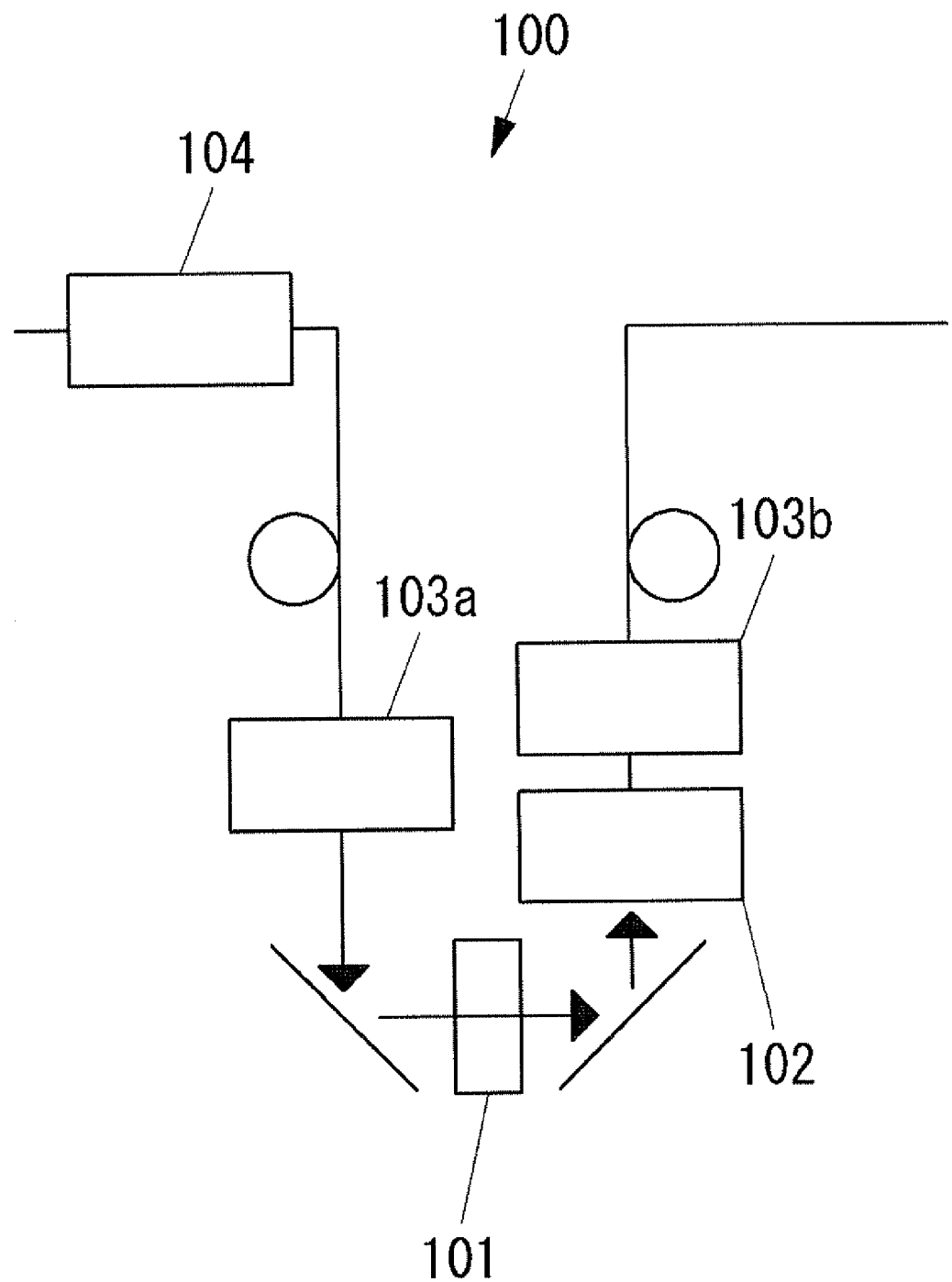
FIG. 11 is a diagram illustrating a configuration of an example of a reflection type magnetic field sensor in the related art.

In addition, in the embodiment, as illustrated in FIG. 10, the number of the two-core optical fiber magnetic field sensors may be increased to be n equal to or larger than 2 (n≥2) (FIG. 10 illustrates the case of n=3). In addition, in the configuration illustrated in FIG. 10, the other optical fiber 14b of the two-core optical fiber magnetic field sensor 14 and the one optical fiber 15a of the n-th stage two-core optical fiber magnetic field sensor 15 are configured with a common optical fiber 17. In this case, a total rotation angle of the polarization plane of the light beam becomes 4nθ. According to the two-core optical fiber magnetic field sensor of the embodiment, in addition to the effects of the two-core optical fiber magnetic field sensor according to the first embodiment, since the light beam is configured to reciprocate the two-core optical fiber magnetic field sensor which is a magnetic field detection unit n times, the sensitivity (magnetic field detection sensitivity) of the sensor with respect to the magnetic field of the measurement object can be increased to be about n times, so that the magnetic field detection sensitivity of the two-core optical fiber magnetic field sensor can be further improved.

Figure 9:
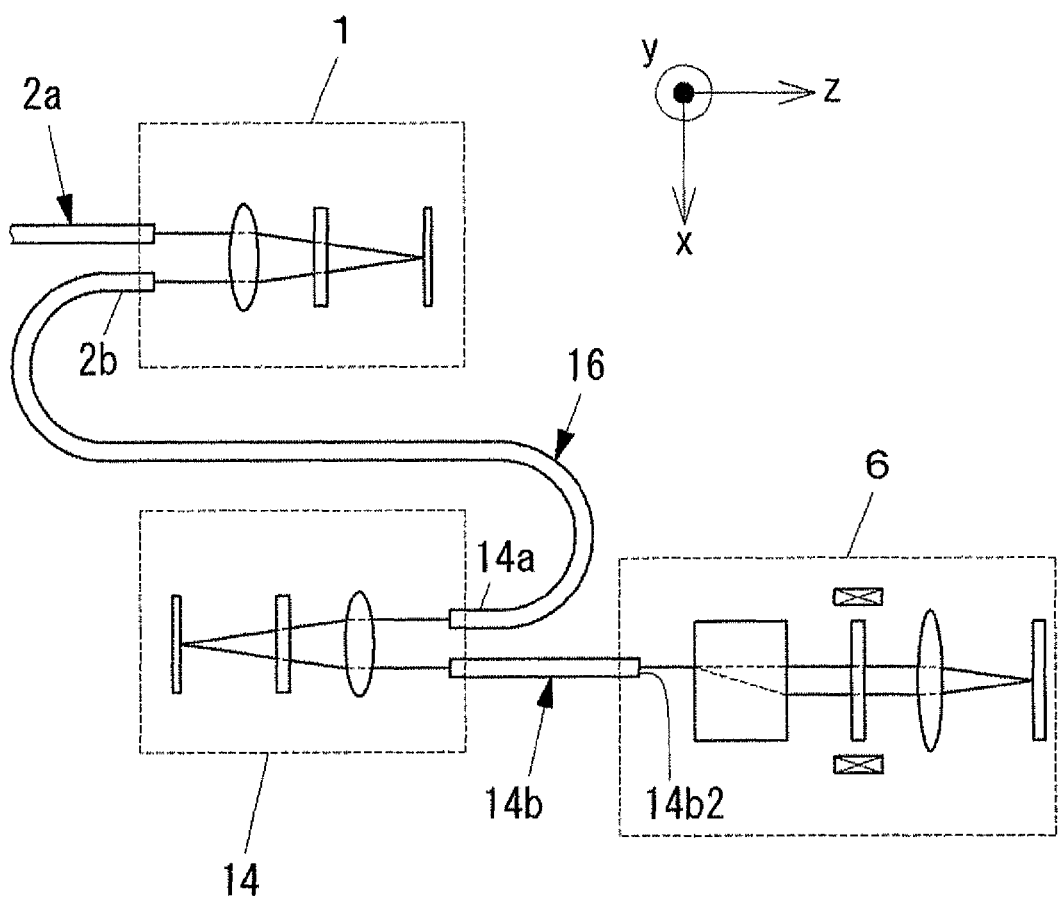
FIG. 9 is a schematic diagram illustrating a configuration according to a fifth embodiment of the present invention.

In addition, as a substitute for the optical fiber birefringence compensation mirror 6, a mirror module 12 where one reflector is arranged is optically connected to the other-end-side light incidence/emission end portions 14b2 and 15b2 of the light incidence/emission end portions of the other optical fibers 14b and 15b of the last stage two-core optical fiber magnetic field sensor (the second stage two-core optical fiber magnetic field sensor 14 in FIG. 9 or the n-th stage two-core optical fiber magnetic field sensor 15 in FIG. 10), and all the optical fibers 2a, 16 (2b, 14a), and 14b or 17 (14b, 15a), and 15b may be replaced with low birefringence optical fibers containing lead oxide.

In addition, the optical fiber birefringence compensation mirror 6 which is optically connected to the other-end-side light incidence/emission end portions 14b2 and 15b2 of the light incidence/emission end portions of the other optical fibers 14b and 15b of the last stage two-core optical fiber magnetic field sensor (the second stage two-core optical fiber magnetic field sensor 14 in FIG. 9 or the n-th stage two-core optical fiber magnetic field sensor 15 in FIG. 10) may be replaced with the Faraday mirror 13.

<Sixth Embodiment>

Next, a two-core optical fiber magnetic field sensor according to a sixth embodiment of the present invention will be described with reference to FIGS. 16 to 23 and 31. In addition, the same elements as those of the embodiment described above are denoted by the same reference numerals, and redundant description thereof will not be repeated. In addition, the x axes, the y axes, and the z axes illustrated in FIGS. 16 to 23 and 31 are in one-to-one correspondence with those of the figures.

Figure 16:
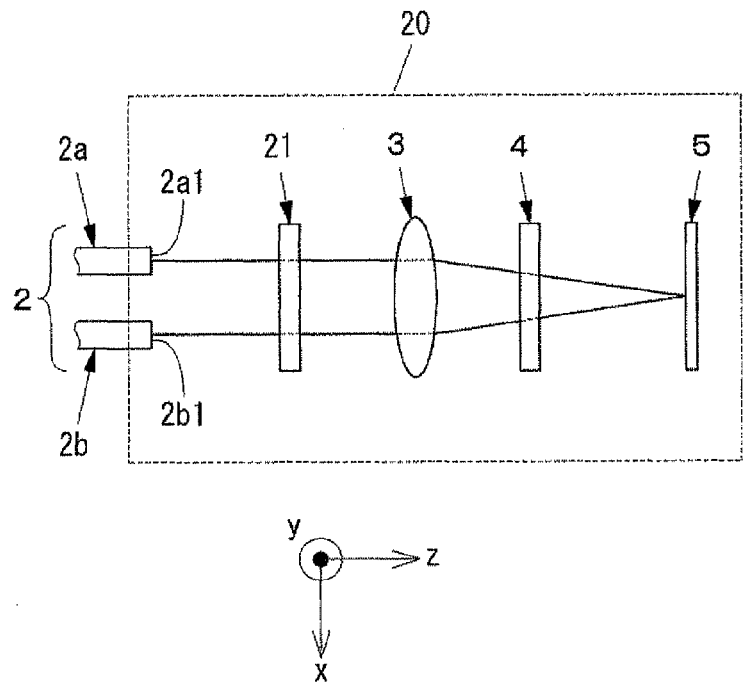
FIG. 16 is a diagram illustrating a configuration of a two-core optical fiber magnetic field sensor according to a sixth embodiment of the present invention.

In FIG. 16, the two-core optical fiber magnetic field sensor 20 according to the embodiment is different from the above-described first embodiment in that a λ/4 wavelength plate 21 is installed between the light incidence/emission unit 2 and the lens 3, and the two optical fibers 2a and 2b of the light incidence/emission unit 2 are configured with polarization plane preserving optical fibers.

The lens 3, the magnetic garnet 4, and the λ/4 wavelength plate 21 are arranged between the light incidence/emission end portions 2a1 and 2b1 of the light incidence/emission unit 2 and the mirror 5 which is a reflector.

Figure 20:
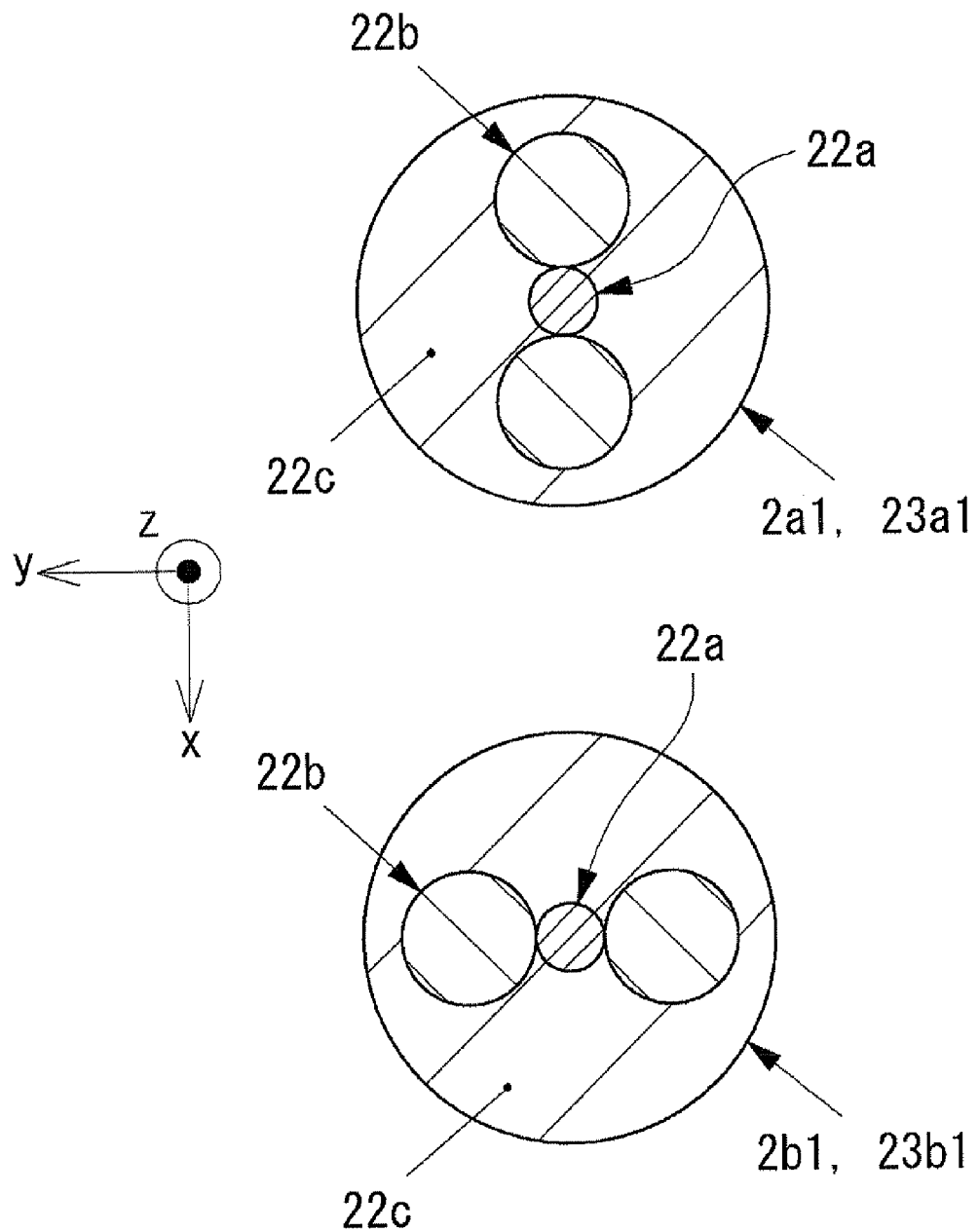
FIG. 20 is a cross-sectional diagram illustrating light incidence/emission end portions of two optical fibers constituting a light incidence/emission unit of the two-core optical fiber magnetic field sensor illustrated in FIG. 16 or FIG. 25 to be described below.

As an example, as illustrated in cross-sectional views of FIG. 20, the two polarization plane preserving optical fibers 2a and 2b may be so-called panda type optical fibers, each of which is configured to include a core 22a having a high refractive index, a clad 22c having a relatively low refractive index which is formed concentrically around the core 22a, and two stress exerting members 22b which are installed inside the clad 22c. The optical fiber 2a is arranged so that the direction of the slow axis in the light incidence/emission end portion 2a1 is the x-axis direction and the other optical fiber 2b is arranged so that the direction of the slow axis in the light incidence/emission end portion 2b1 is the y-axis direction as illustrated in FIG. 20. Therefore, the two polarization plane preserving optical fibers 2a and 2b are arranged so that the directions of the slow axes thereof are different by 90 degrees.

The λ/4 wavelength plate 21 converts the polarization planes of the two linearly polarized light beams which are incident from the polarization plane preserving optical fiber 2a into the polarization planes of circularly-polarized light beams. Herein, λ indicates a wavelength of the light beams (two linearly polarized light beams) which are incident on the two-core optical fiber magnetic field sensor 20. As the λ/4 wavelength plate 21, quartz, a λ/4 wavelength film, a zero-th order single plate, a zero-th order two-piece quartz plate, a zero-th order optical glass phase plate generating a phase difference of λ/4, or the like may be appropriately used. If a high order wavelength plate is used, the wavelength characteristics and the temperature characteristics are deteriorated, and thus the high order wavelength plate is not appropriate for the λ/4 wavelength plate 21.

Figure 21:
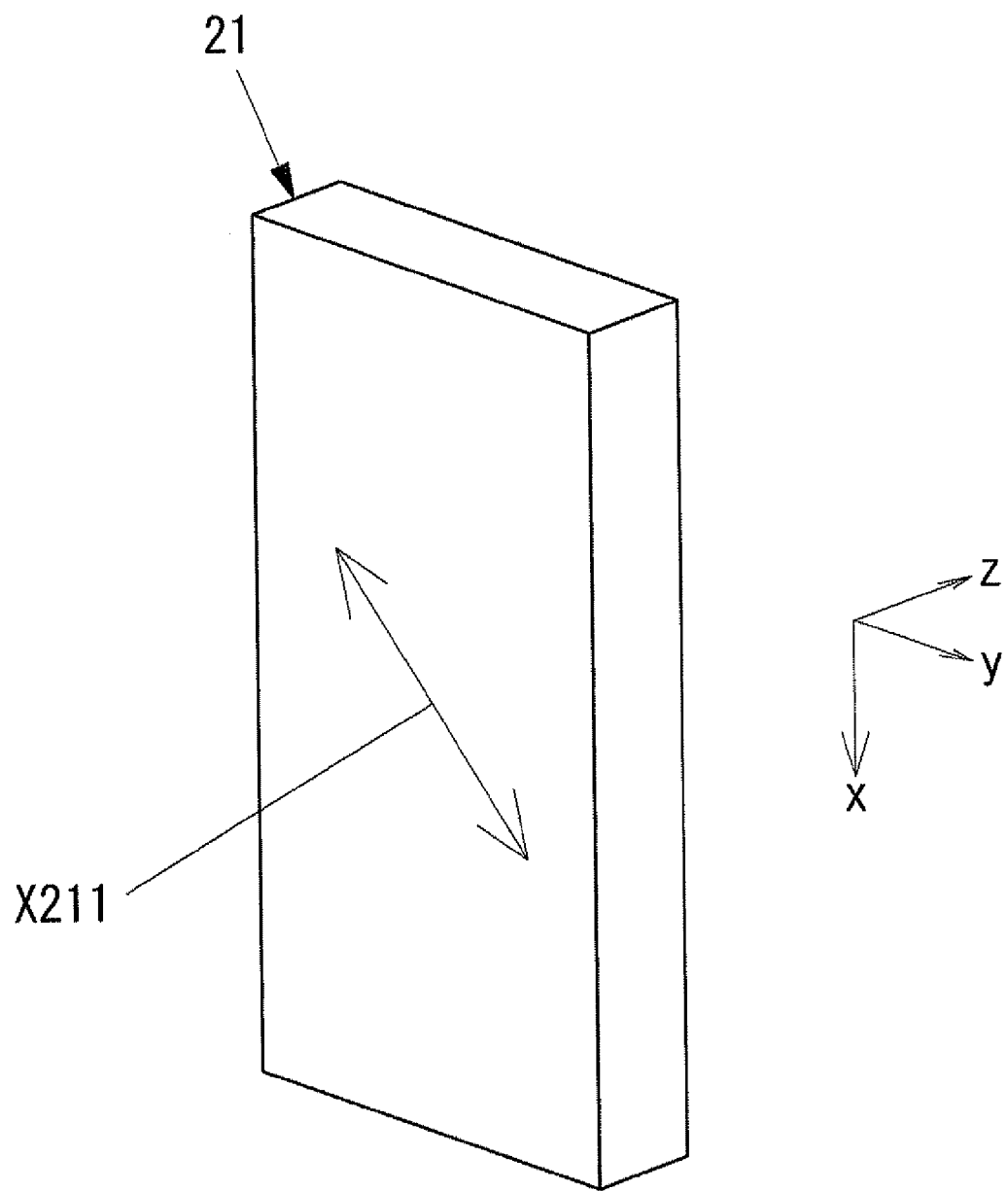
FIG. 21 is a perspective diagram illustrating a λ/4 wavelength plate in the two-core optical fiber magnetic field sensor illustrated in FIG. 16.

As illustrated in FIG. 21, the λ/4 wavelength plate 21 is arranged so that the direction of the crystal axis X211 of the λ/4 wavelength plate 21 is different by 45 degrees from the x-axis or the y-axis. Therefore, the λ/4 wavelength plate 21 is arranged so that the direction of the crystal axis X211 of the λ/4 wavelength plate 21 is different by 45 degree from the direction of the slow axis of any one of the polarization plane preserving optical fibers 2a and 2b. If the counterclockwise rotation is defined as + direction, in the example illustrated in FIG. 21, the λ/4 wavelength plate 21 is arranged so that the direction of the crystal axis X211 is different by +45 degrees from the x-axis direction and is different by −45 degrees from the y-axis direction.

In addition, similarly to FIG. 3, the optical fiber birefringence compensation mirror 6 is arranged to the other-end-side light incidence/emission end portion 2b2 of the other optical fiber 2b. In other words, the optical fiber birefringence compensation mirror 6 is optically connected through the other optical fiber 2b to the two-core optical fiber magnetic field sensor 20 (refer to FIG. 18).

Figure 31:
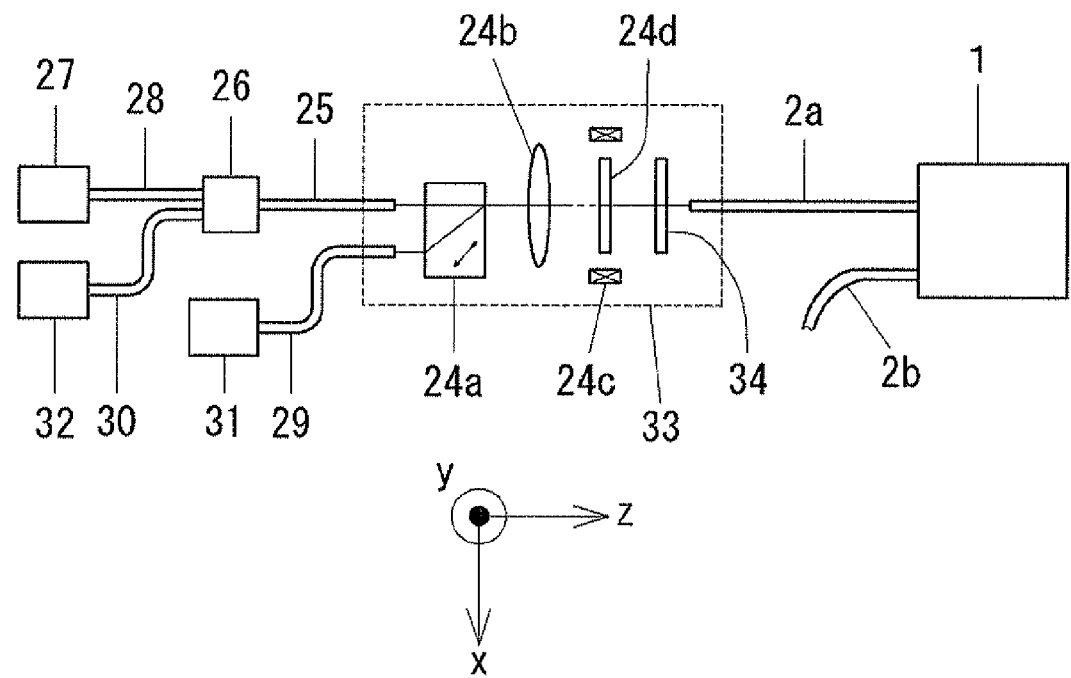
FIG. 31 is a diagram illustrating a configuration of an optical system according to Example 6.

In addition, an optical bias module 33 illustrated in FIG. 31 is optically connected through the optical fiber 2a. In addition, a polarization depending type optical circulator 26 is optically connected through a polarization plane preserving optical fiber 25 to the optical bias module 33.

The optical bias module 33 is configured to include a λ/4 wavelength plate 34, a birefringent element 24a, a lens 24b, a magnet 24c, and a magnetic garnet 24d. Similarly to the λ/4 wavelength plate 21, the λ/4 wavelength plate 34 is configured with quartz, a λ/4 wavelength film, a zero-th order single plate, a zero-th order two-piece quartz plate, a zero-th order optical glass phase plate generating a phase difference of λ/4, or the like. Similarly to the direction of the crystal axis X211 (FIG. 21), the λ/4 wavelength plate 34 is arranged so that the direction of the crystal axis is different by 45 degrees from the x-axis or the y-axis. The λ/4 wavelength plate 34 may be arranged between the birefringent element 24a and the magnetic garnet 24d.

Similarly to the birefringent element 7 (FIG. 3), the birefringent element 24a is a uniaxial birefringent element having α=47.8 degrees, and rutile is used for the birefringent element 24a. The magnetic garnet 24d is a non-reciprocal polarization plane rotation element, which is configured as a ferromagnetic bismuth substituted garnet having a Faraday rotation angle of 22.5 degrees when it is magnetically saturated by a magnetic field applied from the magnet 24c. The magnet 24c is an Sm—Co series or Nd—Fe—B series permanent magnet which has an outer shape of a ring and is disposed to surround the magnetic garnet 24d.

In addition, an ASE light source 27 having a wavelength band of 1550 nm is optically connected through an optical fiber 28 to the polarization depending type optical circulator 26. The light beam is respectively divided into two linearly polarized light beams by the optical bias module 33 and the polarization depending type optical circulator 26, and the linearly polarized light beams are detected through optical fibers 29 and 30 by optical power meters (hereinafter, denoted by OPMs) 31 and 32.

Next, operations of the two-core optical fiber magnetic field sensor 20 will be described. As illustrated in FIG. 31, the light beam propagating the optical bias module 33 from the light source 27 is incident at 45 degrees with respect to the slow axis of the optical fiber 2a. The light beam propagates the optical fiber 2a and is emitted from the light incidence/emission end portion 2a1 to the λ/4 wavelength plate 21 (FIG. 16). In the embodiment, since the optical fiber 2a is a polarization plane preserving optical fiber, stress is generated into the direction of the stress exerting member 22b (FIG. 20), and large birefringence occurs, so that the polarization state is preserved. The linearly polarized light beam parallel to the fast axis propagates fast in comparison with the linearly polarized light beam parallel to the slow axis. Therefore, while the linearly polarized light beam parallel to the fast axis and the linearly polarized light beam parallel to the slow axis have a phase difference, the two linearly polarized light beams are emitted from the light incidence/emission end portion 2a1 to the λ/4 wavelength plate 21 (FIG. 16). While the diameter of the light beam is spread with a certain spreading angle at the time of emission, the light beam is incident on the λ/4 wavelength plate 21.

The two linearly polarized light beams transmit through the λ/4 wavelength plate 21, so that two linearly polarized light beams are converted into circularly-polarized light beams. As described above, the crystal axis X211 (FIG. 21) of the λ/4 wavelength plate 21 is set so as to be tilted by +45 degrees with respect to the x-axis direction and so as to be tilted by −45 degrees with respect to the y-axis direction. Therefore, with respect to the vibration direction of an electric vector of the linearly polarized light beam parallel to the fast axis (hereinafter, referred to as a "linearly polarized light beam Ff"), the direction of the crystal axis X211 is tilted by 45 degree in the clockwise rotation as seen in the z-axis direction. Therefore, the linearly polarized light beam Ff transmitting through the λ/4 wavelength plate 21 becomes the circularly-polarized light beam in the clockwise rotation as seen in the z-axis direction.

On the other hand, with respect to the vibration direction of an electric vector of the linearly polarized light beam parallel to the slow axis (hereinafter, referred to as a "linearly polarized light beam Fs") emitted from the optical fiber 2a, the direction of the crystal axis X211 is tilted by 45 degrees in the counterclockwise rotation as seen in the z-axis direction. Therefore, the linearly polarized light beam Fs transmitting through the λ/4 wavelength plate 21 becomes the circularly-polarized light beam in the counterclockwise rotation as seen in the z-axis direction.

In this manner, the linearly polarized light beams Ff and Fs transmitting through the λ/4 wavelength plate 21 are converted into the two circularly-polarized light beams where the rotation directions of the distal ends of the electric vectors are different from each other. For the convenience of description, the polarization component where the linearly polarized light beam Ff is converted into the circularly-polarized light beam is denoted by the circularly-polarized light beam Ff; and the polarization component where the linearly polarized light beam Fs is converted into the circularly-polarized light beam is denoted by the circularly-polarized light beam Fs. In addition, even after the transmission through the λ/4 wavelength plate 21, the phase difference between the linearly polarized light beams Ff and Fs is not changed, but the phase difference before the transmission is preserved.

The two circularly-polarized light beams Ff and Fs are incident on the lens 3 to be condensed and, subsequently, are incident on the magnetic garnet 4. Although the magnetic garnet 4 is applied with a magnetic field from a measurement object, since the two incident polarization components are circularly-polarized light beams, the direction of the magnetic field in the embodiment is set to the direction in which the phase difference between two circularly-polarized light beams Ff and Fs is reduced during the transmission through the magnetic garnet 4.

The light beams (two circularly-polarized light beams Ff and Fs) emitted from the magnetic garnet 4 are reflected on the reflection plane of the mirror 5 and are incident on the magnetic garnet 4 again, so that the phase difference between the two circularly-polarized light beams Ff and Fs is further reduced.

Figure 18:
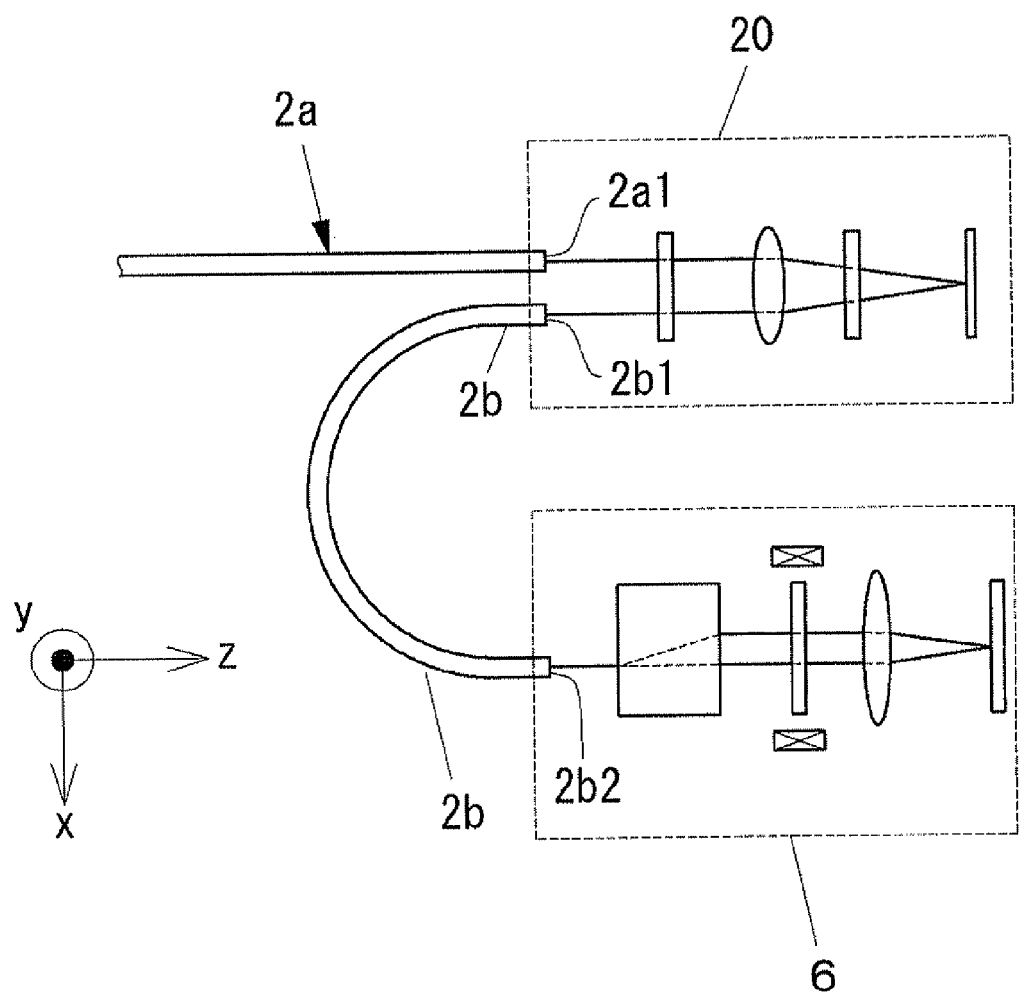
FIG. 18 is a schematic diagram illustrating a configuration where an optical fiber birefringence compensation mirror is connected to the two-core optical fiber magnetic field sensor illustrated in FIG. 16.

Next, the light beams (two circularly-polarized light beams Ff and Fs) transmitting through the magnetic garnet 4 are incident on the lens 3, and the light beams transmitting through the lens 3 are incident on the λ/4 wavelength plate 21 to transmit through the λ/4 wavelength plate 21 again, so that the light beams are converted into the linearly polarized light beams Ff and Fs. The direction of the crystal axis X211 is tilted by 45 degrees in the counterclockwise rotation as seen in the −z-axis direction. Therefore, the circularly-polarized light beam Ff transmitting through the λ/4 wavelength plate 21 becomes the linearly polarized light beam Ff in the x-axis direction. On the other hand, the circularly-polarized light beam Fs transmitting through the λ/4 wavelength plate 21 becomes the linearly polarized light beam Fs in the y-axis direction. In other words, the circularly-polarized light beams Ff and Fs transmitting through the λ/4 wavelength plate 21 are converted into the two linearly polarized light beams of which the vibration directions of the electric vectors are different by 90 degree from each other. With respect to the two linearly polarized light beams Ff and Fs, the linearly polarized light beam Ff is incident in the fast axis of the light incidence/emission end portion 2b1, and the linearly polarized light beam Fs is incident in the slow axis thereof. The two linearly polarized light beams Ff and Fs propagate the other optical fiber 2b. As illustrated in FIG. 18, since the other optical fiber 2b and the other optical fiber 2b constituting the optical fiber birefringence compensation mirror 6 are common, the two-core optical fiber magnetic field sensor 20 is optically connected to the optical fiber birefringence compensation mirror 6.

Figure 22:
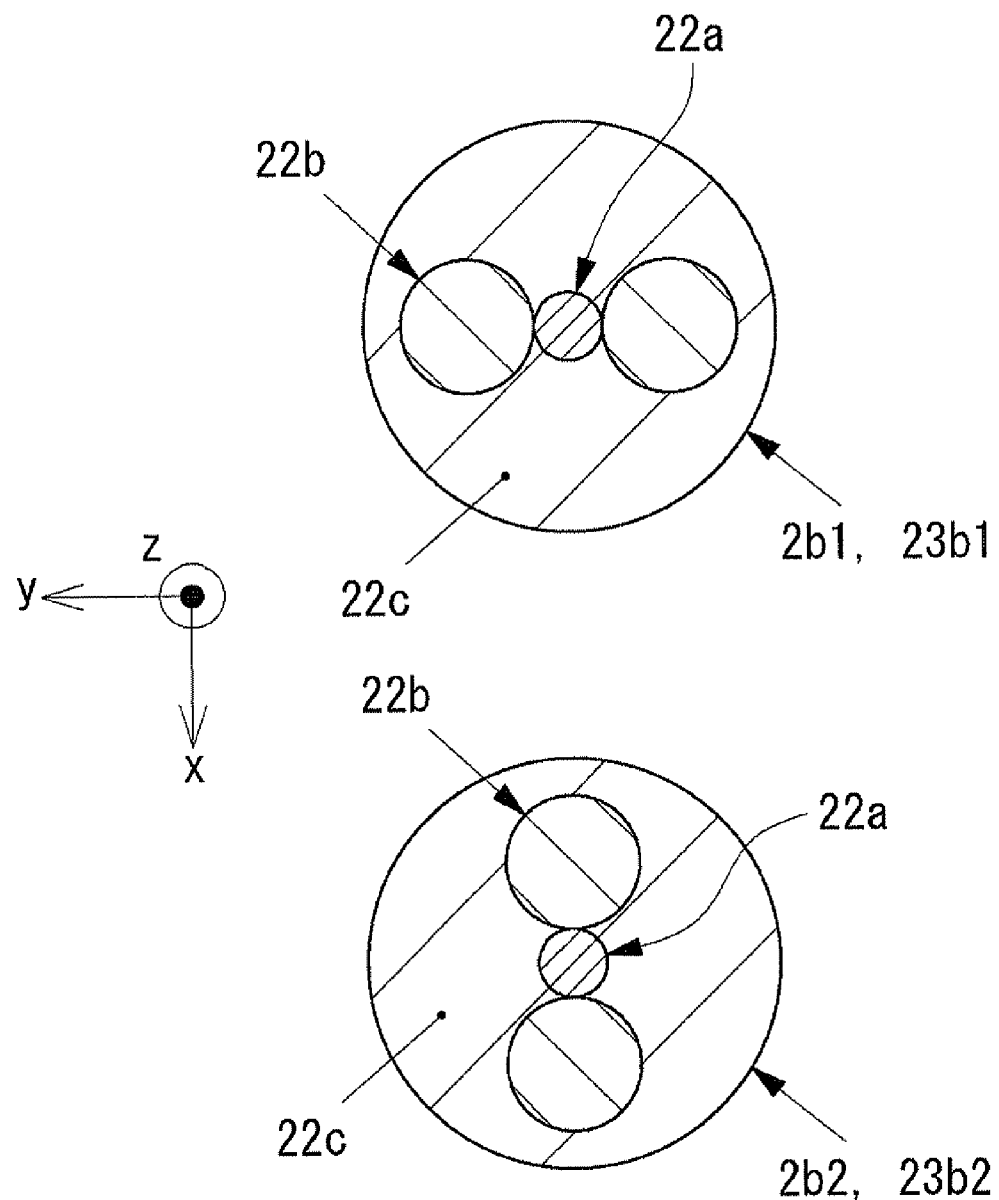
FIG. 22 is a cross-sectional diagram illustrating a light incidence/emission end portion and the other-end-side light incidence/emission end portion of the other optical fiber of the two-core optical fiber magnetic field sensor illustrated in FIG. 16 or FIG. 25 to be described below.

As illustrated in FIG. 22, the polarization plane preserving optical fiber 2b is twisted so that the slow axis in the light incidence/emission portion 2b1 of the polarization plane preserving optical fiber 2b of the two-core optical fiber magnetic field sensor 20 and the slow axis in the other-end-side light incidence/emission end portion 2b2 of the optical fiber birefringence compensation mirror 6 are different by 90 degrees from each other. Since this configuration is made for the convenience of description in the xyz coordinate system described later, in an actual case, this twist may not be contrived. In the optical fiber birefringence compensation mirror 6, when the light beams (two linearly polarized light beams Ff and Fs) are emitted from the other-end-side light incidence/emission end portion 2b2, the phase difference occurs between the two linearly polarized light beams Ff and Fs again.

Next, operations of the optical fiber birefringence compensation mirror 6 will be described. As described above, the light beams (two linearly polarized light beams Ff and Fs) propagating the optical fiber 2b are emitted from the other-end-side light incidence/emission end portion 2b2 with a certain spreading angle and are incident on the birefringent element 7. As described above, since the optical fiber 2b is twisted by 90 degrees, the polarization direction of the linearly polarized light beam denoted by Fs in the two-core optical fiber magnetic field sensor 20 is coincident with the x-axis direction in the optical fiber birefringence compensation mirror 6. Therefore, the light beam transmits through the birefringent element 7 as the abnormal beam, so that the light beam is shifted within the birefringent element 7. Since the polarization component of the one linearly polarized light beam Ff is coincident with the y-axis direction in the optical fiber birefringence compensation mirror 6, the light beam transmits through the birefringent element 7 as the normal beam, so that the light beam transmits without shift within the birefringent element 7.

The two linearly polarized light beams Ff and Fs of the normal beam and the abnormal beam are emitted from the other plane 7b of the birefringent element 7, so that the polarization directions are rotated by 45 degrees in the same direction during the transmission through the magnetic garnet 8.

The two linearly polarized light beams Ff and Fs emitted from the magnetic garnet 8 transmit through the lens 9 and are reflected by the mirror 10 in point symmetry at one point R2 on the surface of the mirror 10 at the side opposite to the incidence angle, so that optical paths of the up and down positions are exchanged in FIG. 18. The two reflected linearly polarized light beams Ff and Fs transmit through the lens 9 again.

In addition, the two linearly polarized light beams Ff and Fs transmit through the magnetic garnet 8 again, so that the polarization directions thereof are further rotated by 45 degrees in the same direction. Among them, the one linearly polarized light beam becomes the abnormal beam within the birefringent element 7, and the other linearly polarized light beam becomes the normal beam within the birefringent element 7.

The two linearly polarized light beams Ff and Fs emitted from the magnetic garnet 8 are incident on the plane 7b of the birefringent element 7 to transmit through the birefringent element 7 again. As described above, within the birefringent element 7, the two linearly polarized light beams Ff and Fs become the normal beam and the abnormal beam, respectively, and only the abnormal beam is shifted. The two linearly-polarized light beams are emitted from the one plane 7a of the birefringent element 7 and are incident on the other-end-side light incidence/emission end portion 2b2 of the other optical fiber 2b. In the other-end-side light incidence/emission end portion 2b2, the linearly polarized light beam Ff is incident in the slow axis, and the linearly polarized light beam Fs is incident in the fast axis. In other words, due to the optical fiber birefringence compensation mirror 6, the light beam which is the slow-axis component in the forward direction is incident in the fast axis in the backward direction. Therefore, in the backward direction, the phase difference between the fast axis component and the slow axis component of the polarization plane preserving optical fiber 2b is to be compensated for. The two linearly polarized light beams Ff and Fs propagate the other optical fiber 2b from the other-end-side light incidence/emission end portion 2b2.

The light beams (two linearly polarized light beams Ff and Fs) which are emitted from the other optical fiber 2b and are incident on the two-core optical fiber magnetic field sensor 20 again transmit through the λ/4 wavelength plate 21, the lens 3, and the magnetic garnet 4 and are reflected by the mirror 5. After the reflection, the light beams transmit through the magnetic garnet 4, the lens 3, and the λ/4 wavelength plate and are incident on the one optical fiber 2a again. As described above, while the circularly-polarized light beams Ff and Fs transmit through the garnet 4 again, the phase difference between two circularly-polarized light beams Ff and Fs is reduced.

The two linearly polarized light beams Ff and Fs which are incident on the optical fiber 2a again propagate the optical fiber 2a, so that the phase difference is compensated for. Therefore, only the phase difference due to the strength and direction of the magnetic field of the magnetic garnet 4 remains. In the cross section of the polarization plane preserving optical fiber 2a, the only phase difference of the current sensor main body (figure) adjacent to the λ/4 wavelength plate 34 exists, the light beam is converted into the linearly polarized light beam corresponding to the phase difference by the λ/4 wavelength plate 34. In other words, the light beam becomes the linearly polarized light beam corresponding to the Faraday rotation angle depending on the strength and direction of the magnetic field of the magnetic garnet 4 and is in the state which is shifted by the above-described rotation angle from the polarization plane in the forward direction (the direction where the light beam propagates the two-core optical fiber magnetic field sensor 1 from the optical bias module 33). After that, the linearly polarized light beams are rotated by 22.5 degrees by the magnetic garnet 24d and are distributed with a ratio of light intensities corresponding to the rotation angle according to the strength and direction of the magnetic field applied to the two-core optical fiber magnetic field sensor 1 by the birefringent element 24a to be received by the optical receivers, so that the magnetic field of the measurement object can be detected.

In this manner, according to the two-core optical fiber magnetic field sensor 20 of the embodiment, since the light beam reciprocates the two-core optical fiber magnetic field sensor 20 which is a magnetic field detection unit twice, a sensor sensitivity (magnetic field detection sensitivity) with respect to the magnetic field of the measurement object can be doubled, so that the magnetic field detection sensitivity of the two-core optical fiber magnetic field sensor 20 can be greatly improved.

In addition, the two-core optical fiber magnetic field sensor 20 is optically connected to the optical fiber birefringence compensation mirror 6, so that a change of the sensed light beam can be suppressed, and a change in a received light amount of the light receiving element due to the birefringence of the optical fiber can be suppressed, a change in the detected value of the magnetic field with respect to the value of the magnetic field can be suppressed, and the vibration resistance can be improved.

In addition, the two-core optical fiber magnetic field sensor 20 is implemented to have a circuit configuration adapted to measurement of a high-frequency magnetic field, so that it is possible to measure the high-frequency magnetic field.

In addition, the two optical fibers 2a and 2b which are the light incidence/emission units 2 of the two-core optical fiber magnetic field sensor 20 are configured with polarization plane preserving optical fibers, so that a change of the sensed light beam can be suppressed, a change in a detected value of the magnetic field with respect to a value of the magnetic field can be suppressed, and the vibration resistance of the two-core optical fiber magnetic field sensor can be further improved even in the case where the vibration is received from the outside.

Figure 19:
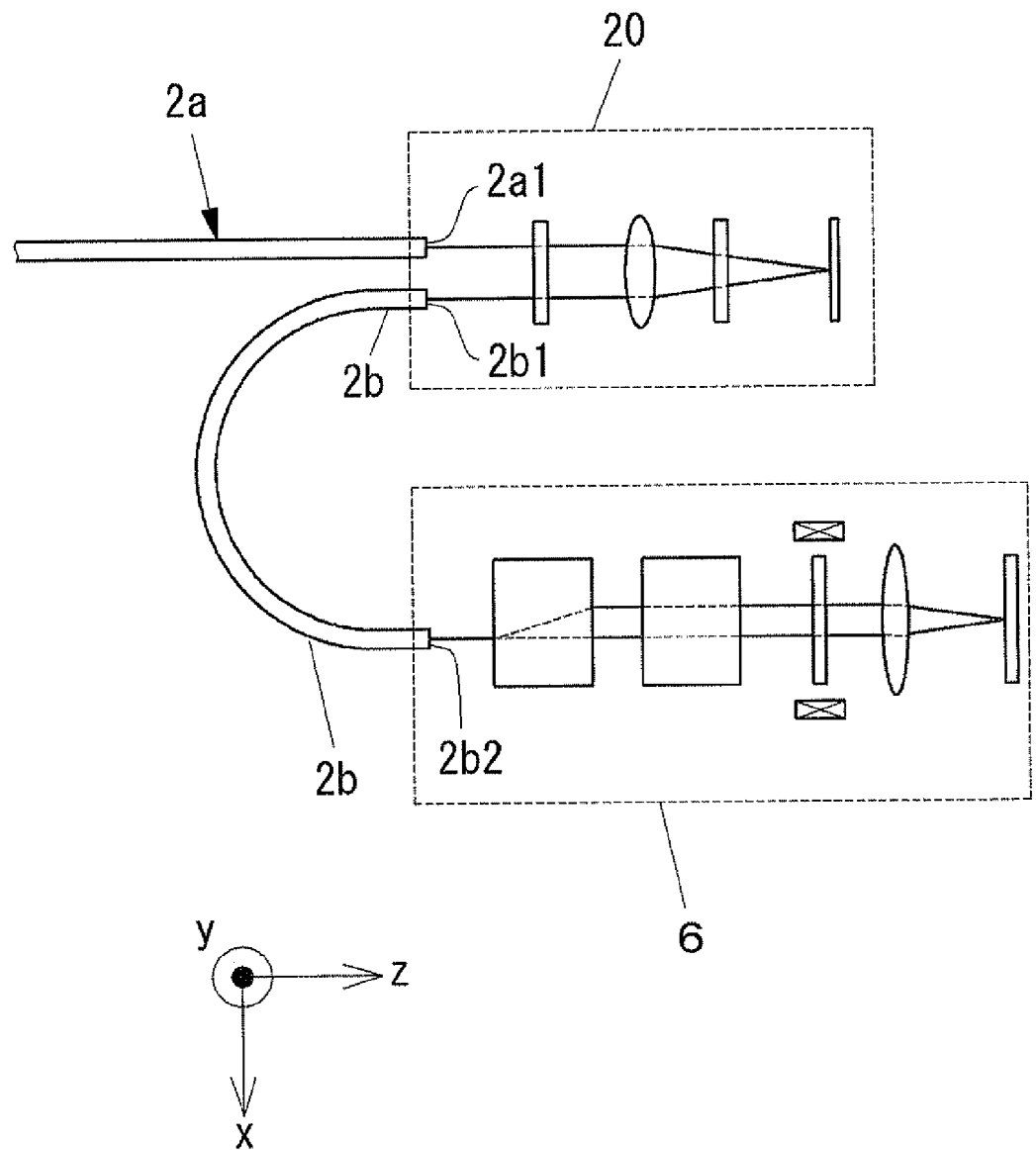
FIG. 19 is a schematic diagram illustrating a configuration of a modified example where an optical fiber birefringence compensation mirror is connected to the two-core optical fiber magnetic field sensor illustrated in FIG. 16.
Figure 23:
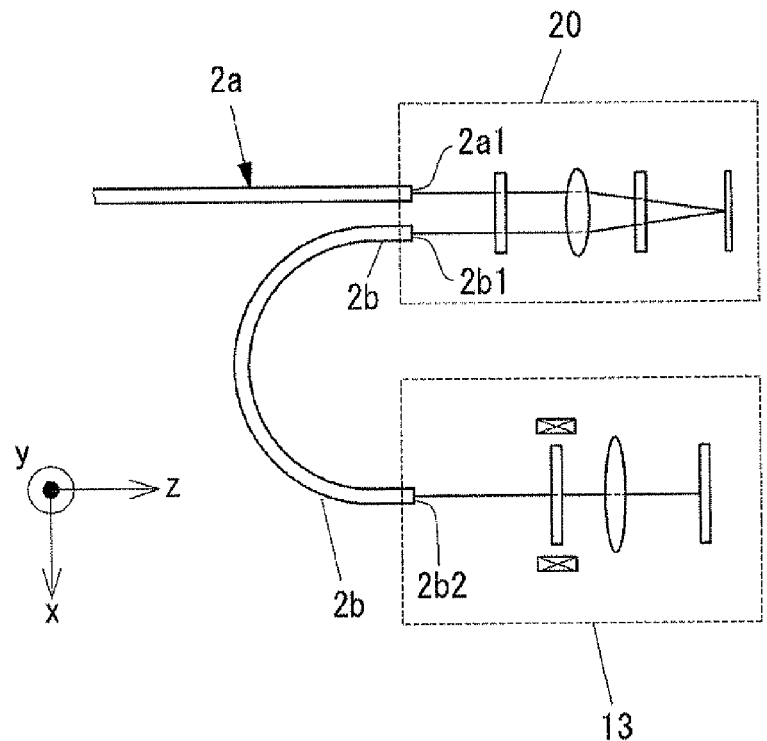
FIG. 23 is a schematic diagram illustrating a configuration where a Faraday mirror is connected to the two-core optical fiber magnetic field sensor illustrated in FIG. 16.

In addition, as a substitute for the optical fiber birefringence compensation mirror 6, the optical fiber birefringence compensation mirror 6 illustrated in FIG. 14 or the Faraday mirror 13 illustrated in FIG. 6 may be optically connected through the other optical fiber 2b to the two-core optical fiber magnetic field sensor 20 (refer to FIG. 19 and FIG. 23, respectively).

Figure 17:
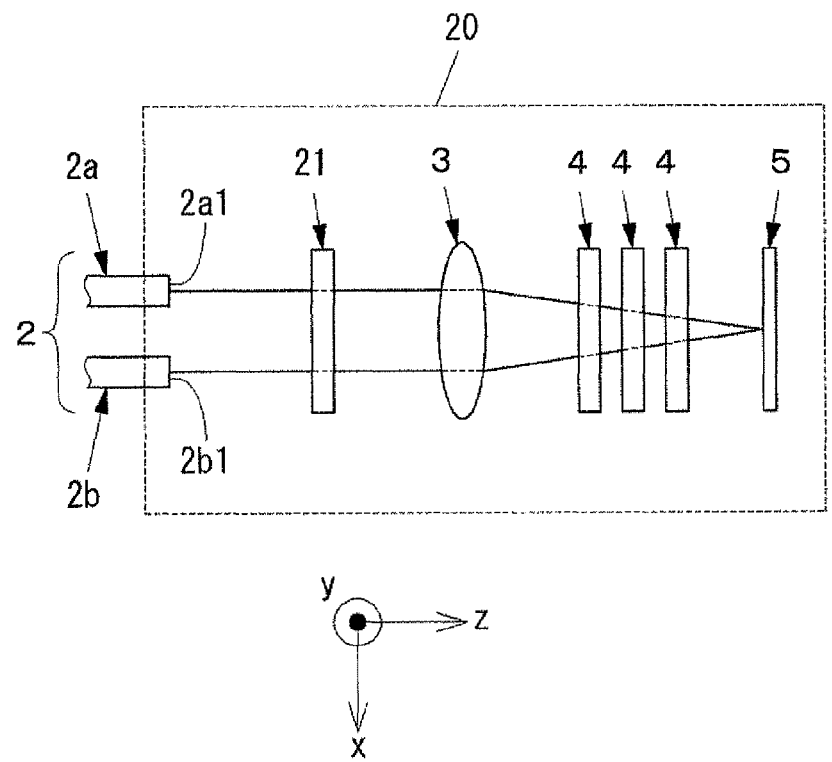
FIG. 17 is a schematic diagram illustrating a configuration according to a modified example of FIG. 16.

In addition, the embodiment can be modified in various forms. For example, although one magnetic garnet 4 is installed in the aspect illustrated FIG. 16, as illustrated in FIG. 17, a plurality of the magnetic garnets 4 having the same composition and the same rotation angle in the same direction may be arranged in the light propagation direction.

<Seventh Embodiment>

Next, a two-core optical fiber magnetic field sensor according to a seventh embodiment of the present invention will be described with reference to FIG. 24. In addition, the same elements as those of the sixth embodiment are denoted by the same reference numerals, and redundant description thereof is not provided.

Figure 24:
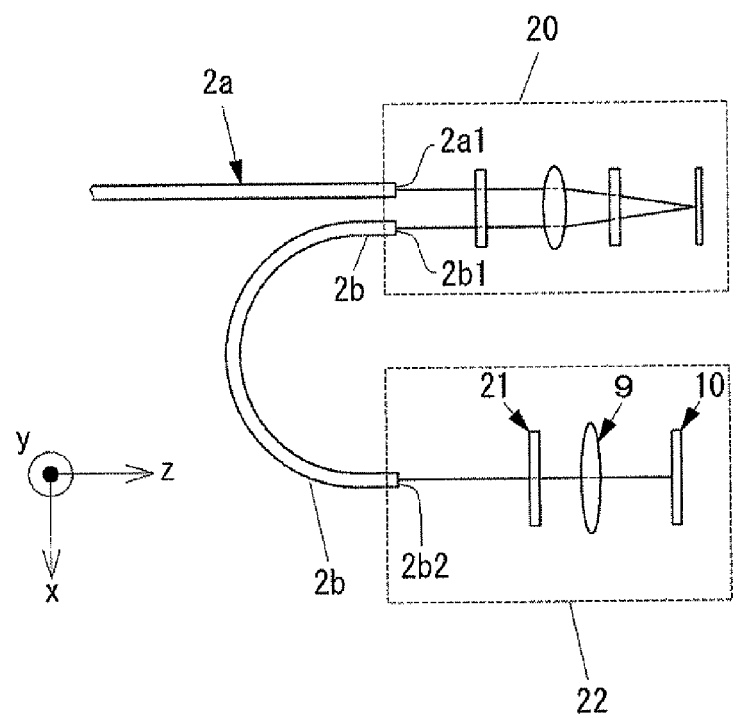
FIG. 24 is a schematic diagram illustrating a configuration according to a seventh embodiment of the present invention.

The two-core optical fiber magnetic field sensor according to the embodiment is different from the above-described sixth embodiment in that, as a substitute for the optical fiber birefringence compensation mirror 6 illustrated in FIG. 18, as illustrated in FIG. 24, a λ/4 wavelength plate mirror 22 is optically connected through the other optical fiber 2b to the two-core optical fiber magnetic field sensor 20.

As illustrated in FIG. 24, the λ/4 wavelength plate mirror 22 is configured to include the other polarization plane preserving optical fiber 2b, the λ/4 wavelength plate 21, one lens 9, and the mirror 10 which is a reflector. The other-end-side light incidence/emission end portion 2b2 of the optical fiber 2b is arranged to face the one plane of the λ/4 wavelength plate 21, and the lens 9 is arranged between the λ/4 wavelength plate 21 and the mirror 10.

As described in the sixth embodiment, the two linearly polarized light beams Ff and Fs propagate the other optical fiber 2b from the two-core optical fiber magnetic field sensor 20 and are emitted from the other-end-side light incidence/emission end portion 2b2 to transmit through the λ/4 wavelength plate 21, so that the two linearly polarized light beams Ff and Fs are converted into the circularly-polarized light beams Ff and Fs of which the rotation direction of the distal ends of the electric vectors are different from each other.

The light beams (two circularly-polarized light beams Ff and Fs) are incident on the lens 9 to be condensed. The light beams transmit through the lens 9 and are reflected on the surface of the mirror 10. The two circularly-polarized light beams Ff and Fs reflected by the mirror 10 transmit through the lens 9 again and transmit through the λ/4 wavelength plate 21, so that the two circularly-polarized light beams Ff and Fs are converted into the two linearly polarized light beams Ff and Fs of which the vibration directions of the electric vectors are different by 90 degrees from each other. The two linearly polarized light beams Ff and Fs are incident on the other optical fiber 2b to be incident on the two-core optical fiber magnetic field sensor 20 again.

According to the configuration hereinbefore, in the embodiment, it is possible to obtain the same effects as those of the sixth embodiment.

<Eighth Embodiment>

Next, a two-core optical fiber magnetic field sensor according to an eighth embodiment of the present invention will be described with reference to FIGS. 25 to 29. In addition, the same elements as those of the sixth or seventh embodiment are denoted by the same reference numerals, and redundant description thereof is not provided.

The two-core optical fiber magnetic field sensor according to the embodiment is different from the above-described embodiments in that a plurality (two in FIGS. 25 to 29) of the two-core optical fiber magnetic field sensors 20 and 23 are installed with respect to the magnetic field of the measurement object and the other optical fiber 2b of the front stage two-core optical fiber magnetic field sensor 20 and the one optical fiber 23a of the rear stage two-core optical fiber magnetic field sensor 23 are configured with a common optical fiber.

In addition, the one optical fiber 23a is arranged so that the direction of the slow axis in the light incidence/emission end portion 23a1 is the x-axis direction as illustrated in FIG. 20 and the other optical fiber 23b is arranged so that the direction of the slow axis in the light incidence/emission end portion 23b1 is the y-axis direction as illustrated in FIG. 20. Therefore, the two optical fibers (polarization plane preserving optical fibers) 23a and 23b are arranged so that the directions of the slow axes thereof are different by 90 degrees.

In addition, the optical fiber birefringence compensation mirror 6 is arranged to the other-end-side light incidence/emission end portion 23b2 of the other optical fiber 23b.

As illustrated in FIG. 22, the polarization plane preserving optical fiber 23b is twisted so that the slow axis in the light incidence/emission end portion 23b1 of the polarization plane preserving optical fiber 23b of the two-core optical fiber magnetic field sensor 23 and the slow axis in the other-end-side light incidence/emission end portion 23b2 of the optical fiber birefringence compensation mirror 6 are different by 90 degrees from each other. Since this configuration is made for the convenience of description in the xyz coordinate system described later, in an actual case, this twist may not be contrived.

In addition, in the embodiment, the number of the two-core optical fiber magnetic field sensors may be increased to be n equal to or larger than 2 (n≥2). According to the two-core optical fiber magnetic field sensor of the embodiment, in addition to the effects of the two-core optical fiber magnetic field sensor according to the sixth embodiment, since the light beam is configured to reciprocate the two-core optical fiber magnetic field sensor which is a magnetic field detection unit n times, the sensitivity (magnetic field detection sensitivity) of the sensor with respect to the magnetic field of the measurement object can be increased to be about n times, so that the magnetic field detection sensitivity of the two-core optical fiber magnetic field sensor can be further improved.

In addition, since the optical fibers (in FIGS. 26 to 29, the optical fibers 2a, 2b, 23a, and 23b) are configured with polarization plane preserving optical fibers, although a plurality of the two-core optical fiber magnetic field sensors are installed with respect to the magnetic field of the measurement object, the magnetic field detection can be performed with excellent characteristics of low loss and vibration resistance.

Figure 26:
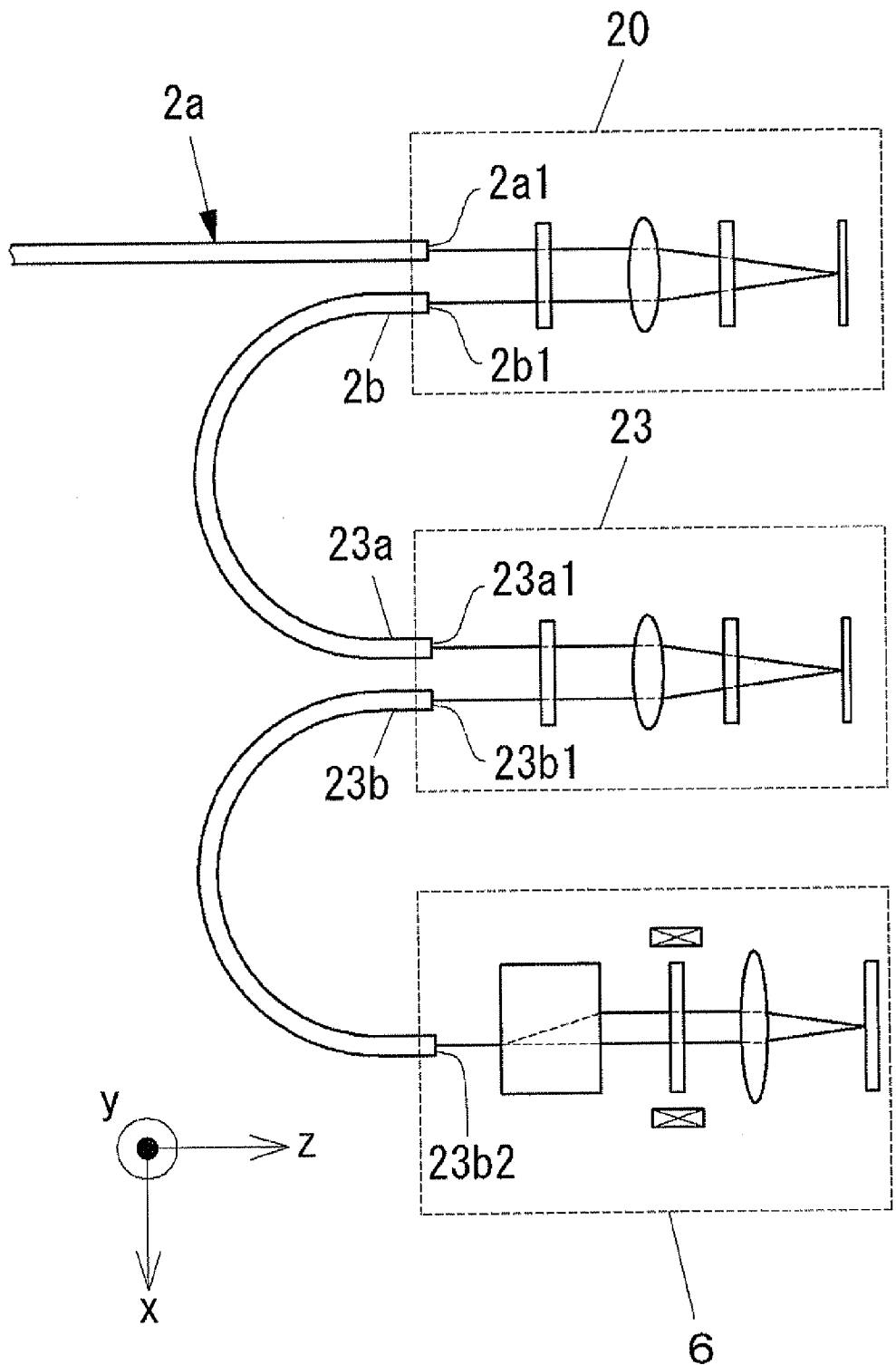
FIG. 26 is a schematic diagram illustrating a configuration where an optical fiber birefringence compensation mirror is connected to the two-core optical fiber magnetic field sensor illustrated in FIG. 25.
Figure 27:
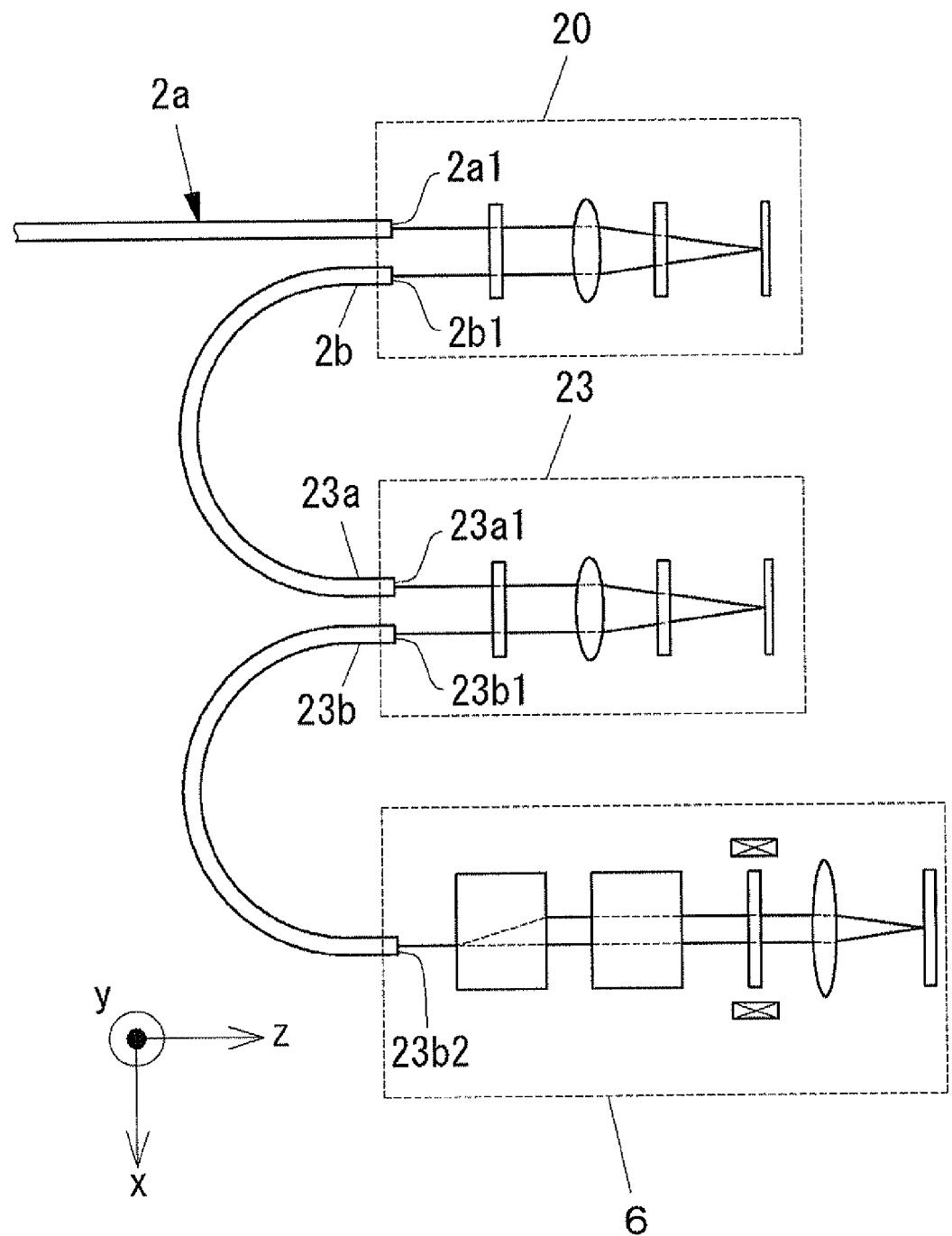
FIG. 27 is a schematic diagram illustrating a configuration of a modified example where an optical fiber birefringence compensation mirror is connected to the two-core optical fiber magnetic field sensor illustrated in FIG. 25.
Figure 28:
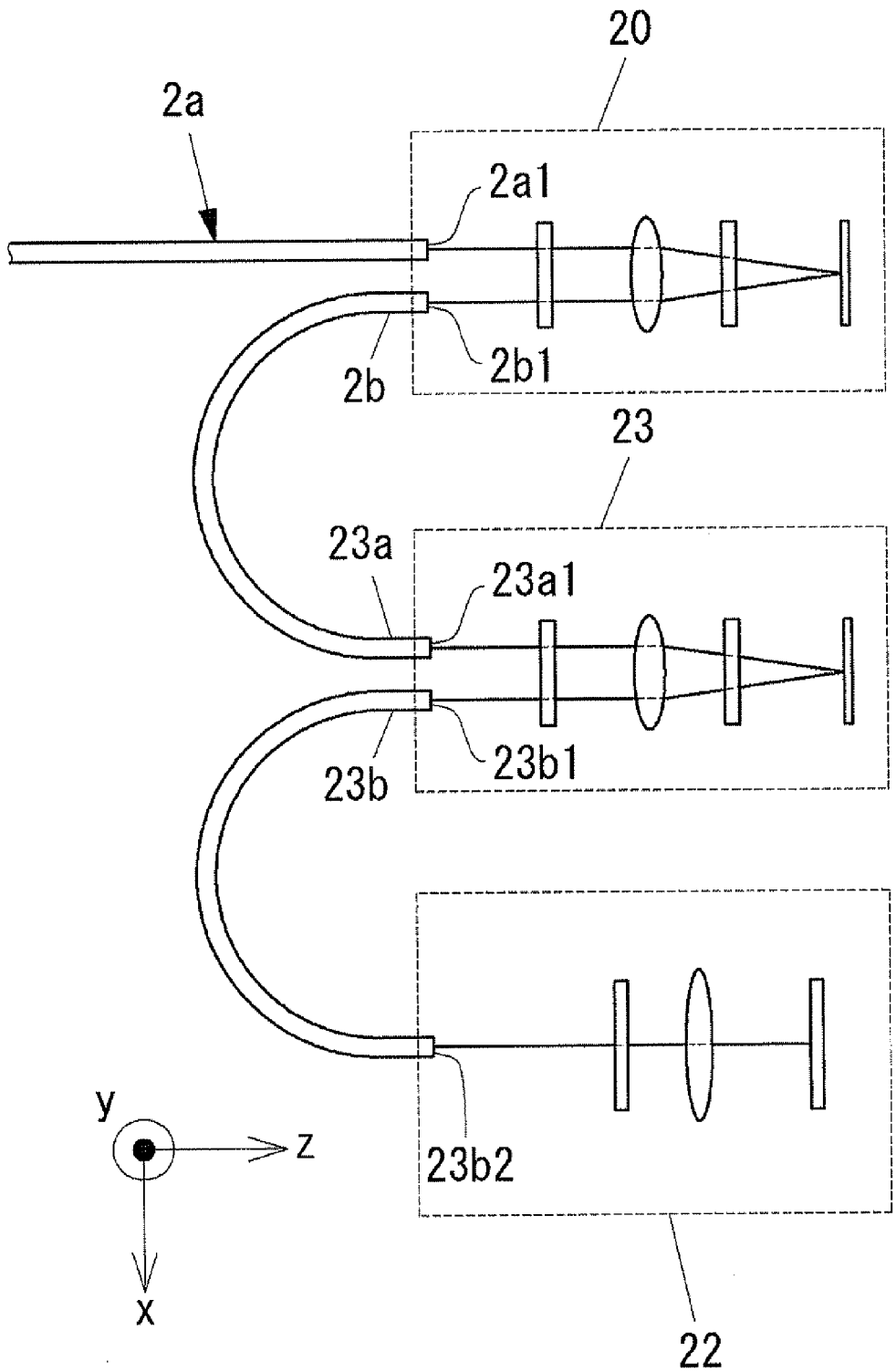
FIG. 28 is a schematic diagram illustrating a configuration where a λ/4 wavelength plate mirror is connected to the two-core optical fiber magnetic field sensor illustrated in FIG. 25.
Figure 29:
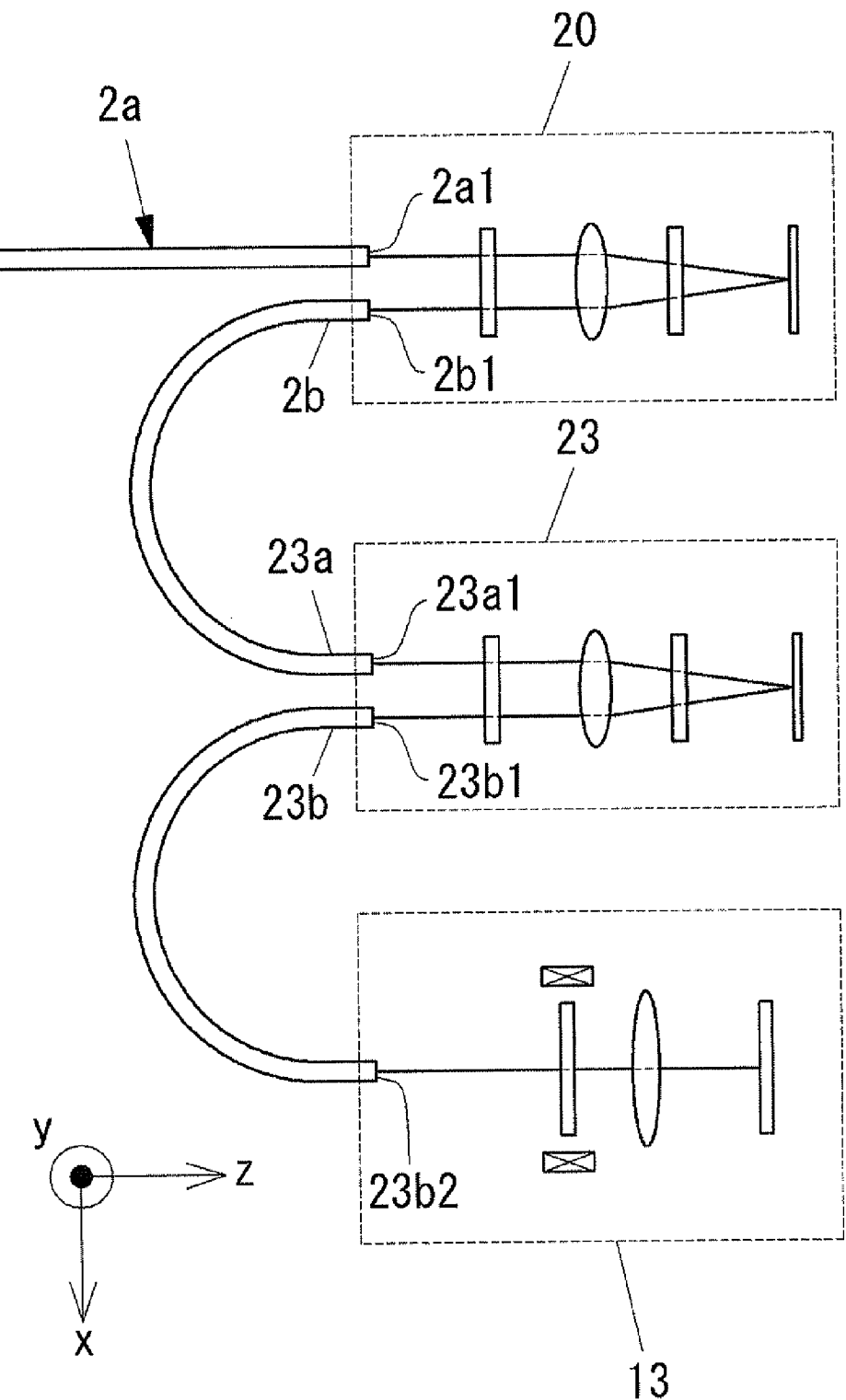
FIG. 29 is a schematic diagram illustrating a configuration where a Faraday mirror is connected to the two-core optical fiber magnetic field sensor illustrated in FIG. 25.

In addition, as a substitute for the optical fiber birefringence compensation mirror 6, the optical fiber birefringence compensation mirror 6 illustrated in FIG. 14, the Faraday mirror 13 illustrated in FIG. 6, or the λ/4 wavelength plate mirror 22 illustrated in FIG. 24 may be optically connected to the other-end-side light incidence/emission end portion 23b2 of the light incidence/emission end portion of the other optical fiber 23b in the last stage two-core optical fiber magnetic field sensor (in FIG. 26, the second stage two-core optical fiber magnetic field sensor 23) (refer to FIGS. 27, 29, and 28, respectively).

Figure 25:
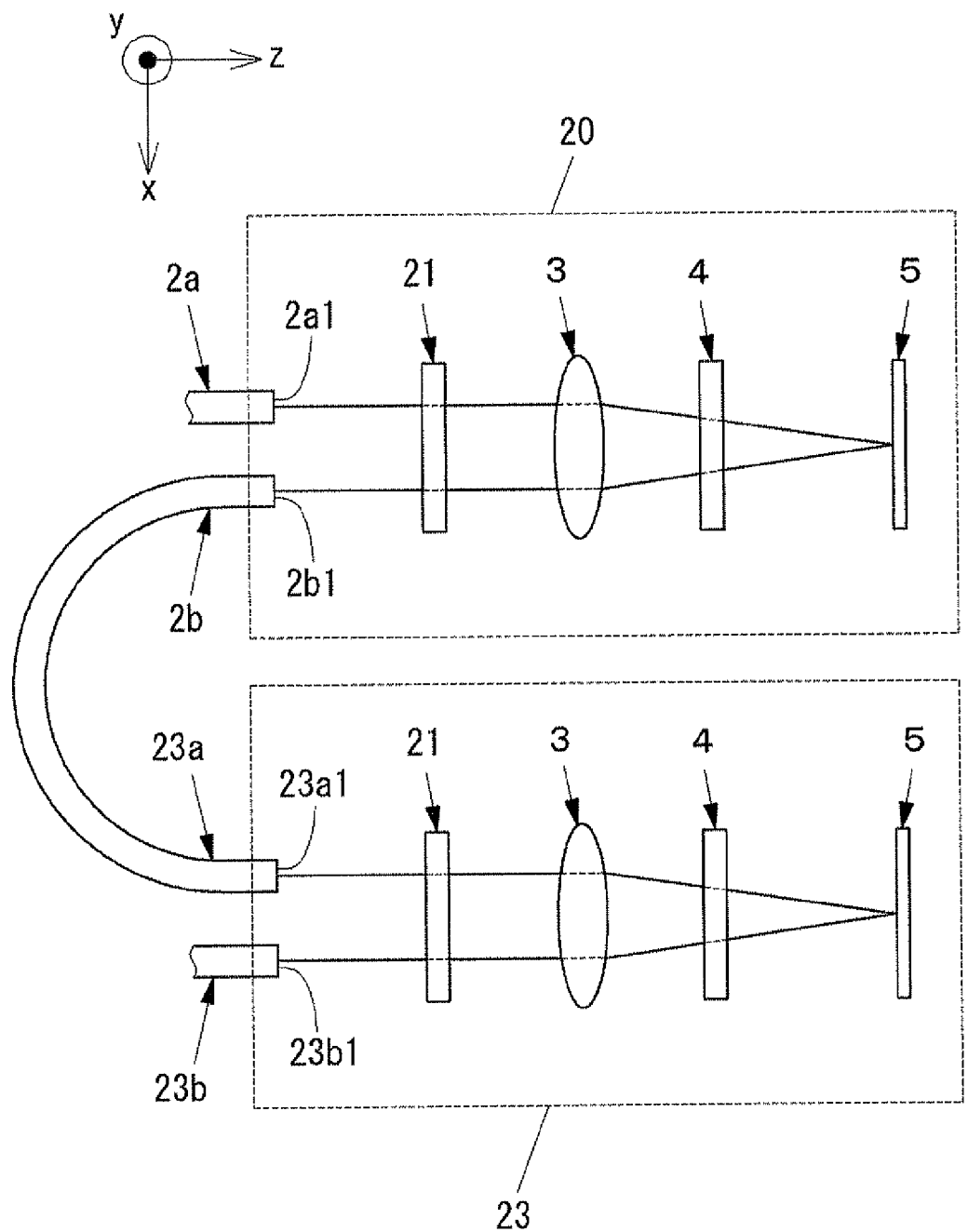
FIG. 25 is a diagram illustrating a configuration of a two-core optical fiber magnetic field sensor according to an eighth embodiment of the present invention.

In addition, in the embodiment illustrated in FIGS. 25 and 26, although one magnetic garnet 4 is configured to be installed, as illustrated in FIG. 17, the above configuration may be modified into a configuration where a plurality of the magnetic garnets 4 having the same composition and the same rotation angle in the same direction are arranged in the light propagation direction.

EXAMPLES 1 to 3

Figure 12:
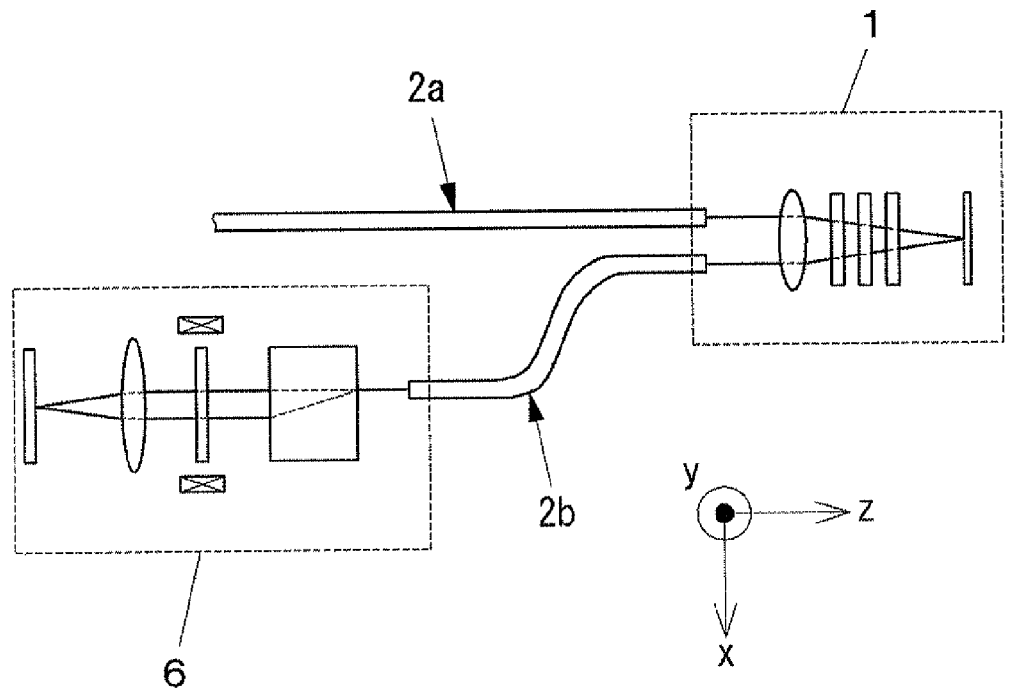
FIG. 12 is a schematic diagram illustrating a configuration of Example 3 of the present invention.

Next, two-core optical fiber magnetic field sensors according to Examples of the present invention will be described with reference to FIGS. 4, 7, and 12. Example 1 is an example of the two-core optical fiber magnetic field sensor using the optical fiber birefringence compensation mirror illustrated in FIG. 4, and Example 2 has a configuration where two two-core optical fiber magnetic field sensors illustrated in FIG. 7 are installed with respect to the magnetic field of the measurement object. In addition, as illustrated in FIG. 12, Example 3 is an example of the two-core optical fiber magnetic field sensor where three magnetic garnets constitute the two-core optical fiber magnetic field sensor 1 and a total rotation angle of the three magnetic garnets are set to 135 degrees. The optical fibers 2a and 2b in each Example (in the case of Example 2, the optical fibers 14a and 14b) are configured with low birefringence optical fibers (LBFs) containing lead oxide. In each Example, the measurement object of the two-core optical fiber magnetic field sensor is set as a power line; a current applied to the power line, a detected current are denoted by an applied current (A) and a displayed current (A), respectively; and a value obtained by dividing the displayed current (A) with the applied current (A) is denoted by a sensitivity (times). The measured results are listed in Table 1. In addition, in Examples, all the applied currents are set to an AC current of 0.5 (A) with 50 Hz.

Figure 30:
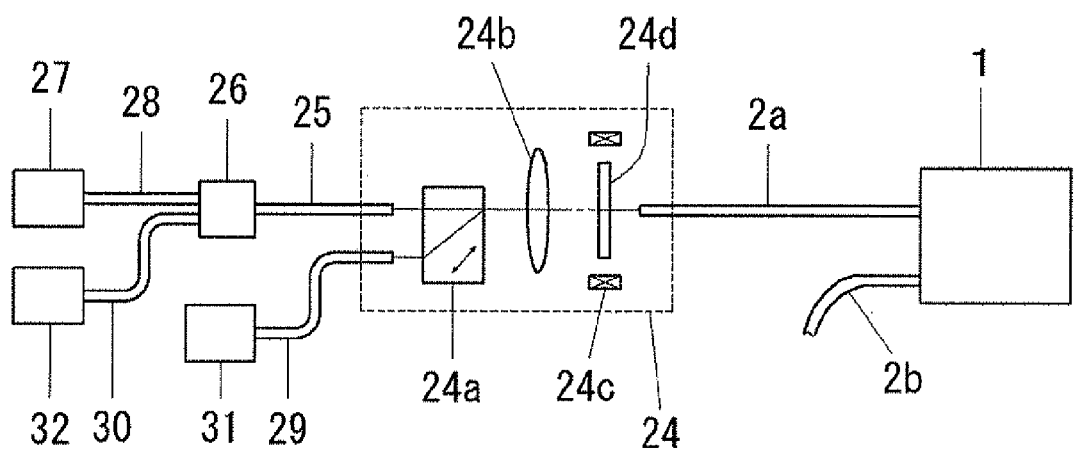
FIG. 30 is a diagram illustrating a configuration of an optical system according to Examples 1 to 3 and Comparative Example.

In addition, an optical bias module 24 illustrated in FIG. 30 is optically connected thereto through the optical fiber 2a. In addition, a polarization depending type optical circulator 26 is optically connected through a polarization plane preserving optical fiber 25 to the optical bias module 24.

The optical bias module 24 is configured to include a birefringent element 24a, a lens 24b, a magnet 24c, and a magnetic garnet 24d. Similarly to the birefringent element 7, the birefringent element 24a is a uniaxial birefringent element having α=47.8 degrees, and rutile is used for the birefringent element 24a. The magnetic garnet 24d is a non-reciprocal polarization plane rotation element, which is configured as a ferromagnetic bismuth substituted garnet having a Faraday rotation angle of 22.5 degrees when it is magnetically saturated by a magnetic field applied from the magnet 24c. The magnet 24c is an Sm—Co series or Nd—Fe—B series permanent magnet which has an outer shape of a ring and is disposed to surround the magnetic garnet 24d.

In addition, an ASE light source 27 having a wavelength band of 1550 nm is optically connected through an optical fiber 28 to the polarization depending type optical circulator 26. Each light beam is divided into two linearly polarized light beams by the optical bias module 24 and the polarization depending type optical circulator 26, and the linearly polarized light beams are detected through optical fibers 29 and 30 by optical power meters (hereinafter, denoted by OPMs) 31 and 32.

TABLE 1

| Sample | Applied Current (A) | Displayed Current (A) | Sensitivity (times) |
|---|---|---|---|
| Example 1 | 0.5 | 160 | 320 |
| Example 2 | 0.5 | 255 | 510 |
| Example 3 | 0.5 | 500 | 1000 |
| Comparative Example | 0.5 | 85 | 170 |

It can be concluded from the result of Table 1, the sensor sensitivity of the two-core optical fiber magnetic field sensor having the configuration of Example 3 is most greatly improved. In addition, it is determined that, the improvement in the sensor sensitivity of Example 2 is small, and the improvement in the sensor sensitivity of Example 1 is smallest. Therefore, it is determined that the configuration of increasing the number of the magnetic garnets in the two-core optical fiber magnetic field sensor 1 is more effective than the configuration of installing a plurality of stages of the two-core optical fiber magnetic field sensors with respect to the measurement object in terms of the improvement in the sensor sensitivity.

COMPARATIVE EXAMPLE

Figure 13:
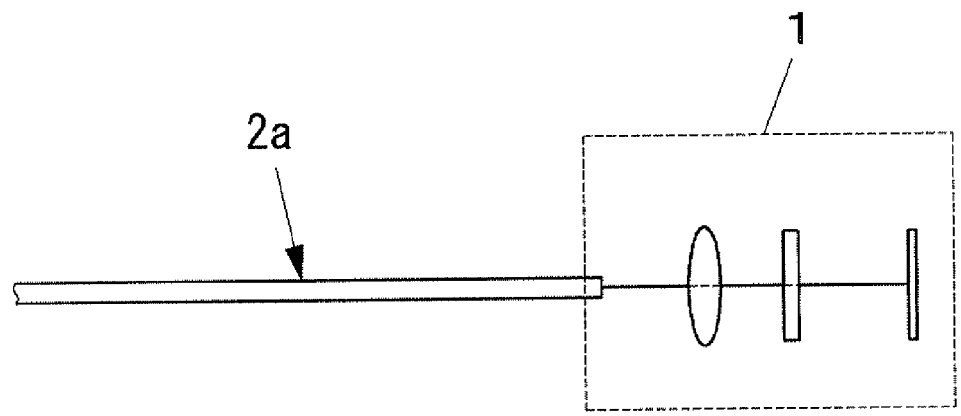
FIG. 13 is a schematic diagram illustrating a configuration of Comparative Example with respect to Example of the present invention.
Figure 13:
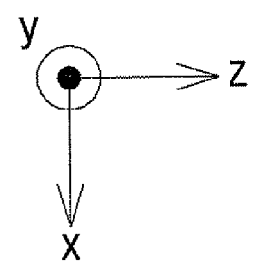

In addition, as Comparative Example, as illustrated in FIG. 13, the optical fiber birefringence compensation mirror 6 and the other optical fiber 2b are removed from the two-core optical fiber magnetic field sensor according to Example 1, and the applied current (A), the displayed current (A), and the sensitivity (times) of the magnetic field sensor having a configuration where the light beam reciprocates the magnetic field sensor 1 which is a magnetic field detection unit one time are measured similarly to Examples 1 to 3. The results are listed in Table 1.

As can be understood from the results of Table 1, if Example 1 is compared with Comparative Example 1, it is understood that the sensor sensitivity according to Example 1 is about twice the sensor sensitivity according to Comparative Example 1. In addition, if Examples 2 and 3 are compared with Comparative Example 1, it is understood that the sensitivities of the sensors according to Examples 2 and 3 are greatly improved.

Industrial Applicability

A two-core optical fiber magnetic field sensor according to the present invention can be used to measure a magnetic field for design of a substrate circuit of a wireless mobile phone or for highly-accurate estimation and design of both amplitude and phase of a current distribution on an antenna device or a case substrate.

The invention claimed is:

1. A two-core optical fiber magnetic field sensor at least comprising:
a light incidence/emission unit;
a lens;
a magnetic garnet; and
a reflector,
wherein the lens and the magnetic garnet are arranged between a light incidence/emission end portion of the light incidence/emission unit and the reflector,
the light incidence/emission unit is configured to include two single mode optical fibers,
a light beam emitted from one of the two single mode optical fibers transmits through the lens and the magnetic garnet and is reflected by the reflector, and after the reflection, the light beam transmits through the magnetic garnet and the lens again and is incident on the other optical fiber of the two single mode optical fibers,
other reflector is arranged to the other-end side light incidence/emission end portion of the light incidence/emission end portion of the other optical fiber,
the light beam emitted from the other-end side light incidence/emission end portion of the other optical fiber is reflected by the other reflector, and after the reflection, the light beam is incident on the other-end side light incidence/emission end portion of the other optical fiber again, and
the light beam is emitted from the light incidence/emission end portion of the other optical fiber again and transmits through the lens and the magnetic garnet and is reflected by the reflector, and after the reflection, the light beam transmits through the magnetic garnet and the lens again and is incident on the one optical fiber again.

2. The two-core optical fiber magnetic field sensor according to claim 1, wherein a plurality of the magnetic garnets are installed.

3. The two-core optical fiber magnetic field sensor according to claim 1,
wherein
both of the two optical fibers contain lead oxide.

4. The two-core optical fiber magnetic field sensor according to claim 1,
wherein an optical fiber birefringence compensation mirror is arranged to the other-end-side light incidence/emission end portion of the other optical fiber,
the optical fiber birefringence compensation mirror includes the other optical fiber, a birefringent element, a magnetic garnet which has a rotation angle of 45 degrees during magnetic saturation, a magnet which magnetically saturates the magnetic garnet, a lens, and a reflector,
the birefringent element has two planes which are parallel to each other,
the other-end-side light incidence/emission end portion of the other optical fiber is arranged to face the one plane of the birefringent element,
the magnetic garnet and the lens are arranged between the birefringent element and the reflector,
the light beam is emitted from the other-end-side light incidence/emission end portion of the other optical fiber,
the light beam is divided into linearly polarized light beams of a normal beam and an abnormal beam by the birefringent element,
the two linearly polarized light beams of the normal beam and the abnormal beam emitted from the birefringent element transmit through the magnetic garnet, so that the polarization directions thereof are rotated by 45 degrees in the same direction,
the two linearly polarized light beams transmit through the lens and are reflected in point symmetry at one point on a surface of the reflector,
the two reflected linearly polarized light beams transmit through the magnetic garnet again, so that the polarization directions thereof are further rotated by 45 degrees in the same direction,
when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission,
the two linearly polarized light beams are recombined as one light beam, and
the recombined light beam is incident on the other optical fiber.

5. The two-core optical fiber magnetic field sensor according to claim 1,
wherein an optical fiber birefringence compensation mirror is arranged to the other-end-side light incidence/emission end portion of the other optical fiber,
the optical fiber birefringence compensation mirror includes the other optical fiber, a first birefringent element, a second birefringent element, a magnetic garnet which has a rotation angle of 45 degrees during magnetic saturation, a magnet which magnetically saturates the magnetic garnet, a lens, and a reflector,
each of the first birefringent element and the second birefringent element has two planes which are parallel to each other,
the other-end-side light incidence/emission end portion of the other optical fiber is arranged to face the one plane of the first birefringent element,
the second birefringent element is arranged so that the other plane of the first birefringent element and the one plane of the second birefringent element face each other,
a direction of a crystal axis on an optical plane of the second birefringent element is set to be different by 90 degrees from a direction of a crystal axis on an optical plane of the first birefringent element,
the magnetic garnet and the lens are arranged between the second birefringent element and the reflector, the light beam is emitted from the other-end-side light incidence/emission end portion of the other optical fiber, the light beam is divided into linearly polarized light beams of a normal beam and an abnormal beam by the first birefringent element, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, a shifted amount of the abnormal beam during the transmission through the first birefringent element and a shifted amount of the abnormal beam during the transmission through the second birefringent element are set to be equal to each other, the two linearly polarized light beams of the normal beam and the abnormal beam emitted from the second birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, in the case where the two linearly polarized light beams transmit through the second birefringent element again, only the one linearly polarized light beam is shifted, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, the two linearly polarized light beams are incident on the first birefringent element again, so that the two linearly polarized light beams are recombined as one light beam, and the recombined light beam is incident on the other optical fiber.

6. The two-core optical fiber magnetic field sensor according to claim 1, wherein a Faraday mirror is arranged to the other-end-side light incidence/emission end portion of the other optical fiber, the Faraday mirror includes the other optical fiber, a magnetic garnet which has a rotation angle of 45 degrees during magnetic saturation, a magnet which magnetically saturates the magnetic garnet, a lens, and a reflector, the other-end-side light incidence/emission end portion of the other optical fiber is arranged to face the one plane of the magnetic garnet, the lens is arranged between the magnetic garnet and the reflector, the light beam is emitted from the other-end-side light incidence/emission end portion of the other optical fiber, the light beam transmits through the magnetic garnet, so that the polarization direction thereof is rotated by 45 degrees, and the light beam transmits through the lens and is reflected in point symmetry at one point on a surface of the reflector, the reflected light beam transmits through the magnetic garnet again, so that the polarization direction is further rotated by 45 degrees, and the light beam is incident on the other optical fiber.

7. A two-core optical fiber magnetic field sensor where two or more two-core optical fiber magnetic field sensors according to claim 1, are installed with respect to a magnetic field of a measurement object.

8. The two-core optical fiber magnetic field sensor according to claim 7, wherein one reflector is arranged to the other-end-side light incidence/emission end portion of the light incidence/emission end portions of a pair of optical fibers including the other optical fiber of the front stage two-core optical fiber magnetic field sensor and the one optical fiber of the rear stage two-core optical fiber magnetic field sensor.

9. The two-core optical fiber magnetic field sensor according to claim 7, wherein the other optical fiber of the front stage two-core optical fiber magnetic field sensor and the one optical fiber of the rear stage two-core optical fiber magnetic field sensor are a common optical fiber.

10. The two-core optical fiber magnetic field sensor according to any one of claim 7, wherein one reflector is arranged to the other-end-side light incidence/emission end portion of the light incidence/emission end portion of the other optical fiber of the last stage two-core optical fiber magnetic field sensor, and all the optical fibers are low birefringence optical fibers containing lead oxide.

11. The two-core optical fiber magnetic field sensor according to claim 7, wherein an optical fiber birefringence compensation mirror is arranged to the other-end-side light incidence/emission end portion of the other optical fiber in the last stage two-core optical fiber magnetic field sensor, the optical fiber birefringence compensation mirror includes the other optical fiber, a birefringent element, a magnetic garnet which has a rotation angle of 45 degrees during magnetic saturation, a magnet which magnetically saturates the magnetic garnet, a lens, and a reflector, the birefringent element has two planes which are parallel to each other, the other-end-side light incidence/emission end portion of the other optical fiber is arranged to face the one plane of the birefringent element, the magnetic garnet and the lens are arranged between the birefringent element and the reflector, the light beam is emitted from the other-end-side light incidence/emission end portion of the other optical fiber, the light beam is divided into linearly polarized light beams of a normal beam and an abnormal beam by the birefringent element, the two linearly polarized light beams of the normal beam and the abnormal beam emitted from the birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, the two linearly polarized light beams are recombined as one light beam, and the recombined light beam is incident on the other optical fiber.

12. The two-core optical fiber magnetic field sensor according to claim 7, wherein an optical fiber birefringence compensation mirror is arranged to the other-end-side light incidence/emission end portion of the other optical fiber in the last stage two-core optical fiber magnetic field sensor, the optical fiber birefringence compensation mirror includes the other optical fiber, a first birefringent element, a second birefringent element, a magnetic garnet which has a rotation angle of 45 degrees during magnetic saturation, a magnet which magnetically saturates the magnetic garnet, a lens, and a reflector, each of the first birefringent element and the second birefringent element has two planes which are parallel to each other, the other-end-side light incidence/emission end portion of the other optical fiber is arranged to face the one plane of the first birefringent element, the second birefringent element is arranged so that the other plane of the first birefringent element and the one plane of the second birefringent element face each other, a direction of a crystal axis on an optical plane of the second birefringent element is set to be different by 90 degrees from a direction of a crystal axis on an optical plane of the first birefringent element, the magnetic garnet and the lens are arranged between the second birefringent element and the reflector, the light beam is emitted from the other-end-side light incidence/emission end portion of the other optical fiber, the light beam is divided into linearly polarized light beams of a normal beam and an abnormal beam by the first birefringent element, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, a shifted amount of the abnormal beam during the transmission through the first birefringent element and a shifted amount of the abnormal beam during the transmission through the second birefringent element are set to be equal to each other, the two linearly polarized light beams of the normal beam and the abnormal beam emitted from the second birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, in the case where the two linearly polarized light beams transmit through the second birefringent element again, only the one linearly polarized light beam is shifted, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, the two linearly polarized light beams are incident on the first birefringent element again, so that the two linearly polarized light beams are recombined as one light beam, and the recombined light beam is incident on the other optical fiber.

13. The two-core optical fiber magnetic field sensor according to claim 7, wherein a Faraday mirror is arranged to the other-end-side light incidence/emission end portion of the other optical fiber of the last stage two-core optical fiber magnetic field sensor, the Faraday mirror includes the other optical fiber, a magnetic garnet which has a rotation angle of 45 degrees during magnetic saturation, a magnet which magnetically saturates the magnetic garnet, a lens, and a reflector, the other-end-side light incidence/emission end portion of the other optical fiber is arranged to face the one plane of the magnetic garnet, the lens is arranged between the magnetic garnet and the reflector, the light beam is emitted from the other-end-side light incidence/emission end portion of the other optical fiber, the light beam transmits through the magnetic garnet, so that the polarization direction thereof is rotated by 45 degrees, and the light beam transmits through the lens and is reflected in point symmetry at one point on a surface of the reflector, the reflected light beam transmits through the magnetic garnet again, so that the polarization direction is further rotated by 45 degrees, and the light beam is incident on the other optical fiber.

14. A two-core optical fiber magnetic field sensor at least comprising:

a light incidence/emission unit;

a lens;

a magnetic garnet;

a reflector;

a $\lambda/4$ wavelength plate ($\lambda$: a wavelength of a light beam which is incident on the two-core optical fiber magnetic field sensor), wherein the lens, the magnetic garnet, and the $\lambda/4$ wavelength plate are arranged between the light incidence/emission end portion of the light incidence/emission unit and the reflector, the light incidence/emission unit is configured to include two polarization plane preserving optical fibers, and the two polarization plane preserving optical fibers are arranged so that directions of slow axes of the two polarization plane preserving optical fibers are different by 90 degrees from each other, the λ/4 wavelength plate is arranged so that a direction of a crystal axis of the λ/4 wavelength plate is different by 45 degrees from the direction of the slow axis of any one of polarization plane preserving optical fibers, a light beam which is emitted from the one polarization plane preserving optical fiber transmits through the λ/4 wavelength plate, the lens, and the magnetic garnet and is reflected by the reflector, and after the reflection, the light beam transmits through the magnetic garnet, the lens, and the λ/4 wavelength plate again and is incident on the other polarization plane preserving optical fiber, and the light beam which is emitted from the other polarization plane preserving optical fiber transmits through the λ/4 wavelength plate, the lens, and the magnetic garnet and is reflected by the reflector again, and after the reflection, the light beam transmits through the magnetic garnet, the lens, and the λ/4 wavelength plate again and is incident on the one polarization plane preserving optical fiber again.

15. The two-core optical fiber magnetic field sensor according to claim 14, wherein a plurality of the magnetic garnets are installed.

16. The two-core optical fiber magnetic field sensor according to claim 14, wherein an optical fiber birefringence compensation mirror is arranged to the other-end-side light incidence/emission end portion of the other polarization plane preserving optical fiber, the optical fiber birefringence compensation mirror includes the other polarization plane preserving optical fiber, a birefringent element, a magnetic garnet which has a rotation angle of 45 degrees during magnetic saturation, a magnet which magnetically saturates the magnetic garnet, a lens, and a reflector, the birefringent element has two planes which are parallel to each other, the other-end-side light incidence/emission end portion of the other polarization plane preserving optical fiber is arranged to face the one plane of the birefringent element, the magnetic garnet and the lens are arranged between the birefringent element and the reflector, the light beam is emitted from the other-end-side light incidence/emission end portion of the other polarization plane preserving optical fiber, the light beam transmits through the birefringent element as two linearly polarized light beams of a normal beam and an abnormal beam, the two linearly polarized light beams of the normal beam and the abnormal beam emitted from the birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, and the two linearly polarized light beams which transmit through the birefringent element are incident on the other polarization plane preserving optical fiber.

17. The two-core optical fiber magnetic field sensor according to claim 14, wherein an optical fiber birefringence compensation mirror is arranged to the other-end-side light incidence/emission end portion of the other polarization plane preserving optical fiber, the optical fiber birefringence compensation mirror includes the other polarization plane preserving optical fiber, a first birefringent element, a second birefringent element, a magnetic garnet which has a rotation angle of 45 degrees during magnetic saturation, a magnet which magnetically saturates the magnetic garnet, a lens, and a reflector, each of the first birefringent element and the second birefringent element has two planes which are parallel to each other, the other-end-side light incidence/emission end portion of the other polarization plane preserving optical fiber is arranged to face the one plane of the first birefringent element, the second birefringent element is arranged so that the other plane of the first birefringent element and the one plane of the second birefringent element face each other, a direction of a crystal axis on an optical plane of the second birefringent element is set to be different by 90 degrees from a direction of a crystal axis on an optical plane of the first birefringent element, the magnetic garnet and the lens are arranged between the second birefringent element and the reflector, the light beam is emitted from the other-end-side light incidence/emission end portion of the other polarization plane preserving optical fiber, the light beam transmits through the first birefringent element as the two linearly polarized light beams of a normal beam and an abnormal beam, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, a shifted amount of the abnormal beam during the transmission through the first birefringent element and a shifted amount of the abnormal beam during the transmission through the second birefringent element are set to be equal to each other, the two linearly polarized light beams of the normal beam and the abnormal beam emitted from the second birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, in the case where the two linearly polarized light beams transmit through the second birefringent element again, only the one linearly polarized light beam is shifted, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, and the two linearly polarized light beams which transmit through the first birefringent element are incident on the other polarization plane preserving optical fiber.

18. The two-core optical fiber magnetic field sensor according to claim 14, wherein a Faraday mirror is arranged to the other-end-side light incidence/emission end portion of the other polarization plane preserving optical fiber, the Faraday mirror includes the other polarization plane preserving optical fiber, a magnetic garnet which has a rotation angle of 45 degrees during magnetic saturation, a magnet which magnetically saturates the magnetic garnet, a lens, and a reflector, the other-end-side light incidence/emission end portion of the other polarization plane preserving optical fiber is arranged to face the one plane of the magnetic garnet, the lens is arranged between the magnetic garnet and the reflector, the light beam is emitted from the other-end-side light incidence/emission end portion of the other polarization plane preserving optical fiber, the light beam transmits through the magnetic garnet, so that the polarization direction thereof is rotated by 45 degrees, and the light beam transmits through the lens and is reflected in point symmetry at one point on a surface of the reflector, the reflected light beam transmits through the magnetic garnet again, so that the polarization direction is further rotated by 45 degrees, and the light beam is incident on the other polarization plane preserving optical fiber.

19. The two-core optical fiber magnetic field sensor according to claim 14, wherein a $\lambda/4$ wavelength plate mirror is arranged to the other-end-side light incidence/emission end portion of the other polarization plane preserving optical fiber, the $\lambda/4$ wavelength plate mirror includes the other polarization plane preserving optical fiber, a $\lambda/4$ wavelength plate ($\lambda$: a wavelength of a light beam incident on the $\lambda/4$ wavelength plate mirror), a lens, and a reflector, the other-end-side light incidence/emission end portion of the other polarization plane preserving optical fiber is arranged to face the one plane of the $\lambda/4$ wavelength plate, the lens is arranged between the $\lambda/4$ wavelength plate and the reflector, the light beam is emitted from the other-end-side light incidence/emission end portion of the other polarization plane preserving optical fiber, the light beam transmits through the $\lambda/4$ wavelength plate, so that the light beam is converted into circularly-polarized light beams of which rotation directions of distal ends of electric vectors are different from each other, the two circularly-polarized light beams transmit through the lens and are reflected on a surface of the reflector, the two reflected circularly-polarized light beams transmit through the $\lambda/4$ wavelength plate again, so that the two circularly-polarized light beams are converted into two linearly polarized light beams of which vibration directions of electric vectors are different by 90 degrees from each other, and the two linearly polarized light beams are incident on the other polarization plane preserving optical fiber.

20. A two-core optical fiber magnetic field sensor where two or more two-core optical fiber magnetic field sensors according to claim 14, are installed with respect to a magnetic field of a measurement object, wherein the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, an optical fiber birefringence compensation mirror is arranged to the other-end-side light incidence/emission end portion of the other polarization plane preserving optical fiber of the last stage two-core optical fiber magnetic field sensor, the optical fiber birefringence compensation mirror includes the other polarization plane preserving optical fiber of the last stage two-core optical fiber magnetic field sensor, a birefringent element, a magnetic garnet which has a rotation angle of 45 degrees during magnetic saturation, a magnet which magnetically saturates the magnetic garnet, a lens, and a reflector, the birefringent element has two planes which are parallel to each other, the other-end-side light incidence/emission end portion of the other polarization plane preserving optical fiber of the last stage two-core optical fiber magnetic field sensor is arranged to face the one plane of the birefringent element, the magnetic garnet and the lens are arranged between the birefringent element and the reflector, a light beam is emitted from the other-end-side light incidence/emission end portion of the other polarization plane preserving optical fiber of the last stage two-core optical fiber magnetic field sensor, the light beam transmit through the birefringent element as two linearly polarized light beams of a normal beam and an abnormal beam, the two linearly polarized light beams of the normal beam and the abnormal beam emitted from the birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, when the two linearly polarized light beams are incident on the birefringent element again and re-transmit through the birefringent element, the linearly polarized light beam which transmits through the birefringent element as the normal beam during the first transmission of the light beam through the birefringent element transmits through the birefringent element as the abnormal beam during the re-transmission, and the linearly polarized light beam which transmits through the birefringent element as the abnormal beam during the first transmission of the light beam through the birefringent element transmits through the birefringent element as the normal beam during the re-transmission, and the two linearly polarized light beams which transmit through the birefringent element are incident on the other polarization plane preserving optical fiber of the last stage two-core optical fiber magnetic field sensor.

21. A two-core optical fiber magnetic field sensor where two or more two-core optical fiber magnetic field sensors according to claim 14 are installed with respect to a magnetic field of a measurement object, wherein the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, an optical fiber birefringence compensation mirror is arranged to the other-end-side light incidence/emission end portion of the other polarization plane preserving optical fiber of the last stage two-core optical fiber magnetic field sensor, the optical fiber birefringence compensation mirror includes the other polarization plane preserving optical fiber of the last stage two-core optical fiber magnetic field sensor, a first birefringent element, a second birefringent element, a magnetic garnet which has a rotation angle of 45 degrees during magnetic saturation, a magnet which magnetically saturates the magnetic garnet, a lens, and a reflector, each of the first birefringent element and the second birefringent element has two planes which are parallel to each other, the other-end-side light incidence/emission end portion of the other polarization plane preserving optical fiber of the last stage two-core optical fiber magnetic field sensor is arranged to face the one plane of the first birefringent element, the second birefringent element is arranged so that the other plane of the first birefringent element and the one plane of the second birefringent element face each other, a direction of a crystal axis on an optical plane of the second birefringent element is set to be different by 90 degrees from a direction of a crystal axis on an optical plane of the first birefringent element, the magnetic garnet and the lens are arranged between the second birefringent element and the reflector, a light beam is emitted from the other-end-side light incidence/emission end portion of the other polarization plane preserving optical fiber of the last stage two-core optical fiber magnetic field sensor, the light beam transmits through the first birefringent element as the two linearly polarized light beams of a normal beam and an abnormal beam, in the case where the normal beam and the abnormal beam emitted from the first birefringent element transmit through the second birefringent element, the linearly polarized light beam which transmits through the first birefringent element as the normal beam transmits as the abnormal beam, and the linearly polarized light beam which transmits through the first birefringent element as the abnormal beam transmits as the normal beam, a shifted amount of the abnormal beam during the transmission through the first birefringent element and a shifted amount of the abnormal beam during the transmission through the second birefringent element are set to be equal to each other, the two linearly polarized light beams of the normal beam and the abnormal beam emitted from the second birefringent element transmit through the magnetic garnet, so that the polarization directions thereof are rotated by 45 degrees in the same direction, the two linearly polarized light beams transmit through the lens and are reflected in point symmetry at one point on a surface of the reflector, the two reflected linearly polarized light beams transmit through the magnetic garnet again, so that the polarization directions thereof are further rotated by 45 degrees in the same direction, in the case where the two linearly polarized light beams transmit through the second birefringent element again, only the one linearly polarized light beam is shifted, in the case where the two linearly polarized light beams emitted from the second birefringent element transmit through the first birefringent element, the linearly polarized light beam which transmits through the second birefringent element as the normal beam transmits as the abnormal beam, and the linearly polarized light beam which transmits through the second birefringent element as the abnormal beam transmits as the normal beam, and the two linearly polarized light beams which transmit through the first birefringent element are incident on the other polarization plane preserving optical fiber of the last stage two-core optical fiber magnetic field sensor.

22. A two-core optical fiber magnetic field sensor where two or more two-core optical fiber magnetic field sensors according to claim 14 are installed with respect to a magnetic field of a measurement object, wherein the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, a Faraday mirror is arranged to the other-end-side light incidence/emission end portion of the other polarization plane preserving optical fiber of the last stage two-core optical fiber magnetic field sensor, the Faraday mirror includes the other polarization plane preserving optical fiber of the last stage two-core optical fiber magnetic field sensor, a magnetic garnet which has a rotation angle of 45 degrees during magnetic saturation, a magnet which magnetically saturates the magnetic garnet, a lens, and a reflector, the other-end-side light incidence/emission end portion of the other polarization plane preserving optical fiber of the n-th two-core optical fiber magnetic field sensor is arranged to face the one plane of the magnetic garnet, the lens is arranged between the magnetic garnet and the reflector, a light beam is emitted from the other-end-side light incidence/emission end portion of the other polarization plane preserving optical fiber of the last stage two-core optical fiber magnetic field sensor, the light beam transmits through the magnetic garnet, so that the polarization direction thereof is rotated by 45 degrees, the light beam transmits through the lens and is reflected in point symmetry at one point on a surface of the reflector, the reflected light beam transmits through the magnetic garnet again, so that the polarization direction is further rotated by 45 degrees, and the light beam is incident on the other polarization plane preserving optical fiber of the last stage two-core optical fiber magnetic field sensor.

23. A two-core optical fiber magnetic field sensor where two or more two-core optical fiber magnetic field sensors according to claim 14 are installed with respect to a magnetic field of a measurement object, wherein the other polarization plane preserving optical fiber of the front stage two-core optical fiber magnetic field sensor and the one polarization plane preserving optical fiber of the rear stage two-core optical fiber magnetic field sensor are a common polarization plane preserving optical fiber, a $\lambda/4$ wavelength plate mirror is arranged to the other-end-side light incidence/emission end portion of the other polarization plane preserving optical fiber of the last stage two-core optical fiber magnetic field sensor, the $\lambda/4$ wavelength plate mirror includes the other polarization plane preserving optical fiber of the last stage two-core optical fiber magnetic field sensor, a $\lambda/4$ wavelength plate ($\lambda$: a wavelength of a light beam incident on the $\lambda/4$ wavelength plate mirror), a lens, and a reflector, the other-end-side light incidence/emission end portion of the other polarization plane preserving optical fiber of the last stage two-core optical fiber magnetic field sensor is arranged to face the one plane of the $\lambda/4$ wavelength plate, the lens is arranged between the $\lambda/4$ wavelength plate and the reflector, a light beam is emitted from the other-end-side light incidence/emission end portion of the other polarization plane preserving optical fiber of the last stage two-core optical fiber magnetic field sensor, the light beam transmits through the $\lambda/4$ wavelength plate, so that the light beam is converted into circularly-polarized light beams of which rotation directions of distal ends of electric vectors are different from each other, the two circularly-polarized light beams transmit through the lens and are reflected on a surface of the reflector, the two reflected circularly-polarized light beams transmit through the $\lambda/4$ wavelength plate again, so that the two circularly-polarized light beams are converted into two linearly polarized light beams of which vibration directions of electric vectors are different by 90 degrees from each other, and the two linearly polarized light beams are incident on the other polarization plane preserving optical fiber of the last stage two-core optical fiber magnetic field sensor.

* * * * *